(12) United States Patent
Fujita et al.

(10) Patent No.: US 9,401,460 B2
(45) Date of Patent: Jul. 26, 2016

(54) LIGHT EMITTING ELEMENT

(71) Applicant: SEIKO EPSON CORPORATION, Tokyo (JP)

(72) Inventors: Tetsuji Fujita, Chino (JP); Hidetoshi Yamamoto, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/700,751

(22) Filed: Apr. 30, 2015

(65) Prior Publication Data

US 2015/0236226 A1 Aug. 20, 2015

Related U.S. Application Data

(60) Division of application No. 14/319,410, filed on Jun. 30, 2014, now Pat. No. 9,224,928, which is a continuation of application No. 13/727,339, filed on Dec. 26, 2012, now Pat. No. 8,803,138.

(30) Foreign Application Priority Data

Dec. 28, 2011 (JP) ................................. 2011-289851

(51) Int. Cl.
*H01L 33/50* (2010.01)
(52) U.S. Cl.
CPC .................................... *H01L 33/504* (2013.01)
(58) Field of Classification Search
USPC .......................................................... 257/40
See application file for complete search history.

(56) References Cited

U.S. PATENT DOCUMENTS 4,769,292 A 9/1988 Tang et al.
5,104,740 A 4/1992 Shinkai et al.
(Continued)

FOREIGN PATENT DOCUMENTS

CN 103187532 A 7/2013
JP 63-264692 A 11/1988
(Continued)

OTHER PUBLICATIONS

Aug. 24, 2015 Office Action issued in U.S. Appl. No. 13/773,033.
(Continued)

*Primary Examiner* — Thao P Le
(74) *Attorney, Agent, or Firm* — Oliff PLC

(57) ABSTRACT

The light emitting element of the embodiment includes an anode; a cathode; a visible light emitting layer provided between the anode and the cathode and emitting visible light; and a carrier trapping layer containing a thiadiazole based compound represented by the following formula (1).

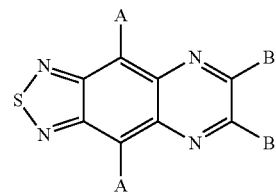

(1)

[In formula (1), A indicates a hydrogen atom, an alkyl group, an aryl group which may have a substituent, an arylamino group, or a triaryl amine, and B indicates a hydrogen atom, an alkyl group, an aryl group which may have a substituent, an arylamino group, or a triaryl amine, or may form a ring.]

7 Claims, 16 Drawing Sheets

(56) References Cited

U.S. PATENT DOCUMENTS

| | | | |
|---|---|---|---|
| 5,294,869 A | 3/1994 | Tang et al. | |
| 5,449,564 A | 9/1995 | Nishio et al. | |
| 5,862,434 A | 1/1999 | Yamakawa | |
| 6,004,685 A | 12/1999 | Antoniadis et al. | |
| 6,680,131 B1 | 1/2004 | Ishibashi et al. | |
| 7,097,917 B1* | 8/2006 | Fujita | C07C 13/62 252/301.16 |
| 7,632,579 B2 | 12/2009 | Ise et al. | |
| 7,714,099 B2 | 5/2010 | Morishita et al. | |
| 7,902,542 B2 | 3/2011 | Haase et al. | |
| 7,919,773 B2 | 4/2011 | Kawakami et al. | |
| 7,947,992 B2 | 5/2011 | Yasukawa et al. | |
| 7,960,912 B2 | 6/2011 | Yasukawa et al. | |
| 8,039,128 B2 | 10/2011 | Watanabe et al. | |
| 8,803,138 B2 | 8/2014 | Fujita et al. | |
| 8,809,547 B2 | 8/2014 | Bretschneider et al. | |
| 9,067,952 B2 | 6/2015 | Yamamoto et al. | |
| 9,072,150 B2 | 6/2015 | Fujita et al. | |
| 9,159,932 B2 | 10/2015 | Fujita et al. | |
| 2002/0089560 A1 | 7/2002 | Katayama et al. | |
| 2003/0008172 A1 | 1/2003 | Leclerc et al. | |
| 2003/0027016 A1 | 2/2003 | Ara et al. | |
| 2004/0018382 A1 | 1/2004 | Kinlen | |
| 2005/0079381 A1 | 4/2005 | Hamada et al. | |
| 2005/0106415 A1* | 5/2005 | Jarikov | C07C 13/62 428/690 |
| 2006/0063027 A1 | 3/2006 | Vestweber et al. | |
| 2006/0154105 A1 | 7/2006 | Yamamoto et al. | |
| 2007/0077453 A1 | 4/2007 | Sano et al. | |
| 2007/0254432 A1 | 11/2007 | Yamazaki et al. | |
| 2007/0285005 A1 | 12/2007 | Itai | |
| 2008/0061681 A1 | 3/2008 | Thompson et al. | |
| 2008/0067479 A1 | 3/2008 | Kimura et al. | |
| 2008/0125593 A1 | 5/2008 | Kim et al. | |
| 2008/0230123 A1 | 9/2008 | Mitsui et al. | |
| 2009/0079335 A1 | 3/2009 | Mitsuya et al. | |
| 2009/0091250 A1 | 4/2009 | Yasukawa et al. | |
| 2009/0115348 A1 | 5/2009 | Yamazaki et al. | |
| 2009/0243476 A1 | 10/2009 | Nomura et al. | |
| 2009/0261360 A1 | 10/2009 | Yasukawa et al. | |
| 2010/0133434 A1 | 6/2010 | Meng et al. | |
| 2010/0155694 A1 | 6/2010 | Miller et al. | |
| 2010/0194807 A1 | 8/2010 | Hirasawa et al. | |
| 2010/0237338 A1 | 9/2010 | Yamamoto et al. | |
| 2010/0237990 A1 | 9/2010 | Amano et al. | |
| 2010/0244671 A1 | 9/2010 | Nomura et al. | |
| 2010/0244679 A1 | 9/2010 | Fujita et al. | |
| 2010/0252823 A1 | 10/2010 | Kambe et al. | |
| 2010/0317858 A1 | 12/2010 | Konno | |
| 2011/0030901 A1 | 2/2011 | Shimomura et al. | |
| 2011/0058192 A1 | 3/2011 | Hatanaka et al. | |
| 2011/0087034 A1 | 4/2011 | Miyata et al. | |
| 2011/0253988 A1 | 10/2011 | Molt et al. | |
| 2011/0279020 A1 | 11/2011 | Inoue et al. | |
| 2011/0303901 A1* | 12/2011 | Cheng | C07D 487/04 257/40 |
| 2012/0056213 A1 | 3/2012 | Yamamoto et al. | |
| 2012/0091923 A1 | 4/2012 | Kastner-Jung et al. | |
| 2012/0262057 A1 | 10/2012 | Fujita et al. | |
| 2012/0267615 A1 | 10/2012 | Fujita et al. | |
| 2013/0009909 A1 | 1/2013 | Yamazaki et al. | |
| 2013/0032791 A1 | 2/2013 | Bazan et al. | |
| 2013/0037784 A1 | 2/2013 | Yamamoto et al. | |
| 2013/0037785 A1 | 2/2013 | Fujita et al. | |
| 2013/0099209 A1 | 4/2013 | Hartmann et al. | |
| 2013/0168654 A1 | 7/2013 | Fujita et al. | |
| 2013/0221334 A1 | 8/2013 | Yamamoto et al. | |
| 2014/0332835 A1 | 11/2014 | Fujita et al. | |
| 2015/0236226 A1 | 8/2015 | Fujita et al. | |

FOREIGN PATENT DOCUMENTS

| | | |
|---|---|---|
| JP | 2-255788 A | 10/1990 |
| JP | 03-000791 A | 1/1991 |
| JP | 03-000792 A | 1/1991 |
| JP | 03162481 A | 7/1991 |
| JP | 03-177486 A | 8/1991 |
| JP | 2005-063938 B1 | 7/1992 |
| JP | 05-032966 A | 2/1993 |
| JP | 05-214334 A | 8/1993 |
| JP | 05-258859 A | 10/1993 |
| JP | 06-073374 A | 3/1994 |
| JP | 06-093257 A | 4/1994 |
| JP | 06-136359 A | 5/1994 |
| JP | 06-145146 A | 5/1994 |
| JP | 06-240246 A | 8/1994 |
| JP | H07-52375 A | 2/1995 |
| JP | H09-236965 A | 9/1997 |
| JP | 10-330295 A | 12/1998 |
| JP | H11-179895 A | 7/1999 |
| JP | 11-233261 A | 8/1999 |
| JP | H11-217776 A | 8/1999 |
| JP | 2000-091073 A | 3/2000 |
| JP | 2001-097949 A | 4/2001 |
| JP | 2001-110570 A | 4/2001 |
| JP | 2001-270585 A | 10/2001 |
| JP | 2002-097465 A | 4/2002 |
| JP | 2003-055652 A | 2/2003 |
| JP | 2003-109760 A | 4/2003 |
| JP | 2004-002297 A | 1/2004 |
| JP | 2005-063938 A | 3/2005 |
| JP | 2005-531552 A | 10/2005 |
| JP | 2006-045398 A | 2/2006 |
| JP | 2006-511939 A | 4/2006 |
| JP | 2007-000769 A | 1/2007 |
| JP | 2007-115626 A | 5/2007 |
| JP | 2008-069100 A | 3/2008 |
| JP | 2008-133277 A | 6/2008 |
| JP | 2008-162921 A | 7/2008 |
| JP | 2008-546185 A | 12/2008 |
| JP | 2000-091073 A | 1/2009 |
| JP | 2009-049094 A | 3/2009 |
| JP | 2009-256343 A | 11/2009 |
| JP | 2009-272144 A | 11/2009 |
| JP | 2010-147179 A | 7/2010 |
| JP | 2010-179544 A | 8/2010 |
| JP | 2010-245211 A | 10/2010 |
| JP | 2010-254674 A | 11/2010 |
| JP | 2011-073432 A | 4/2011 |
| JP | 2011-134810 A | 7/2011 |
| WO | 03-095445 A | 11/2003 |
| WO | 2004-058911 A2 | 7/2004 |
| WO | 2004/058911 A2 | 7/2004 |
| WO | 2006-127315 A2 | 11/2006 |
| WO | 2008-069322 A1 | 6/2008 |
| WO | 2008-094187 A2 | 8/2008 |

OTHER PUBLICATIONS

Du et al., "Efficient Non-doped Near Infrared Organic Light-Emitting Devices Based on Fluorophores with Aggregation-Induced Emission Enhancement" Chemistry of Materials (2012) pp. 2178-2185.

Qian et al., "Synthesis and Application of Thiadiazoloquinoxaline-Containing Chromophores as Dopants for Efficient Near-Infrared Organic Light-Emitting Diodes," Journal of Physical Chemistry (2009) pp. 1589-1595.

Kajii et al., "Visible to near-infrared organic light-emitting diodes using phosphorescent materials by solution process,". Thin Solid Films (2009) pp. 551-554.

Kawbe et al., "Eecroluminescence of Geen Light Region in Doped Anthrarcene" Japanese Jounal of Applied Physics, vol. 10, 1971, pp. 527-529.

Debad et al., "Dibnzotraphenylperfnhene: Synthesis, Photophysical Properties, and Electrogenerated Chemiluminescence," Journal of American Chemical Society, vol. 118, 1996, pp. 2374-2379.

Aug. 21, 2014 Office Action issued in U.S. Appl. No. 13/564,376.
Jan. 10, 2014 Office Action issued in U.S. Appl. No. 13/445,523.
Jun. 18, 2014 Office Action issued in U.S. Appl. No. 13/445,523.
Jan. 22, 2015 Office Action issued in U.S. Appl. No. 13/564,384.
U.S. Appl. No. 13/445,523 in the name of Fujita et al., filed Apr. 12, 2012.

(56) References Cited

OTHER PUBLICATIONS

U.S. Appl. No. 13/564,384 in the name of Fujita et al., filed Aug. 1, 2012.
U.S. Appl. No. 14/319,410 in the name of Fujita et al., filed Jun. 30, 2014.
U.S. Appl. No. 13/773,033 in the name of Yamamoto et al., filed Feb. 21, 2013.
U.S. Appl. No. 14/055,241 in the name of Fujita et al., filed Oct. 16, 2013.
Sep. 5, 2014 Notice of Allowance issued in U.S. Appl. No. 13/445,523.
Aug. 15, 2014 Office Action issued in U.S. Appl. No. 13/564,384.
Mar. 26, 2014 Notice of Allowance issued in U.S. Appl. No. 13/727,339.
Oct. 3, 2014 Office Action issued in U.S. Appl. No. 14/319,410.
U.S. Appl. No. 13/444,107 in the name of Fujita et al., filed Apr. 11, 2012.
Apr. 22, 2015 Office Action issued in U.S. Appl. No. 13/773,033.
U.S. Appl. No. 14/693,484 in the name of Yamamoto et a., filed Apr. 22, 2015.
Pending U.S. Appl. No. 14/319,410, filed Jun. 30, 2014.
Oct. 3, 2014 Notice of Allowance issued in U.S. Appl. No. 14/319,410.
Feb. 13, 2015 Notice of Allowance issued in U.S. Appl. No. 14/319,410.
Apr. 3, 2015 Notice of Allowance issued in U.S. Appl. No. 13/564,384.
Jun. 29, 2015 Office Action issued in U.S. Appl. No. 13/444,107.
Dec. 18, 2015 Office Action issued in U.S. Appl. No. 14/693,484.
Nov. 17, 2015 Office Action issued in U.S. Appl. No. 13/444,107.
Mar. 3, 2016 Office Action issued in U.S. Appl. No. 13/444,107.
Apr. 7, 2016 Office Action issued in U.S. Appl. No. 14/055,241.
Spectrochimica Acta Part A: Molecular and Biomolecular Spectroscopy v.76, pp. 328-335.
May 9, 2016 Office Action issued in U.S. Appl. No. 14/693,484.

* cited by examiner

LIGHT EMITTING ELEMENT

This is a Divisional of application Ser. No. 14/319,410 filed Jun. 30, 2014 which is a Continuation of application Ser. No. 13/727,339 filed Dec. 26, 2012, which claims the benefit of Japanese Patent Application No. 2011-289851 filed Dec. 28, 2011. The disclosures of the prior applications are hereby incorporated by reference herein in their entirety.

BACKGROUND

1. Technical Field

The present invention relates to a light emitting element, a light emitting device and an electronic apparatus.

2. Related Art

An organic electroluminescent device (commonly called an organic EL element) is a light emitting element having a structure in which at least one layer of a luminescent organic layer is interposed between an anode and a cathode. In such a light emitting element, by applying an electric field between the cathode and the anode, electrons are injected from the cathode side into the light emitting layer and, along with this, holes are injected from the anode side, excitons are generated by the recombination of the electrons and the holes in the light emitting layer, and, when the excitons return to a ground state, the energy portion thereof is released as light.

The luminance life span in the above light emitting elements shows a tendency to vary according to the luminescent color emitted as light by the light emitting layer, and it is known that, specifically, the shorter the wavelength of the luminescent color, the shorter the life span.

For example, as one of the causes of this tendency, the following may be considered.

That is, it has been found that the shorter the wavelength of the luminescent color of the light emitting layer provided in the light emitting element, the easier the balance of the carrier (the holes and the electrons) flowing inside the light emitting element is lost and the stronger the tendency to excessively generate the carrier, as the use time of the light emitting element increases. For this reason, in a case where one or both of a hole transporting layer and an electron transporting layer are provided, for example, to be adjacent to the light emitting layer, in the above layers, there is a tendency for electrons or holes which have come through the light emitting layer to be injected, and, as a result, it is supposed that the degradation of the configurational material configuring the above layer is promoted.

As a configuration of the light emitting element solving the above problem, there has been proposed a configuration provided with a light emitting layer emitting red luminescent color of a longer wavelength in addition to a light emitting layer emitting (blue) luminescent color of a short wavelength.

That is, it has been proposed that, by configuring the light emitting element to be provided with a plurality of layers emitting short wavelength luminescent color and layers emitting long wavelength luminescent color as light emitting layers, a lengthening of the life span of the light emitting element is achieved (for example, refer to JP-A-2007-15626).

However, because long wavelength luminescent color (for example, red) is also naturally emitted from the light emitting element having the above configuration, in a case where it is necessary to set only short wavelength luminescent color (for example, blue) as the luminescent color emitted by the light emitting element, since there is a need to provide a color filter absorbing long wavelength luminescent color, there are problems in that the element configuration of the light emitting element becomes complicated and this leads to an increase in the number of processes when manufacturing the light emitting element.

SUMMARY

An advantage of some aspects of the invention is to provide a light emitting element provided with a light emitting layer emitting visible light with a long life span without changing the chromaticity, and a light emitting device and an electronic apparatus provided with the above light emitting element.

The aspects of the invention are achieved by the following invention.

According to an aspect of the invention, there is provided a light emitting element includes: an anode; a cathode; a light emitting layer provided between the anode and the cathode and emitting visible light; and a carrier trapping layer containing a thiazole based compound represented by the following formula (1).

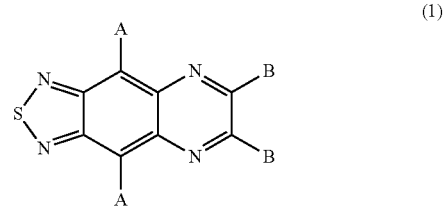

(1)

[In formula (1), A indicates a hydrogen atom, an alkyl group, an aryl group which may have a substituent, an arylamino group, or a triaryl amine, and B indicates a hydrogen atom, an alkyl group, an aryl group which may have a substituent, an arylamino group, or a triaryl amine, or may form a ring.]

In this manner, without changing the chromaticity, it is possible to set a light emitting element provided with a light emitting layer emitting visible light with a long life span.

It is preferable that the thiadiazole based compound be represented by the following formula (1B).

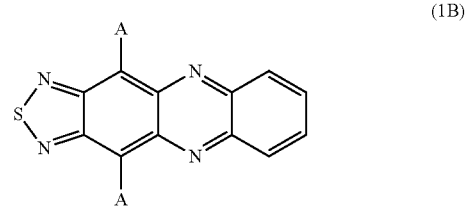

(1B)

[In formula (1B), A's each independently indicate a hydrogen atom, an alkyl group, an aryl group which may have a substituent, an arylamino group, or a triaryl amine.]

The thiadiazole based compound of the above configuration has energy levels capable of trapping carriers, and the light generated as a result at the time of returning to the ground state is in the near infrared region. Accordingly, it is possible to trap the carrier coming through the light emitting layer, and it is possible to set a light emitting element provided with a light emitting layer emitting visible light with a long life span without changing the chromaticity of the visible light.

It is preferable that the thiadiazole based compound be represented by the following formula (1C).

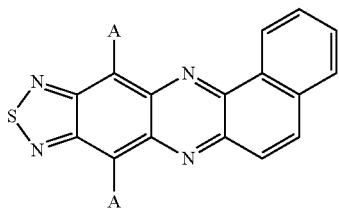

(1C)

[In formula (1C), A's each independently indicate a hydrogen atom, an alkyl group, an aryl group which may have a substituent, an arylamino group, or a triaryl amine.]

The thiadiazole based compound of the above configuration has energy levels capable of trapping carriers, and the light generated as a result at the time of returning to the ground state is in the near infrared region. Accordingly, it is possible to trap the carrier coming through the light emitting layer, and it is possible to set a light emitting element provided with a light emitting layer emitting visible light with a long life span without changing the chromaticity of the visible light.

It is preferable that the thiadiazole based compound be represented by the following formula (1D).

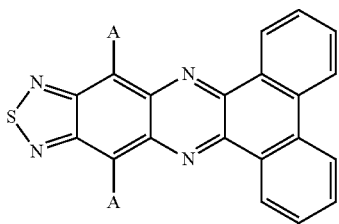

(1D)

[In formula (1D), A and B each independently indicate a hydrogen atom, an alkyl group, an aryl group which may have a substituent, an arylamino group, or a triaryl amine.]

The thiadiazole based compound of the above configuration has energy levels capable of trapping carriers, and the light generated as a result at the time of returning to the ground state is in the near infrared region. Accordingly, it is possible to trap the carrier coming through the light emitting layer, and it is possible to set a light emitting element provided with a light emitting layer emitting visible light with a long life span without changing the chromaticity of the visible light.

It is preferable that the carrier trapping layer be positioned at the anode side relative to the light emitting layer.

In this manner, electrons which have come through the light emitting layer are trapped and it is possible to suppress or prevent the electrons being injected into the anode side. Therefore, it is possible to accurately suppress or prevent the alteration or degradation of the constituent material of the layer positioned further toward the anode side than the carrier trapping layer, and, as a result, a lengthening of the life span of the light emitting element can be achieved.

It is preferable that the carrier trapping layer further contain a host material in addition to the thiazole based compound, and that the host material be at least one type from among amine based material, anthracene based material and naphthacene based material.

Since the above materials are excellent in hole transportability and excellent in resistance to electrons and holes, it is possible to achieve a lengthening of the life span while providing the carrier trapping layer with a function as a hole transporting layer.

It is preferable that the carrier trapping layer be positioned further toward the cathode side than the light emitting layer.

In this manner, it is possible to trap the holes coming through the light emitting layer and suppress or prevent the holes from being injected into the cathode side. Therefore, it is possible to accurately suppress or prevent the alteration or degradation of the constituent material of the layer positioned further toward the cathode side than the carrier trapping layer, and, as a result, a lengthening of the life span of the light emitting element can be achieved.

It is preferable that the carrier trapping layer further contain a host material in addition to the thiazole based compound, and that the host material be at least one type from among anthracene based material, naphthacene based material and quinolinolate based material.

Since the above materials are excellent in electron transportability and excellent in resistance to electrons and holes, it is possible to achieve a lengthening of the life span while providing the carrier trapping layer with a function as an electron transporting layer.

It is preferable that the light emitting layer be one layer.

It is possible to apply the light emitting element according to the aspect of the invention to the light emitting element having the above configuration.

It is preferable that the light emitting layer emit a blue luminescent color as visible light.

As such a light emitting layer, when a layer emitting blue luminescent light is provided in the light emitting element, by applying the light emitting element according to an aspect of the invention, it is possible to achieve a lengthening of the life span of the light emitting layer emitting blue luminescent light, which is a light emitting layer having a short life span.

It is preferable that the light emitting layer emit yellow luminescent color as visible light.

As such a light emitting layer, when a layer emitting yellow luminescent light is provided in the light emitting element, by applying the light emitting element according to an aspect of the invention, it is possible to achieve a lengthening of the life span of the light emitting layer emitting yellow luminescent light, which is a light emitting layer having a short life span.

It is preferable that the light emitting layer be formed of at least two layers.

It is possible to apply the light emitting element according to an aspect of the invention to the light emitting element having the above configuration.

According to another aspect of the invention, there is provided a light emitting device including the light emitting element according to the aspect of the invention.

In this manner, it is possible to set a light emitting device having excellent reliability.

According to still another aspect of the invention, there is provided an electronic apparatus including the light emitting device according to an aspect of the invention.

In this manner, it is possible to set an electronic apparatus having excellent reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Below, description will be given of the light emitting element, light emitting device and electronic apparatus according to an aspect of the invention in suitable embodiments shown in the attached drawings.

First Embodiment

First, description will be given of a first embodiment of the light emitting element according to an aspect of the invention.

Figure 1:
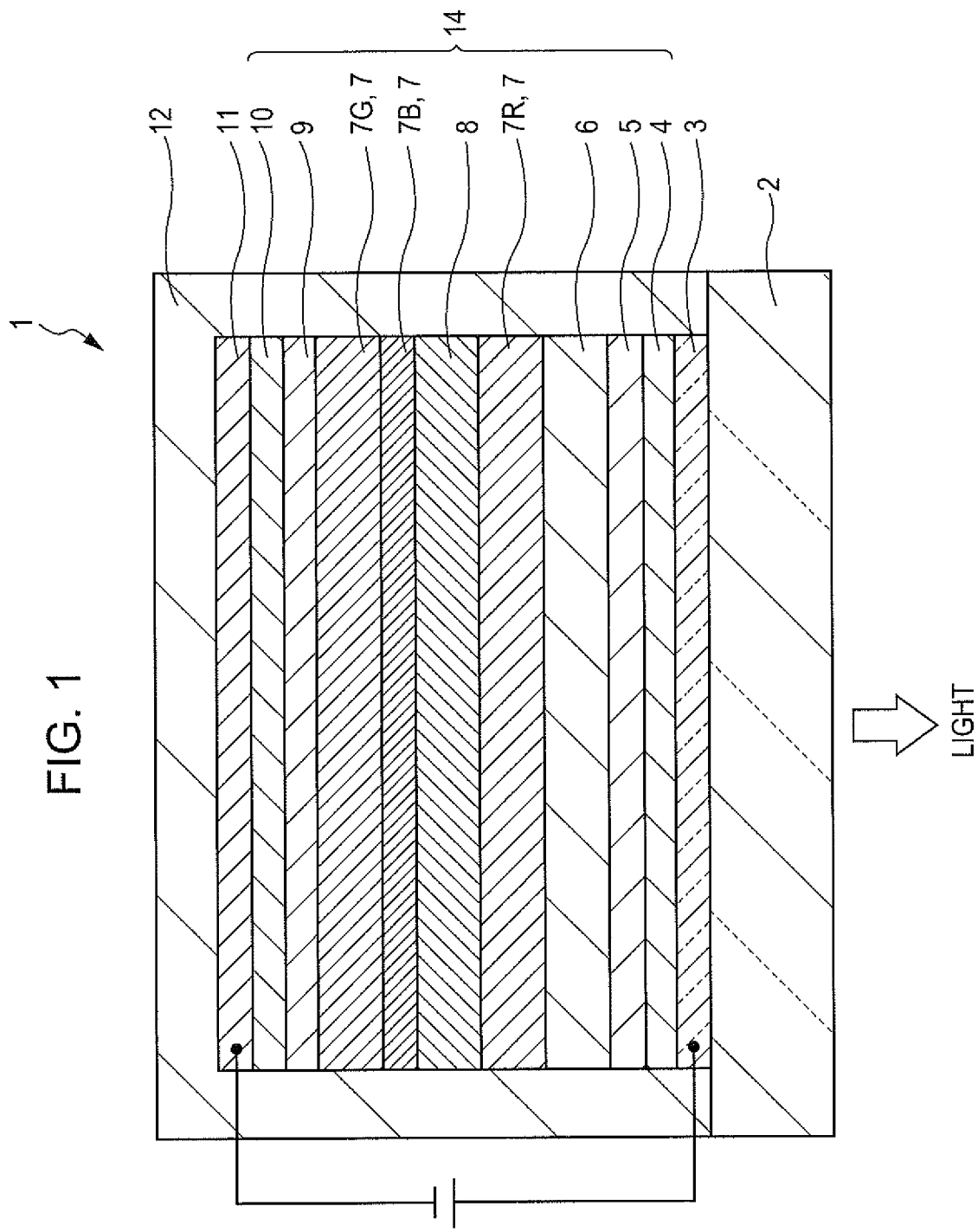
FIG. 1 is a view schematically showing a longitudinal section in a first embodiment of the light emitting element according to an aspect of the invention.

FIG. 1 is a cross-sectional view schematically showing the first embodiment of the light emitting element according to an aspect of the invention. Here, in the following, for convenience of description, description is given with the upper side in FIG. 1 as "up" and the lower side as "down".

The light emitting element (electroluminescence element) 1 shown in FIG. 1 is one in which an anode 3, a hole injection layer 4, a hole transporting layer 5, a carrier trapping layer 6, a red light emitting layer 7R, an intermediate layer 8, a blue light emitting layer 7B, a green light emitting layer 7G, an electron transporting layer 9, an electron injection layer 10, and a cathode 11 are laminated in this order. That is, in the light emitting element 1, between the anode 3 and the cathode 11, a laminate body 14 in which, from the anode 3 to the cathode 11, the hole injection layer 4, the hole transporting layer 5, the carrier trapping layer 6, the red light emitting layer 7R, the intermediate layer 8, the blue light emitting layer 7B, the green light emitting layer 7G, the electron transporting layer 9, and the electron injection layer 10 are laminated in this order, is interposed.

Thus, the entirety of the light emitting element 1 is provided on a substrate 2 and is also sealed with a sealing member 12.

In the above light emitting element 1, with respect to each light emitting layer of the red light emitting layer 7R, the blue light emitting layer 7B, and the green light emitting layer 7G, electrons are supplied (injected) from the cathode 11 side and, along with this, holes are supplied (injected) from the anode 3 side. Thus, in each light emitting layer, the holes and the electrons are recombined, excitons are generated by the energy released during the recombination, and energy (fluorescence and phosphorescence) is released when the excitons return to the ground state. Therefore, the red light emitting layer 7R, the blue light emitting layer 7B, and the green light emitting layer 7G respectively emit red, blue, and green visible light. In this manner, the light emitting element 1 emits white visible light. Here, in the present embodiment, the light emitting layer (visible light emitting layer) 7 emitting visible light is configured by the three layers of the red light emitting layer 7R, the blue light emitting layer 7B, and the green light emitting layer 7G.

In addition, in the present embodiment, since the light emitting element 1 has a carrier trapping layer 6 between the red light emitting layer 7R and the hole transporting layer 5, electrons coming through the red light emitting layer 7R are injected into the hole transporting layer 5 side, whereby it is possible to accurately suppress or prevent the alteration or degradation of the constituent material of the hole transporting layer 5 and the hole injection layer 4, and, as a result, it is possible to achieve a lengthening of the life span of the light emitting element 1.

Furthermore, in the present embodiment, since the light emitting element 1 has an intermediate layer 8 between the red light emitting layer 7R and the blue light emitting layer 7B, it is possible to adjust the movement of the holes and electrons between the red light emitting layer 7R and the blue light emitting layer 7B, whereby it is possible to prevent energy movement of excitons between the red light emitting layer 7R and the blue light emitting layer 7B. As a result, the red light emitting layer 7R and the blue light emitting layer 7B respectively emit light with good balance, whereby the light emitting element 1 emits white light as visible light more reliably.

The substrate 2 supports the anode 3. Since the light emitting element 1 of the present embodiment has a configuration (bottom emission type) extracting light from the substrate 2 side, the substrate 2 and the anode 3 are respectively set to be substantially transparent (colorless and transparent, colored and transparent, or semi-transparent).

Examples of the constituent materials of the substrate 2 include resin materials such as polyethylene terephthalate, polyethylene naphthalate, polypropylene, cycloolefin polymer, polyamide, polyether sulfone, polymethyl methacrylate, polycarbonate, and polyarylate; glass materials such as quartz glass and soda glass; and the like, and it is possible to use one type or a combination of two or more types from the above.

The average thickness of the substrate 2 is not particularly limited; however, approximately 0.1 to 30 mm is preferable, and approximately 0.1 to 10 mm is more preferable.

Here, in a case of a configuration (top emission type) where the light emitting element 1 extracts light from the opposite side of the substrate 2, it is possible to use either of a transparent substrate or an opaque substrate as the substrate 2.

Examples of the opaque substrate include substrates configured by ceramic material such as alumina, those in which an oxide film (insulator film) on the surface of a substrate of metal such as stainless steel, substrates configures of resin materials, and the like.

Further, in the above light emitting element 1, the distance between the anode 3 and the cathode 11 (that is, the average thickness of the laminate body 14) is preferably 100 to 500 nm, more preferably 100 to 300 nm, and even more preferably 100 to 250 nm. In this manner, it is possible to easily and reliably set the driving voltage of the light emitting element 1 within a practical range.

Below, each part configuring the light emitting element 1 will be described in sequence.

Anode

The anode 3 is an electrode injecting holes into the hole transporting layer 5 through the hole injection layer 4 to be described later. As constituent materials of the anode 3, it is preferable to use materials having a large work function and having excellent conductivity.

Examples of the constituent material of the anode 3 include oxides such as ITO (Indium Tin Oxide), IZO (Indium Zinc Oxide), $In_2O_3$, $SnO_2$, $SnO_2$ containing Sb, and ZnO containing Al, Au, Pt, Ag, Cu or alloys or the like including these metals, and it is possible to use one type or a combination of two or more types from the above.

In particular, the anode 3 is preferably configured by ITO. ITO is a material which, in addition to having transparency, has a large work function and excellent conductivity. In this manner, it is possible to efficiently inject holes into the hole injection layer 4 from the anode 3.

In addition, the surface (upper surface in FIG. 1) of the hole injection layer 4 side of the anode 3 preferably undergoes a plasma treatment. In this manner, it is possible to increase the chemical and mechanical stability of the bonding surfaces of the anode 3 and the hole injection layer 4. As a result, it is possible to improve the hole injection property into the hole injection layer 4 from the anode 3. Here, regarding the plasma treatment, detailed description will be given in the description of the method of manufacturing the light emitting element 1 to be described later.

The average thickness of such an anode 3 is not particularly limited; however, approximately 10 to 200 nm is preferable and approximately 50 to 150 nm is more preferable.

Cathode

On the other hand, the cathode 11 is an electrode which injects electrons into the electron transporting layer 9 through the electron injection layer 10 to be described later. As the constituent material of the cathode 11, it is preferable to use material with a small work function.

Examples of the constituent material of the cathode 11 include Li, Mg, Ca, Sr, La, Ce, Er, Eu, Sc, Y, Yb, Ag, Cu, Al, Cs, Rb, alloys including the above, or the like, and it is possible to use one type or a combination (for example, setting a laminate body having a plurality of layers, mixed layers of a plurality of types, or the like) of two or more types from the above.

In particular, in a case of using an alloy as the constituent material of the cathode 11, it is preferable to use an alloy including stable metal elements such as Ag, Al, and Cu, specifically, alloys of MgAg, AlLi, CuLi, and the like. By using the above alloys as the constituent material of the cathode 11, it is possible to achieve an improvement in the electron injection efficiency and stability properties of the cathode 11.

The average thickness of the cathode 11 is not particularly limited; however, approximately 100 to 10000 nm is preferable and approximately 100 to 500 nm is more preferable.

Here, since the light emitting element 1 of the present embodiment is a bottom emission type, there is no particular demand for light transmittance in the cathode 11. In addition, in a case of a top emission type, since there is a need to transmit light from the cathode 11 side, the average thickness of the cathode 11 is preferably approximately 1 to 50 nm.

Hole Injection Layer

The hole injection layer 4 has a function of improving the hole injection efficiency from the anode 3 (that is, a hole injection property).

By providing the hole injection layer 4 between the anode 3 and the hole transporting layer 5 to be described later in this manner, the hole transporting property of the anode 3 is improved, and, as a result, it is possible to increase the light emitting efficiency of the light emitting element 1.

This hole injection layer 4 includes material having a hole injection property (that is, hole injection material).

The hole injection material included in the hole injection layer 4 is not particularly limited; however, examples thereof include copper phthalocyanine, 4,4',4''-tris(N,N-phenyl-3-methyl-phenylamino)triphenylamine(m-MTDATA), N,N'-bis-(4-diphenylaminophenyl)-N,N'-diphenyl-biphenyl-4-4'-diamine, and the like.

Among the above, as the hole injection material included in the hole injection layer 4, from the viewpoint of having an excellent hole injection property and hole transporting property, it is preferable to use an amine based material, and diaminobenzene derivatives, benzidine derivatives (material having a benzidine skeleton), triamine based compounds having both a "diaminobenzene" unit and a "benzidine" unit in the molecule, and tetraamine based compounds are more preferable.

The average thickness of the above hole injection layer 4 is not particularly limited; however, approximately 5 to 90 nm is preferable and approximately 10 to 70 nm is more preferable.

Here, the hole injection layer 4 may be omitted according to the constituent material of the anode 3 and the hole transporting layer 5.

Hole Transporting Layer

The hole transporting layer 5 has a function of transporting injected holes from the anode 3 through the hole injection layer 4 to the carrier trapping layer 6 (that is, a hole transporting property).

The hole transporting layer 5 is configured to include a material (that is, a hole transporting material) having a hole transporting property.

As the hole transporting material included in the hole transporting layer 5, it is possible to use various P type polymer materials or various P type low-molecular-weight materials either singly or in combination and examples thereof include tetraarylbenzidine derivatives such as N,N'-di(1-naphthyl)-N,N'-diphenyl-1,1'-diphenyl-4,4'-diamine (NPD), N,N'-diphenyl-N,N'-bis(3-methylphenyl)-1,1'-diphenyl-4,4'-diamine (TPD), N,N,N',N'-tetra-naphthyl-benzidine (TNB), and the like, and tetraaryldiaminofluorene compounds or derivatives thereof (amine based material), and it is possible to use one type or a combination of two or more types from the above.

Among the above, as the hole transporting material included in the hole transporting layer 5, from the viewpoint of having an excellent hole injection property and hole transporting property, it is preferable to use an amine based material, and benzidine derivatives (material having a benzidine skeleton) are more preferable.

The average thickness of the above hole transporting layer 5 is not particularly limited; however, approximately 5 to 90 nm is preferable and approximately 10 to 70 nm is more preferable.

Carrier Trapping Layer

In the present embodiment, the carrier trapping layer 6 is positioned between the red light emitting layer 7R and the hole transporting layer 5, that is, further toward the anode 3 side than the red light emitting layer 7R, and has a function of trapping electrons (carrier) coming through the red light emitting layer 7R and suppressing or preventing the electrons from being injected to the hole transporting layer 5 (anode 3) side.

The carrier trapping layer 6 has energy levels capable of trapping electrons (carrier) coming through the red light emitting layer 7R during conduction between the anode 3 and the cathode 11, and the light generated as a result at the time of returning to the ground state is in the near infrared region. Accordingly, since it is possible to accurately suppress or prevent alteration or degradation of the constituent material of the hole transporting layer 5 and the hole injection layer 4 caused by the injection of the electrons, a lengthening of the life span of the light emitting element 1 is achieved. Furthermore, since the light emitted by the carrier trapping layer 6 is in the near infrared region (infrared light) and is not capable of being recognized by the human eye, it is possible to reliably prevent the chromaticity of the visible light emitted by the light emitting element 1 from changing.

In the invention, this carrier trapping layer 6 contains a thiazole based compound represented by the following formula (1).

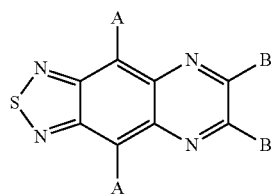

(1)

[In formula (1), A indicates a hydrogen atom, an alkyl group, an aryl group which may have a substituent, an arylamino group, or a triaryl amine, and B indicates a hydrogen atom, an alkyl group, an aryl group which may have a substituent, an arylamino group, or a triaryl amine, or may form a ring.]

With respect to the carrier trapping layer 6 configured by the above material, since electrons coming through the red light emitting layer 7R from the cathode 11 side are supplied (injected) along with the supply (injection) of holes from the anode 3 side, in the carrier trapping layer 6, the holes and electrons are recombined, whereby the electrons (carrier) coming through the red light emitting layer 7R are trapped by the carrier trapping layer 6. In addition, since excitons are generated by the energy released during the recombination and energy (fluorescence and phosphorescence) is released when the excitons return to the ground state, the carrier trapping layer 6 emits infrared rays.

Here, the infrared rays emitted by the carrier trapping layer 6 containing the thiazole based compound represented by the above-described formula (1) are in the near infrared region, more specifically, in the wavelength range of 700 nm or more to 1500 nm or less.

The luminescent light of such a long wavelength range is not capable of being recognized by the human eye. Accordingly, in the light emitting element 1, even if luminescent light of such a wavelength range is emitted, the recognized luminescent light becomes white light emitted from the three layers of the red light emitting layer 7R, blue light emitting layer 7B, and the green light emitting layer 7G.

Accordingly, by selecting the layer emitting red light as the light emitting layer provided for lengthening the life span of the light emitting element 1 in this manner, the light emitting element 1 emits white light as luminescent light without changing the chromaticity. Accordingly, in a case of use as a white device, since there is no need to provide a color filter for extracting the desired luminescent light in the light emitting element, it is possible to reliably prevent the element configuration from becoming complicated and the number of processes during the manufacturing of the light emitting element from increasing.

As the thiazole based compound represented by the above-described formula (1), it is possible to classify the above-described group B into I) a case showing a hydrogen atom, an alkyl group, an aryl group which may have a substituent, an arylamino group, or a triaryl amine, or II) a case of forming a ring, and, in the case of I), examples include the compound represented by the following formula (1A) and, in the case of II), examples include the compounds represented by the following formulas (1B), (1C), and (1D).

First, description will be given of the case of I), that is, the compound represented by the following formula (1A).

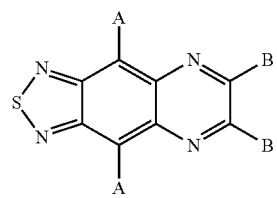

(1A)

[In formula (1A), A and B each independently indicate a hydrogen atom, an alkyl group, an aryl group which may have a substituent, an arylamino group, or a triaryl amine.]

The above thiadiazole based compounds have energy levels capable of trapping carriers, and the light generated as a result at the time of returning to the ground state is in the near infrared region. Accordingly, by configuring the above thiadiazole based compounds as a trapping material (light emitting material), the carrier trapping layer 6 traps carriers and, along with this, emits light at a wavelength range (near infrared range) of 700 nm or more, that is, emits luminescent light which is not recognizable to the human eye.

In particular, as the thiadiazole based compound used in the carrier trapping layer 6, the compounds represented by the following formula (2A) and formula (3A) are preferably used.

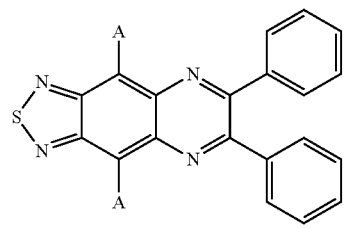

(2A)

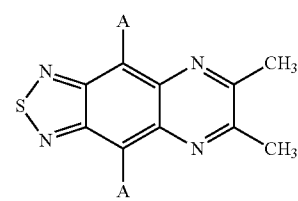

(3A)

[In formulas (2A) and (3A), A each independently indicate a hydrogen atom, an alkyl group, an aryl group which may have a substituent, an arylamino group, or a triaryl amine.]

That is, in the formula (1A), B is preferably a phenyl group or a methyl group, respectively.

The phenyl group and the methyl group respectively have comparatively high chemical stability. Therefore, by using the above compound as a trapping material included in the carrier trapping layer 6, it is possible to achieve a lengthening of the life span of the carrier trapping layer 6 and the light emitting element 1. In addition, since it is possible to suppress the molecular weight of the trapping material to be comparatively small, it is possible to form the carrier trapping layer 6 with high precision using vapor deposition. As a result, even in this point, it is possible to achieve an increase in the efficiency and a lengthening of the life span of the light emitting element 1.

Furthermore, as the thiadiazole based compound used in the carrier trapping layer 6, the compounds represented by the following formulas (4A) to (9A) are preferably used, specifically, the compounds represented by the following formulas D-1 to D-3 are particularly preferably used.

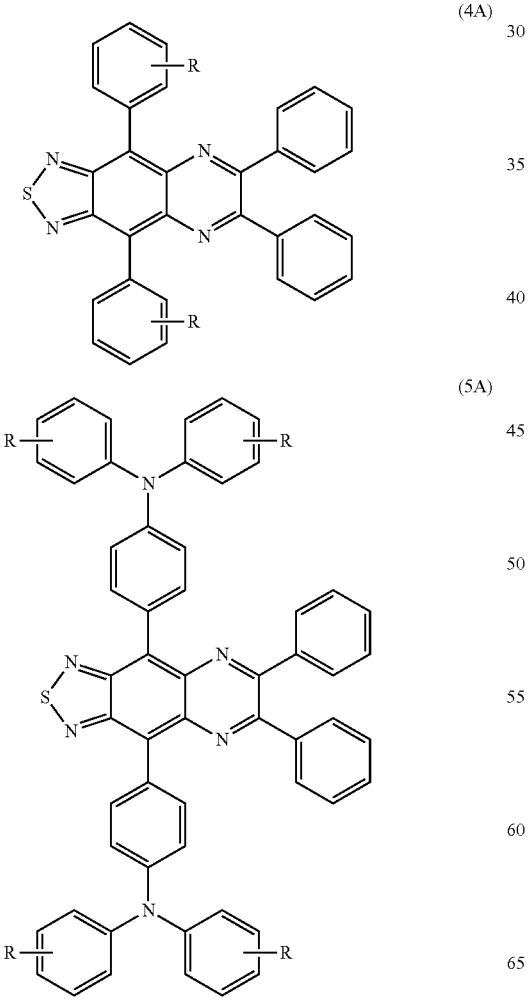

(4A)

(5A)

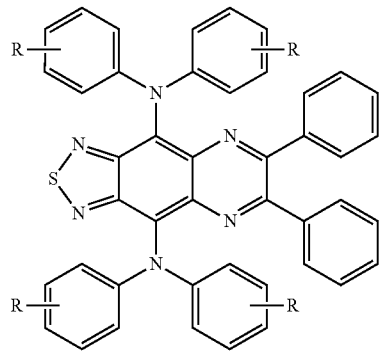

(6A)

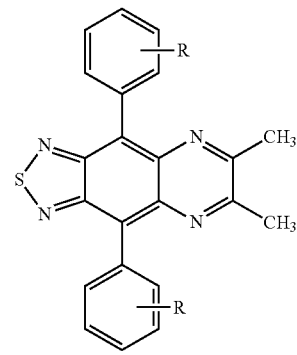

(7A)

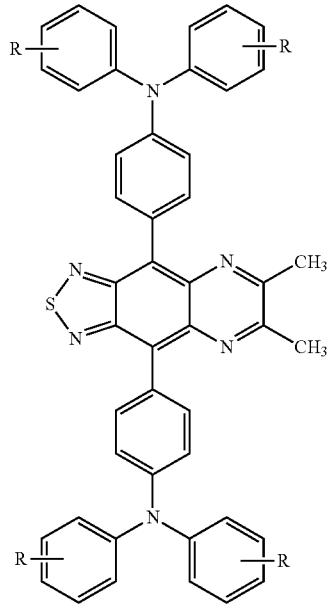

(8A)

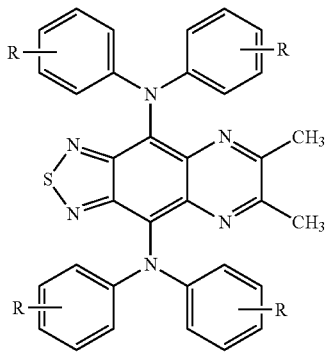

(9A)

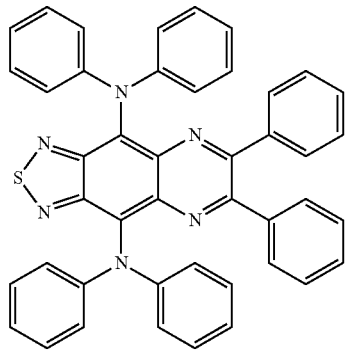

D-3

[In formulas (4A) to (9A), R each independently indicates a hydrogen atom, an alkyl group, or an aryl group which may have a substituent. In addition, the carbon atoms of two adjacent Rs may be linked and have a cyclic shape.]

Next, sequential description will be given of the case of II), that is, the compounds represented by the following formulas (1B) to (1D).

First, description will be given of the compounds represented by the following formula (1B).

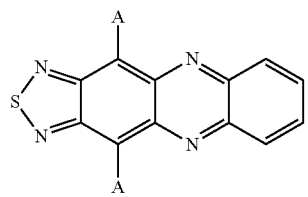

(1B)

[In formula (1B), A each independently indicate a hydrogen atom, an alkyl group, an aryl group which may have a substituent, an arylamino group, or a triaryl amine.]

The above thiadiazole based compounds have energy levels capable of trapping carriers, and the light generated as a result at the time of returning to the ground state is in the near infrared region. Accordingly, by configuring the above thiadiazole based compounds as a trapping material (light emitting material), the carrier trapping layer 6 traps carriers and, along with this, emits light at a wavelength range (near infrared range) of 700 nm or more, that is, emits luminescent light which is not recognizable to the human eye.

In particular, as the thiadiazole based compound used in the carrier trapping layer 6, the compounds represented by the following formulas (2B) to (4B) are preferably used, specifically, for example, the compounds represented by the following formulas D-4 to D-6 are preferably used.

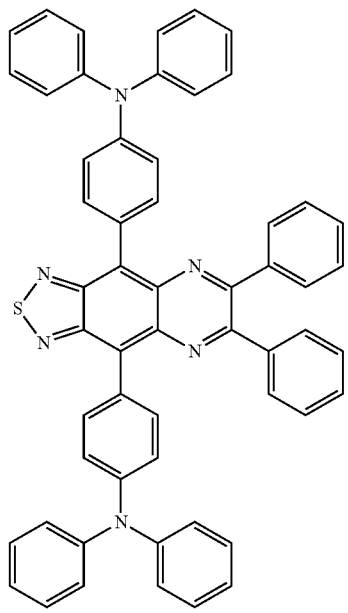

D-1

D-2

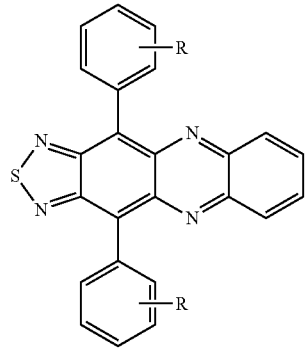

(2B)

-continued

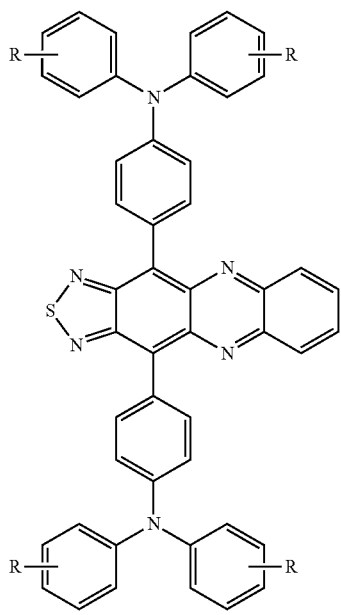
(3B)

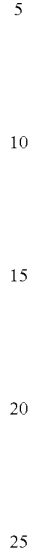

(4B)

[In formulas (2B) to (4B), R's each independently indicate a hydrogen atom, an alkyl group, or an aryl group which may have a substituent. In addition, the carbon atoms of two adjacent Rs may be linked and have a cyclic shape.]

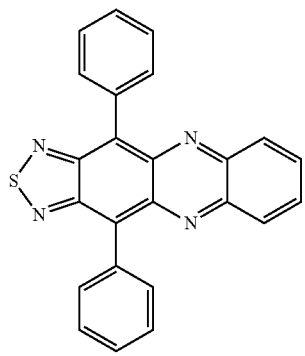
(D-4)

-continued

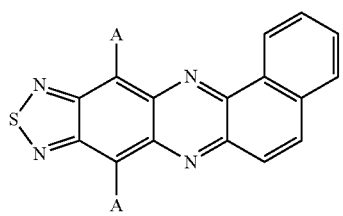
(D-5)

(D-6)

Next, description will be given of the compound represented by the following formula (1C).

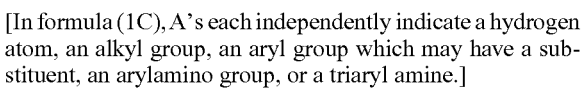
(1C)

[In formula (1C), A's each independently indicate a hydrogen atom, an alkyl group, an aryl group which may have a substituent, an arylamino group, or a triaryl amine.]

The above thiadiazole based compounds have energy levels capable of trapping carriers, and the light generated as a result at the time of returning to the ground state is in the near infrared region. Accordingly, by configuring the above thiadiazole based compounds as a trapping material (light emitting material), the carrier trapping layer 6 traps carriers and, along with this, emits light at a wavelength range (near infrared range) of 700 nm or more, that is, emits luminescent light which is not recognizable to the human eye.

In particular, as the thiadiazole based compound used in the carrier trapping layer 6, the compounds represented by the following formulas (2C) to (4C) are preferably used, specifically, the compounds represented by the following formulas D-7 to D-9 are preferably used.

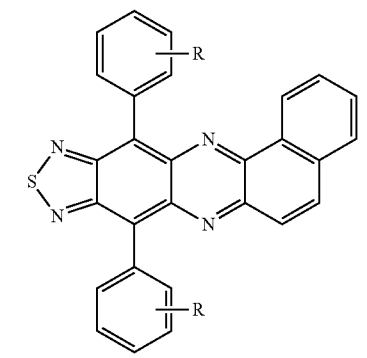
(2C)

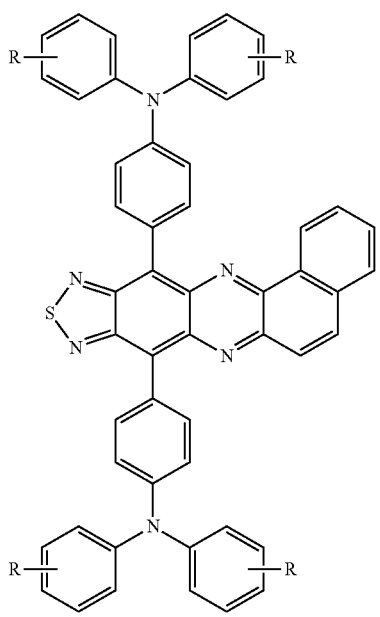
(3C)

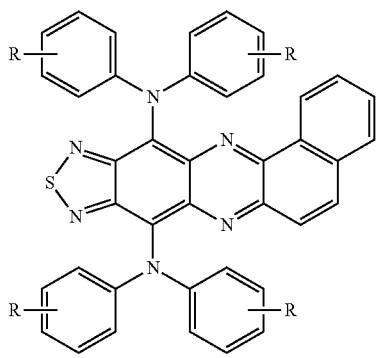
(4C)

[In formulas (2C) to (4C), R's each independently indicate a hydrogen atom, an alkyl group, or an aryl group which may have a substituent. In addition, the carbon atoms of two adjacent Rs may be linked and have a cyclic shape.]

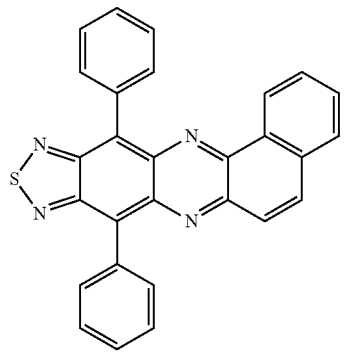
(D-7)

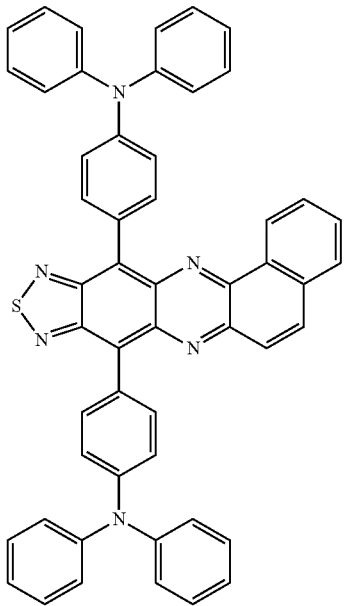
(D-8)

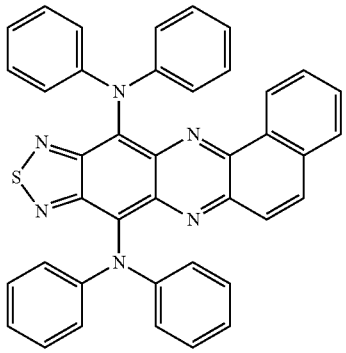
(D-9)

Next, description will be given of the compound represented by the following formula (1D).

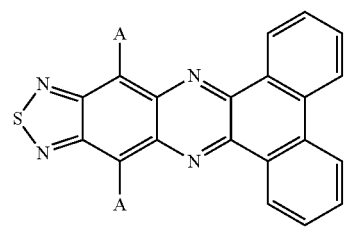
(1D)

[In formula (1D), A and B each independently indicate a hydrogen atom, an alkyl group, an aryl group which may have a substituent, an arylamino group, or a triaryl amine.]

The above thiadiazole based compounds have energy levels capable of trapping carriers, and the light generated as a result at the time of returning to the ground state is in the near infrared region. Accordingly, by configuring the above thiadiazole based compounds as a trapping material (light emitting material), the carrier trapping layer 6 traps carriers and, along with this, emits light at a wavelength range (near infrared range) of 700 nm or more, that is, emits luminescent light which is not recognizable to the human eye.

In particular, as the thiadiazole based compound used in the carrier trapping layer 6, from the viewpoint of achieving an increase in efficiency and a lengthening of the life span, the compounds represented by the following formulas (2D) to (4D) are preferably used, specifically, the compounds represented by the following formulas D-10 to D-12 are particularly preferably used.

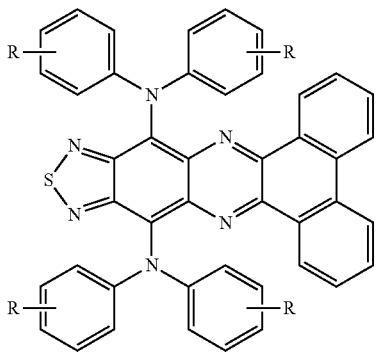

(4D)

[In formulas (2D) to (4D), R's each independently indicate a hydrogen atom, an alkyl group, or an aryl group which may have a substituent. In addition, the carbon atoms of two adjacent Rs may be linked and have a cyclic shape.]

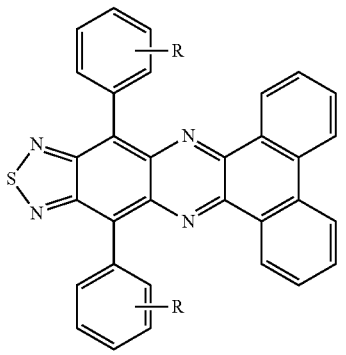

(2D)

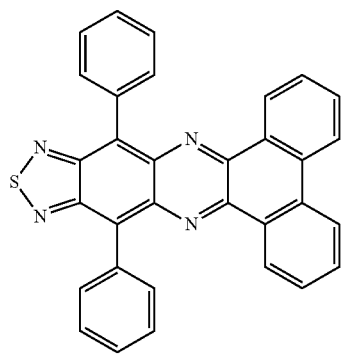

(D-10)

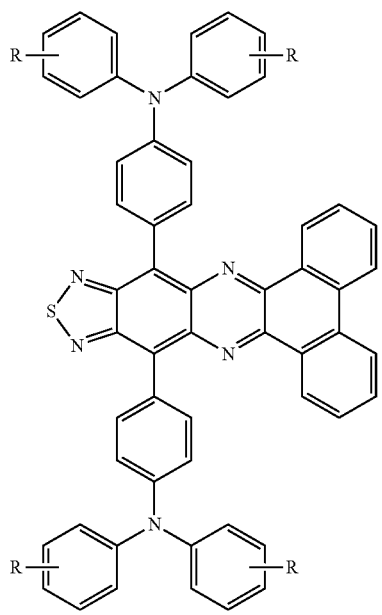

(3D)

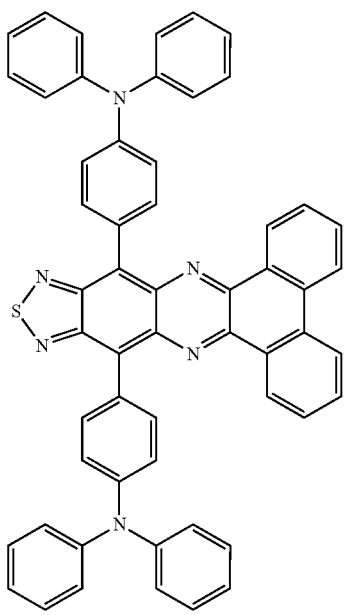

(D-11)

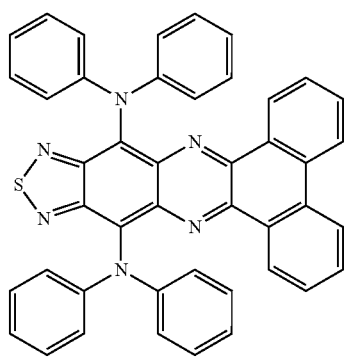
(D-12)

In addition, as the constituent material of the carrier trapping layer 6, in addition to the above-described thiadiazole based compound (trapping material), a host material in which the thiadiazole based compound is added (supported) as a guest material (dopant) is preferably used.

The host material generates excitons by recombining the holes and electrons, and, along with this, has a function of transferring the energy of the excitons in the light emitting material (Förster transfer or Dexter transfer) and exciting the thiadiazole based compound. Therefore, it is possible to increase the carrier trapping efficiency of the thiadiazole based compound. For example, it is possible to use the above host material after doping a light emitting material, which is a guest material, as a dopant in the host material.

The above host material is not particularly limited as long as the above-described function is exhibited with respect to the thiadiazole based compound to be used; however, examples thereof include distyrylarylene derivatives, naphthacene derivatives (naphthacene based materials), anthracene derivatives such as 2-t-butyl-9,10-di(2-naphthyl) anthracene (TBADN) (anthracene based material), perylene derivatives, distyryl benzene derivatives, bis(2-methyl-8-quinolinolato)(p-phenylphenolato)aluminium (BAlq), quinolinolate metal complexes such as tris(8-quinolinolato) aluminium complex ($Alq_3$), amine derivatives (amine based material), oxadiazole derivatives, rubrene and derivatives thereof, silole derivatives, dicarbazole derivatives, oligothiophene derivatives, benzopyran derivatives, triazole derivatives, benzoxazole derivatives, benzothiazole derivatives, quinoline derivatives, 4,4'-bis(2,2'-diphenylvinyl)biphenyl (DPVBi), carbazole derivatives such as 3-phenyl-4-(1'-naphthyl)-5-phenyl-carbazole, 4,4'-N,N'-dicarbazole biphenyl (CBP), and the like, and it is possible to use one type singly or a combination of two or more types from the above.

Among the above, as the host material, in a case where the carrier trapping layer 6 is positioned between the red light emitting layer 7R (light emitting layer 7) and the anode 3 as in the present embodiment, it is preferable to use an acene based material or an amine based material.

The acene based material and the amine based material have little unintended interaction with the thiadiazole based compound as described above. In addition, when using the above materials as the host material (in particular, anthracene based material, tetracene based material, and amine based materials), it is possible to transfer energy efficiently from the host material to the thiadiazole based compound. This is considered to be due to the following: (a) that it is possible to generate a singlet excitation state of the thiadiazole based compound according to the energy transfer from the triplet excitation state of the host material, (b) that the overlap of the π electron cloud of the host material and the electron cloud of the thiadiazole based compound becomes great, and (c) that the overlap of the fluorescence spectrum of the host material and the absorption spectrum of the thiadiazole based compound becomes great.

Due to the above, when using acene based material and amine based material as the host material, it is possible to increase the carrier trapping efficiency of the thiadiazole based compound.

In addition, the acene based material and the amine based material have excellent resistance with respect to electrons and holes. In addition, the acene based material and the amine based material are also excellent in thermal stability. Therefore, it is possible to achieve a lengthening of the life span of the carrier trapping layer 6.

In addition, since the acene based material and the amine based material have an excellent hole transporting property, in a case where the carrier trapping layer 6 is positioned between the red light emitting layer 7R and the anode 3 as in the present embodiment, it is possible to transport the holes, which were not used in the light emitting of the infrared light of the carrier trapping layer 6, to the red light emitting layer 7R side, whereby it is possible to increase the light emitting efficiency of the light emitting layer 7.

Here, in a case where naphthacene material is used as the host material, as in the present embodiment, it is preferable to adopt a configuration provided with an intermediate layer 8. In this manner, it is possible to reliably prevent the light emitting efficiency of the visible light emitting layer 7 from decreasing. Here, the acene material is not particularly limited as long as it has an acene skeleton and exhibits the above-described effects and examples thereof include naphthalene derivatives, anthracene derivatives, naphthacene derivatives (tetracene derivatives), and pentacene derivatives, and, while it is possible to use one type or a combination of two or more types from the above, it is preferable to use anthracene derivatives (anthracene based material) or tetracene derivatives (tetracene based material).

The tetracene based material is not particularly limited as long as it has at least one tetracene skeleton in one molecule and is capable of exhibiting the functions as the above-described host material; however, for example, the compound represented by the following formula IRH-1 is preferably used, the compound represented by the following formula IRH-2 is more preferably used, and the compound represented by the following formula IRH-3 is even more preferably used.

IRH-1

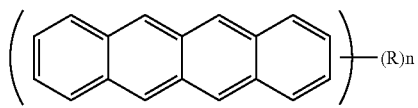

IRH-2

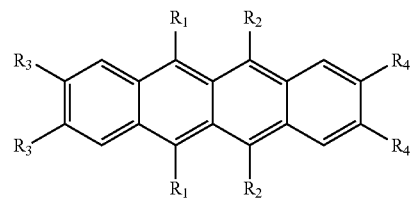

IRH-3

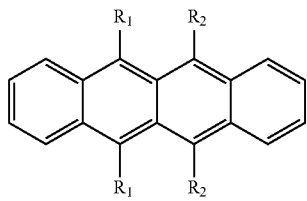

[In the formula IRH-1, n indicates a natural number of 1 to 12, R's represent a substituent or a functional group and each independently indicate a hydrogen atom, an alkyl group, an aryl group which may have a substituent, or an arylamino group. In addition, in the formulas IRH-2 and IRH-3, $R_1$ to $R_4$ each independently indicates a hydrogen atom, an alkyl group, an aryl group which may have a substituent, or an arylamino group. In addition, $R_1$ to $R_4$ may be the same or different from each other.]

In addition, the tetracene based material is preferably configured by carbon atoms and hydrogen atoms. In this manner, it is possible to prevent the generation of unintended interaction between the host material and the thiazole based compound. Accordingly, it is possible to increase the carrier trapping efficiency by the thiadiazole based compound emitting infrared light. In addition, it is possible to increase the resistance of the host material with respect to electrons and holes. Therefore, it is possible to achieve a lengthening of the life span of the carrier trapping layer 6.

Specifically, as the tetracene based material, for example, it is preferable to use the compound represented by the following formulas H1-1 to H1-11, and the compounds represented by the following formulas H1-12 to H1-27.

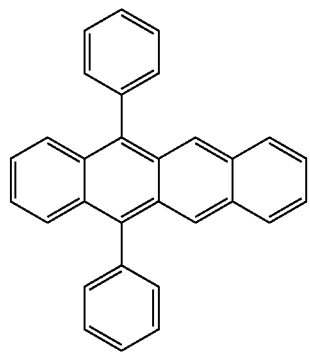

H1-1

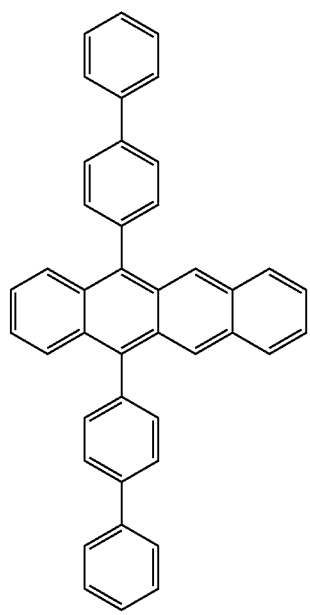

H1-2

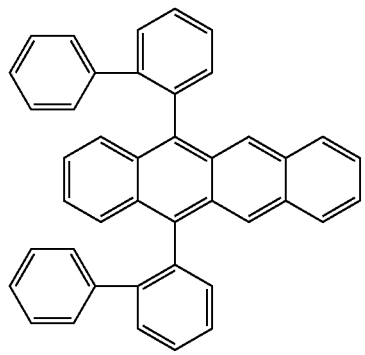

H1-3

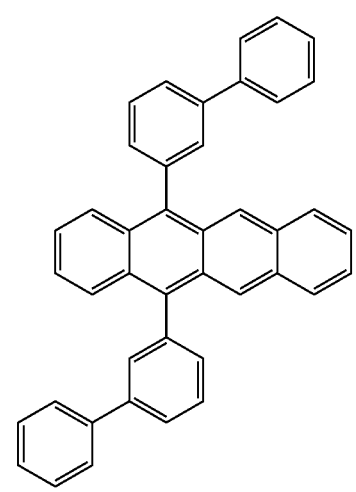

H1-4

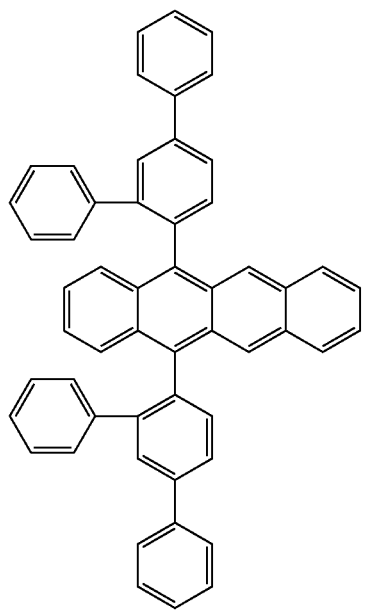

H1-5

H1-6
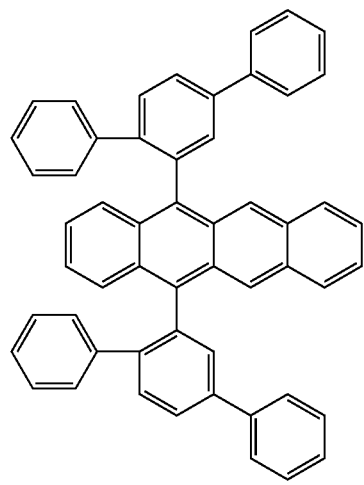
H1-7
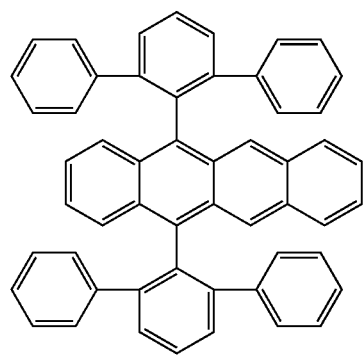
H1-8
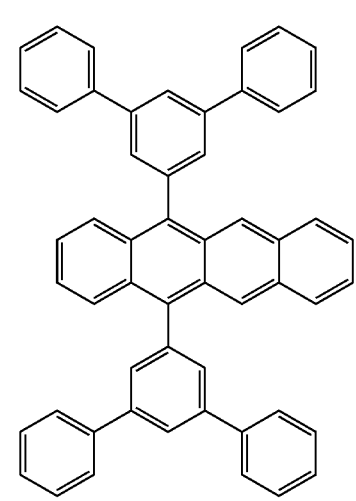
H1-9
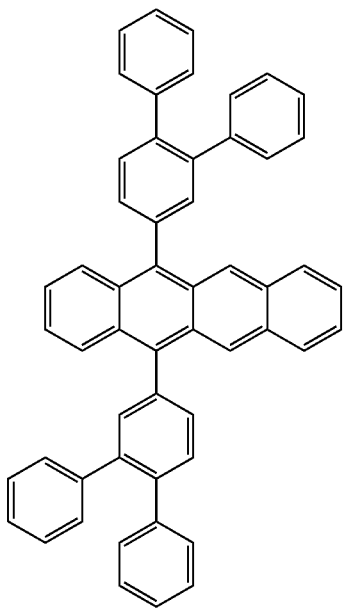
H1-10
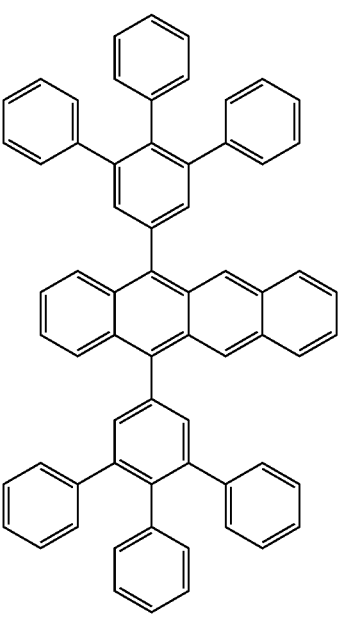

H1-11
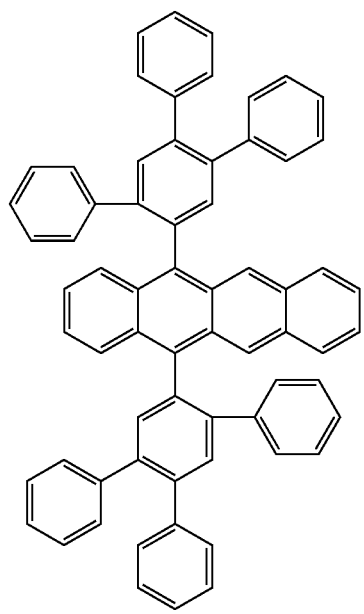
H1-12
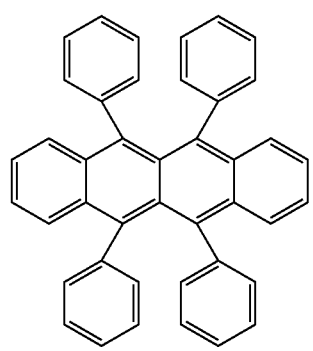
H1-13
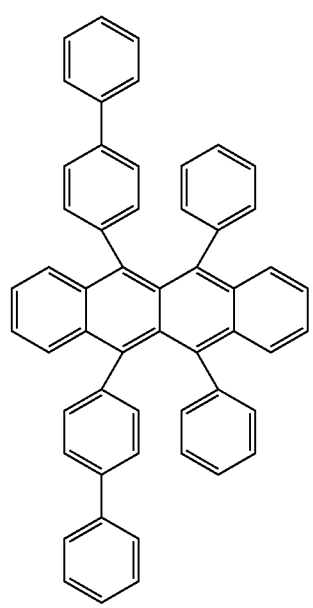
H1-14
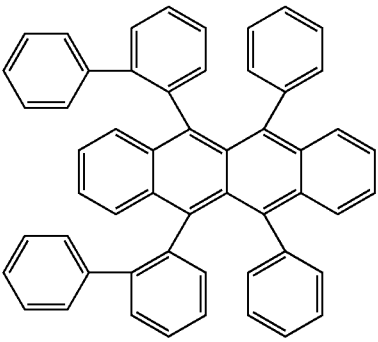
H1-15
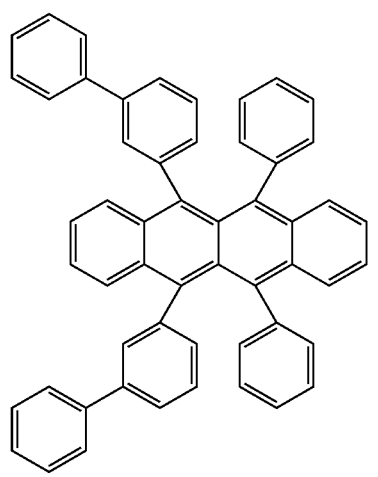
H1-16
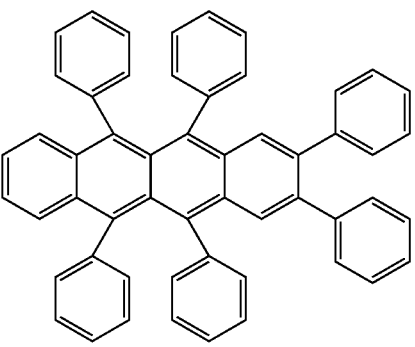

H1-17
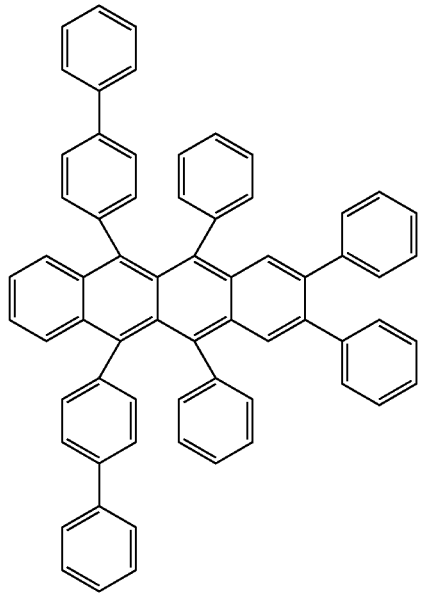
H1-18
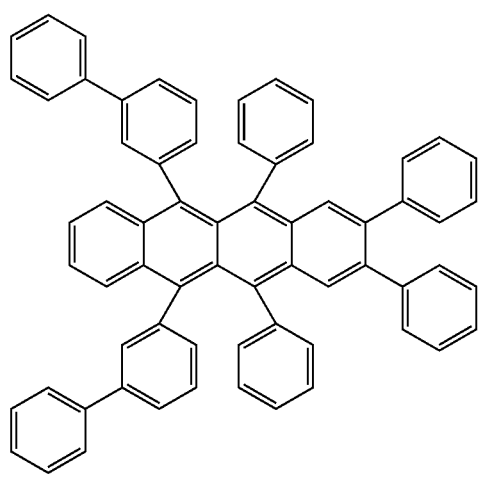
H1-19
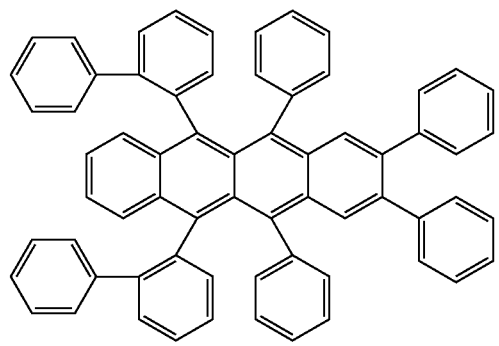
H1-20
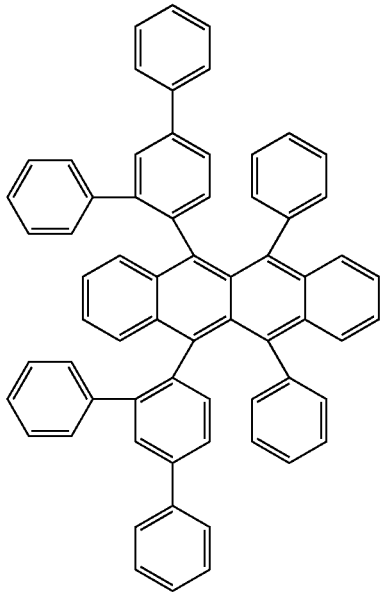
H1-21
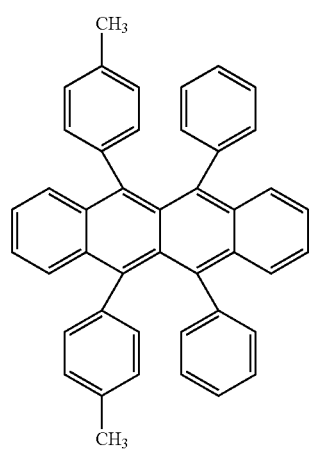
H1-22
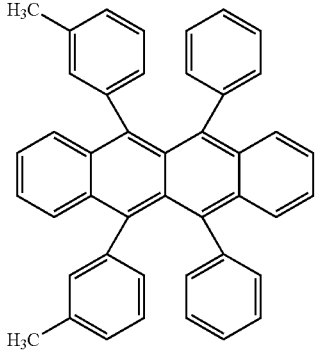

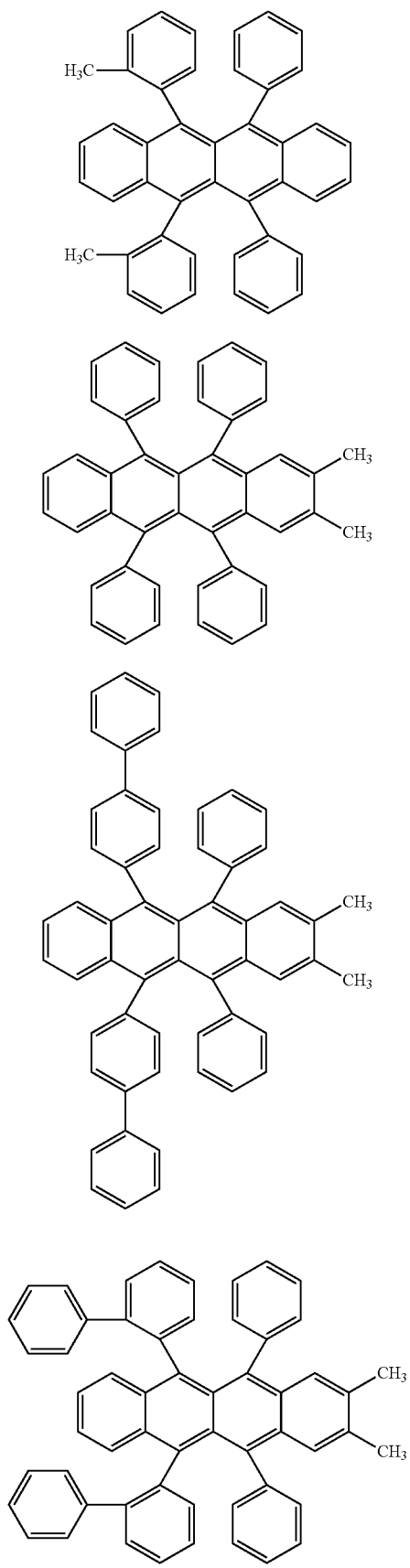

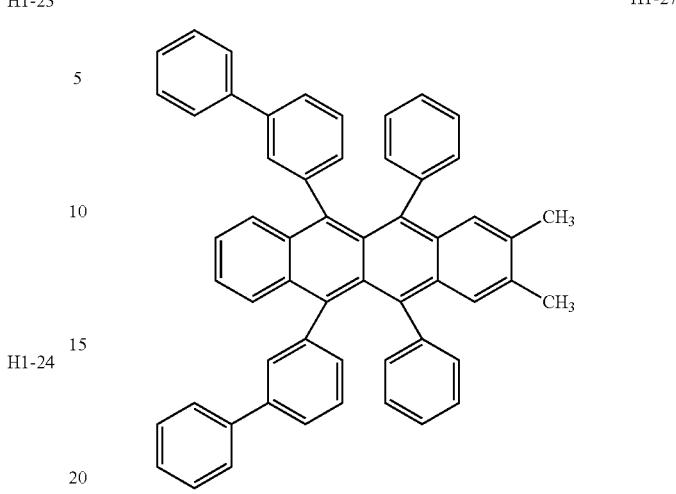

In addition, the anthracene based material is not particularly limited as long as it has at least one anthracene skeleton in one molecule and is capable of exhibiting the functions as the above-described host material; however, for example, the compound represented by the following formula IRH-4 or a derivative thereof is preferably used, and the compounds represented by the following formulas IRH-5 to IRH-8 is more preferably used.

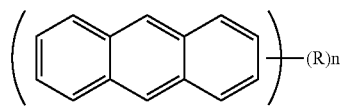

IRH-4

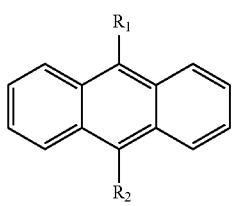

IRH-5

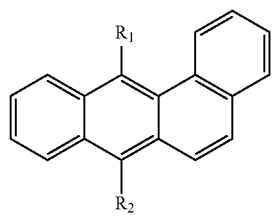

IRH-6

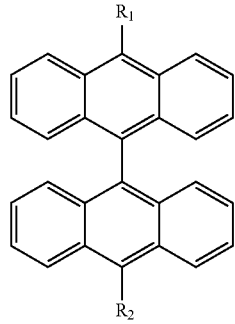

IRH-7

IRH-8

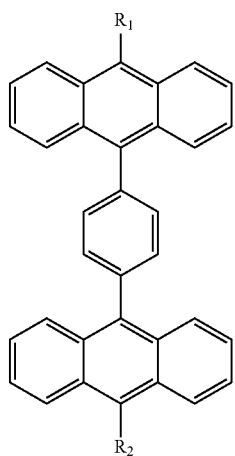

[In the formula IRH-4, n indicates a natural number of 1 to 10, R's represent a substituent or a functional group and each independently indicate a hydrogen atom, an alkyl group, an aryl group which may have a substituent, or an arylamino group. In addition, in the formulas IRH-5 to IRH-8, $R_1$ and $R_2$ each independently indicates a hydrogen atom, an alkyl group, an aryl group which may have a substituent, or an arylamino group. In addition, $R_1$ and $R_2$ may be the same or different from each other.]

Further, the anthracene based material is preferably configured by carbon atoms and hydrogen atoms. In this manner, it is possible to prevent the generation of unintended interaction between the host material and the thiazole based compound. Accordingly, it is possible to increase the carrier trapping efficiency by the thiazole based compound emitting infrared light. In addition, it is possible to increase the resistance of the host material with respect to electrons and holes. Therefore, it is possible to achieve a lengthening of the life span of the carrier trapping layer 6.

Specifically, as the anthracene based material, for example, the compounds represented by the following formulas H2-1 to H2-16, the compounds represented by the following formulas H2-17 to H2-36, and the compounds represented by the following formulas H2-37 to H2-56.

H2-1

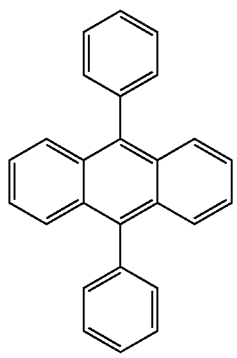

H2-2

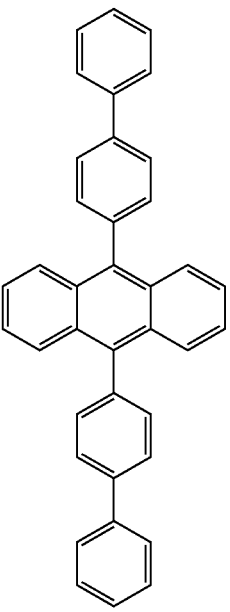

H2-3

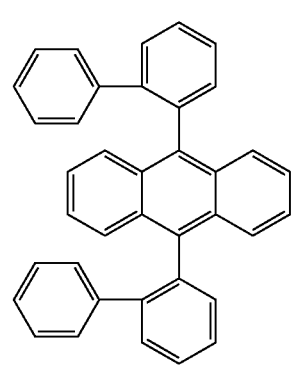

H2-4

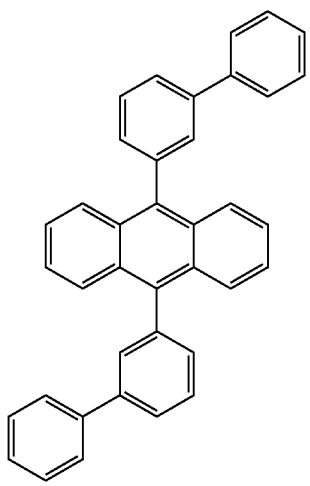

H2-5
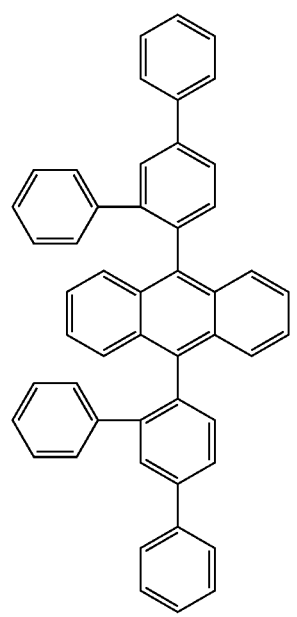
H2-8
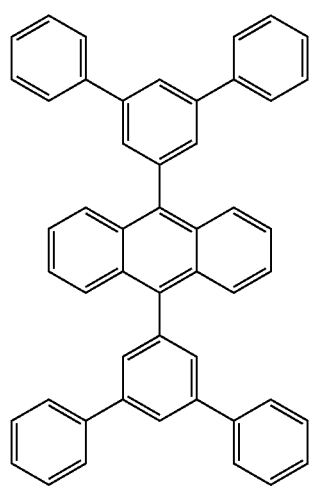
H2-6
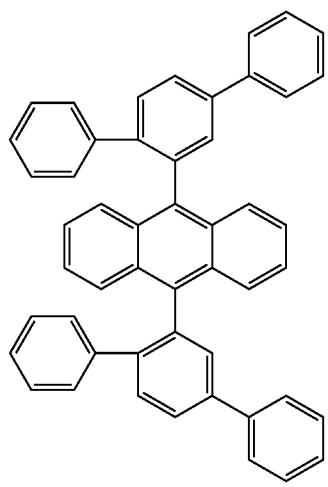
H2-7
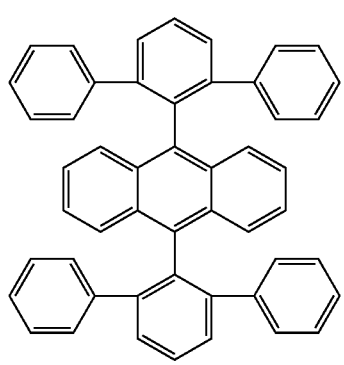
H2-9
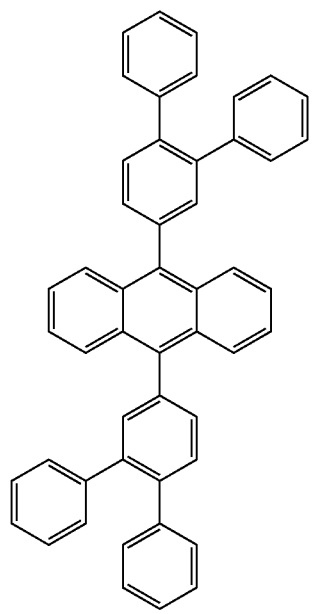

H2-10
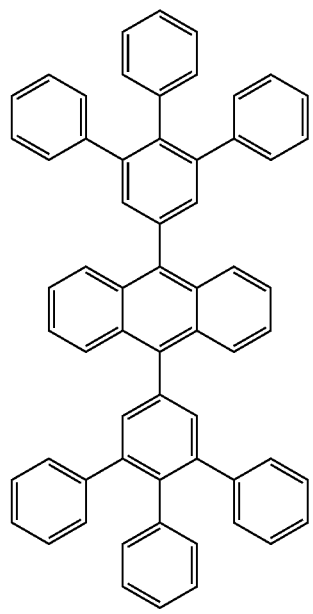
H2-11
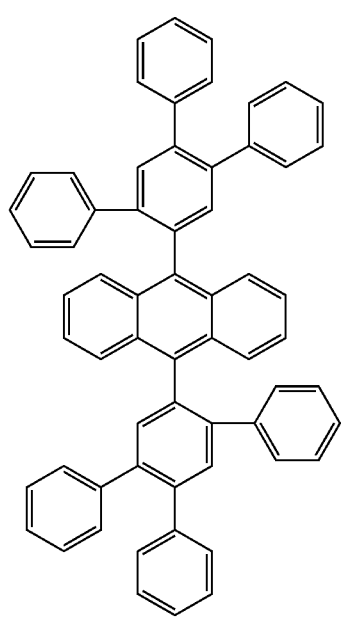
H2-12
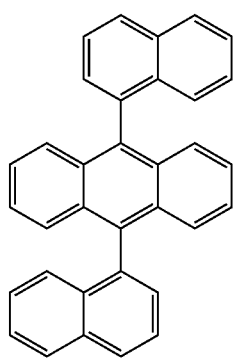
H2-13
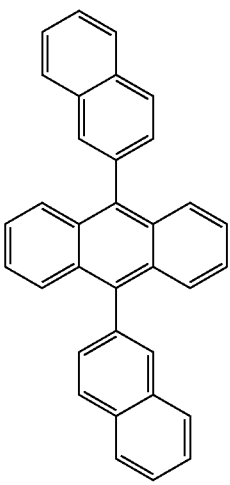
H2-14
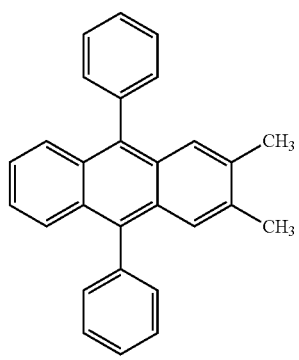
H2-15
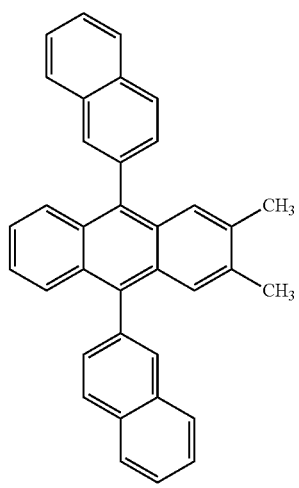

H2-16
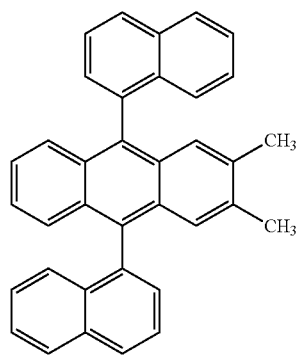
H2-17
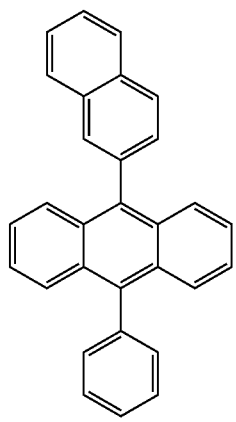
H2-18
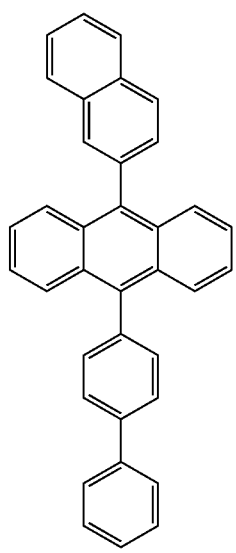
H2-19
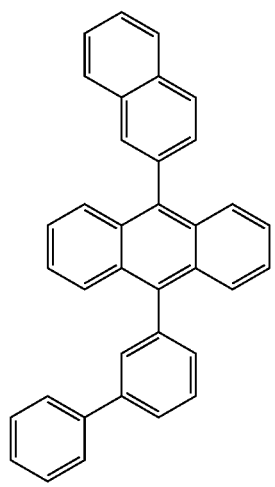
H2-20
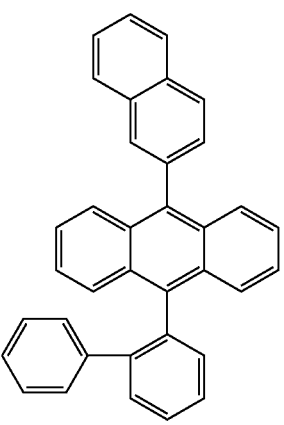
H2-21
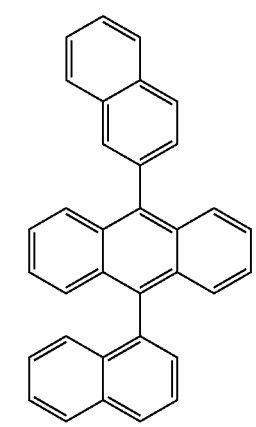

-continued
H2-22
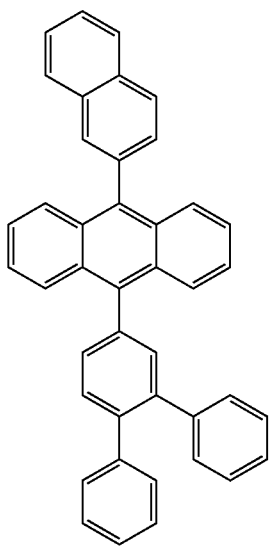
H2-23
H2-24
H2-25
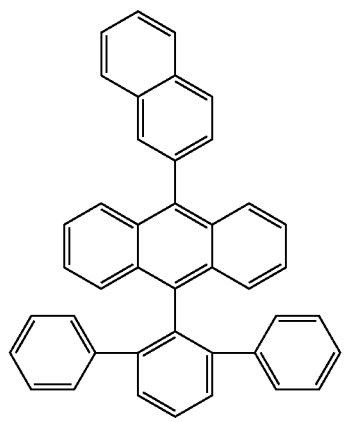
H2-26
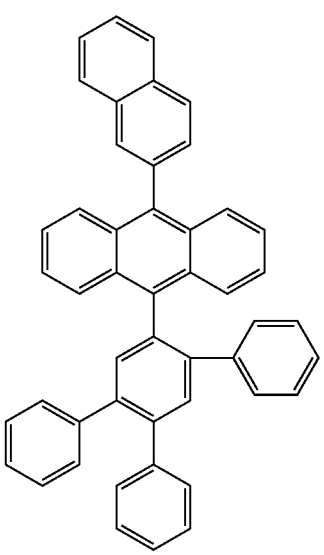
H2-27
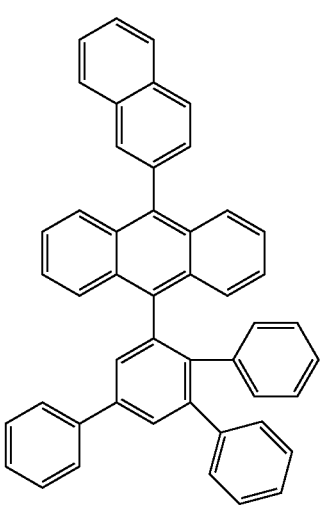

H2-28
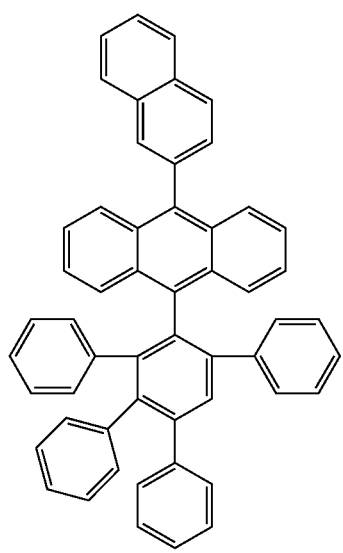
H2-30
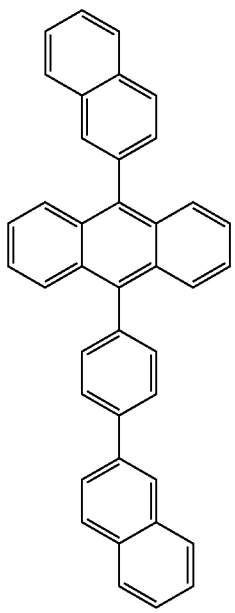
H2-29
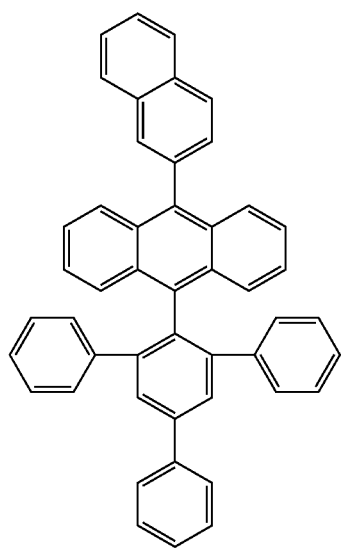
H2-31
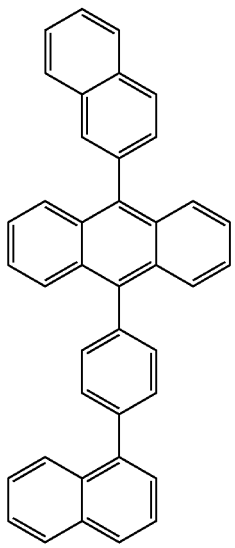

-continued
H2-32
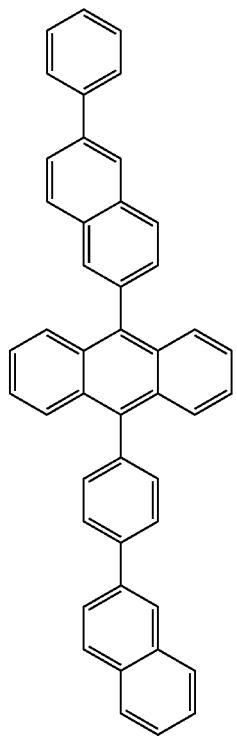
H2-33
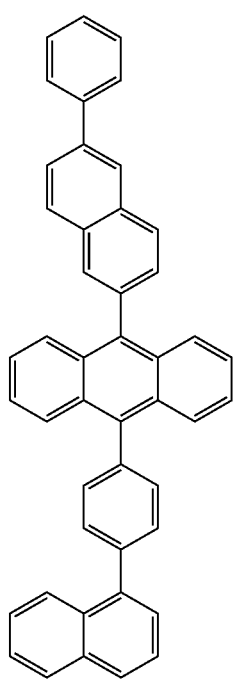
H2-34
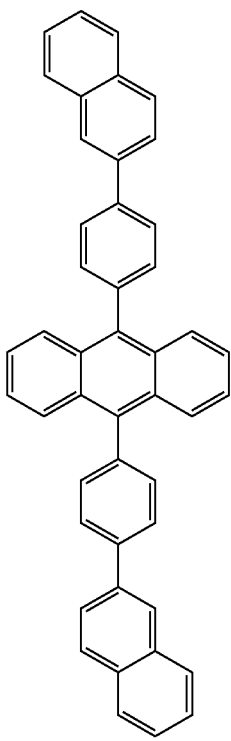
H2-35
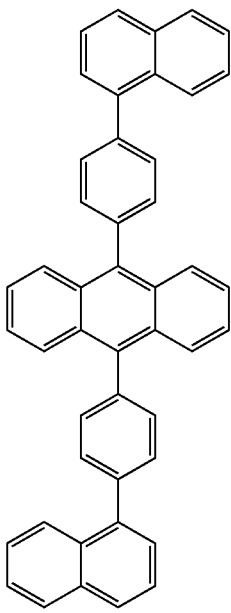

H2-36
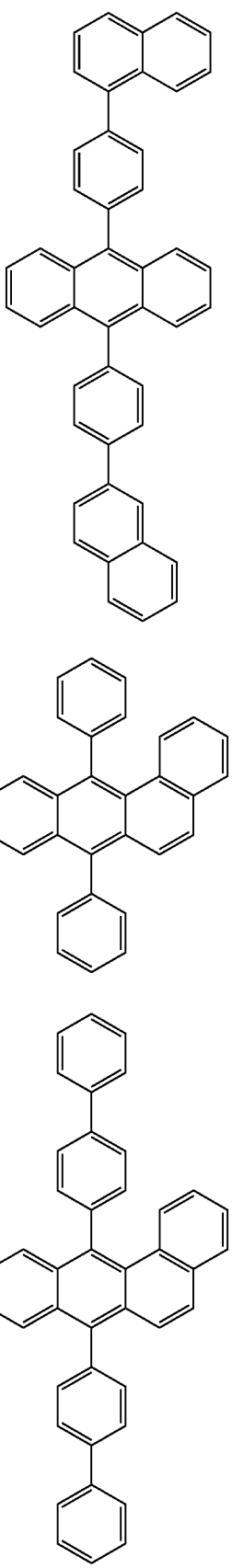
H2-37
H2-38
H2-39
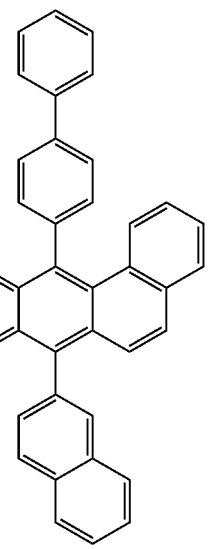
H2-40
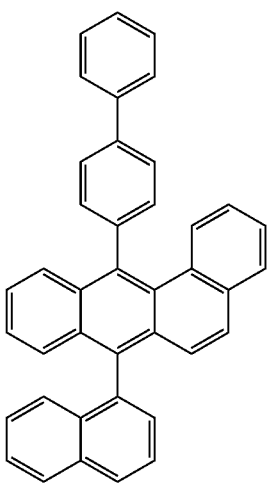
H2-41
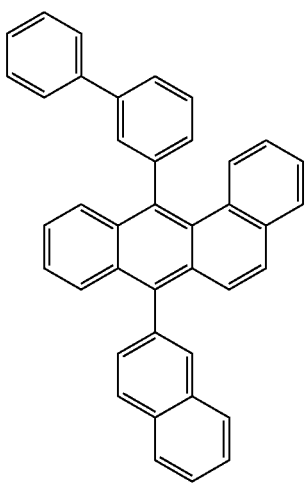

H2-42
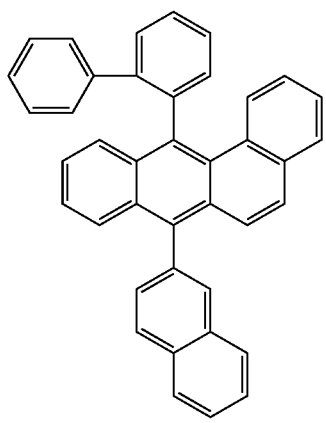
H2-43
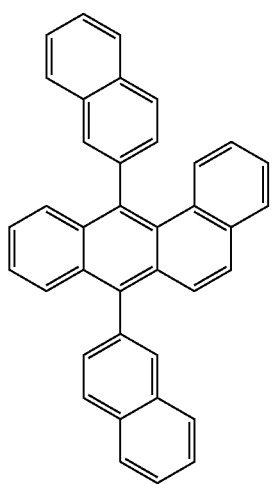
H2-44
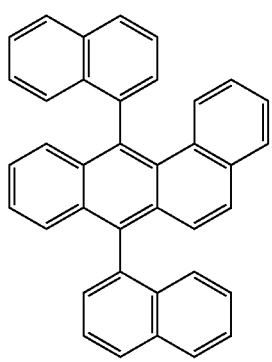
H2-45
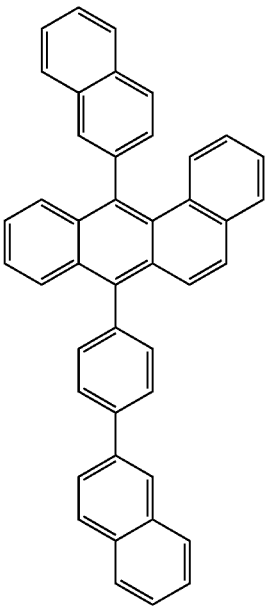
H2-46
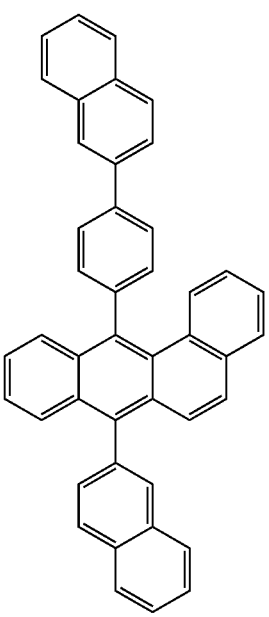

H2-47
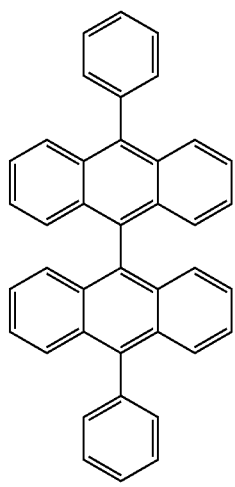
H2-48
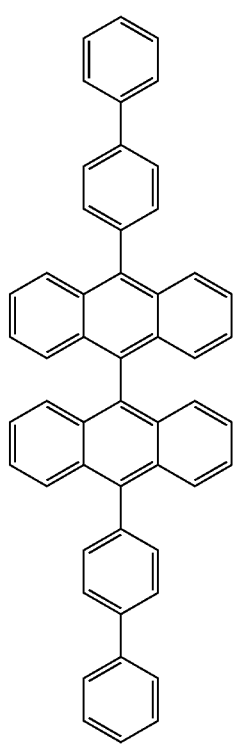
H2-49
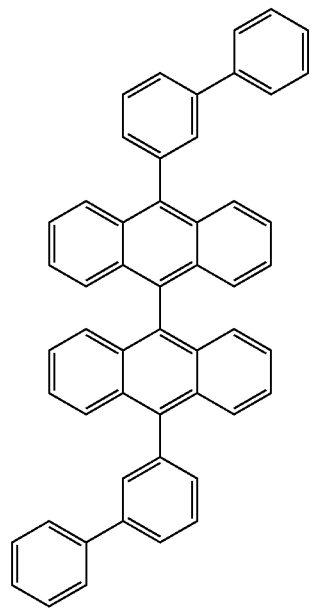
H2-50
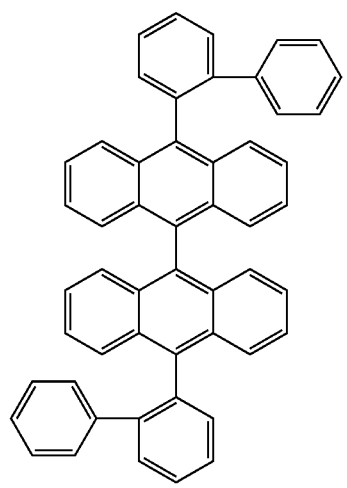

H2-51
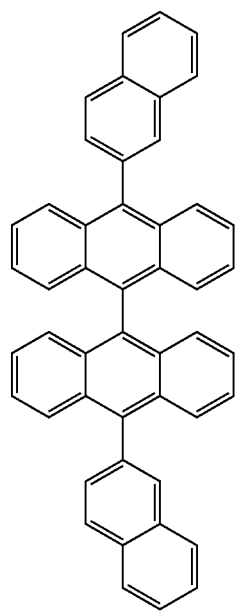
H2-52
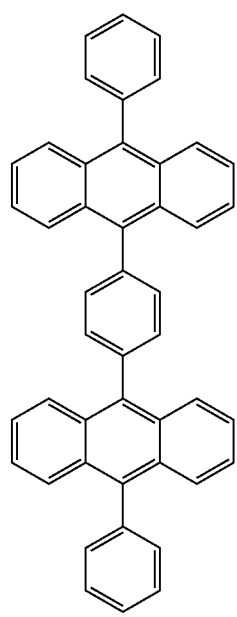
H2-53
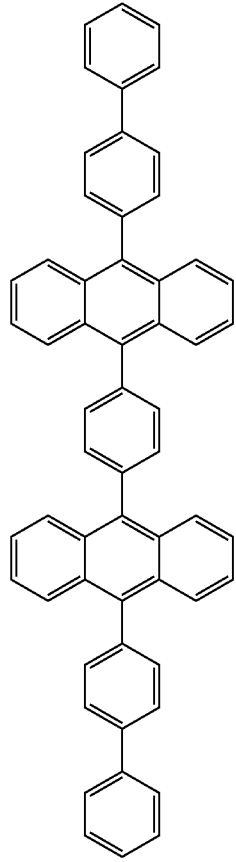
H2-54
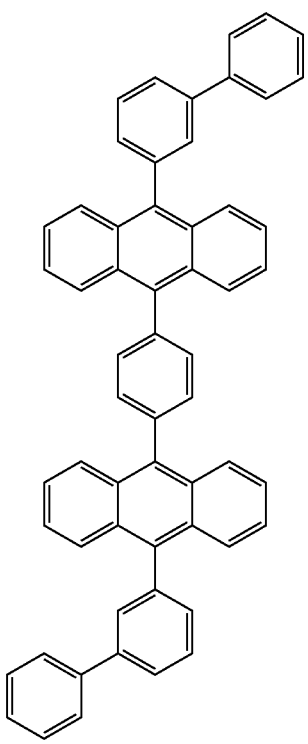

-continued

H2-55

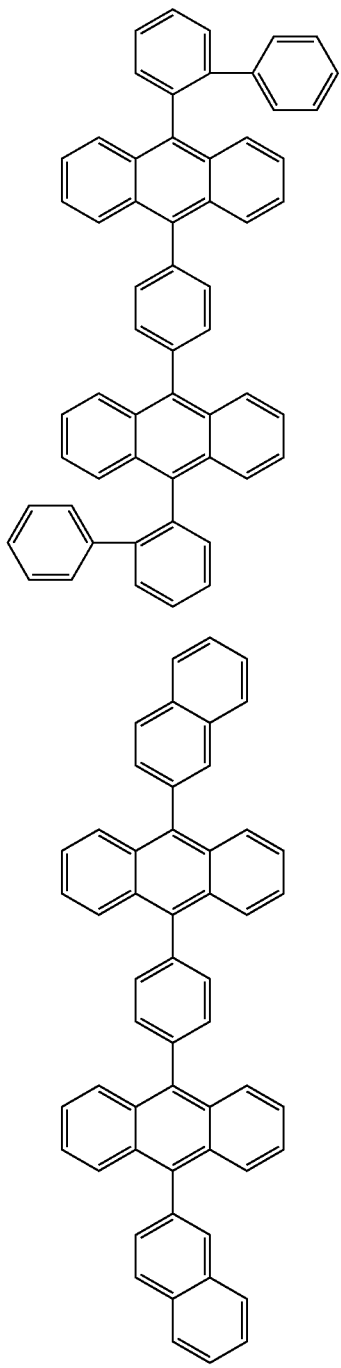

H2-56

Further, the amine based material is not particularly limited as long as it has an amine skeleton and exhibits the above-described effects and it is possible to use material having an amine skeleton from among the hole transporting materials described above; however, it is preferable to use a benzidine based amine derivative.

In particular, among benzidine based amine derivatives, ones in which two or more naphthyl groups are injected are preferable. Examples of the above benzidine based amine derivatives include N,N'-bis(1-naphthyl)-N,N'-diphenyl-[1,1'-biphenyl]-4,4'-diamine (α-NPD) represented by the following chemical formula (22) or tetrakis-p-biphenylyl benzidine, N,N,N',N'-tetra-naphthyl-benzidine (TNB) represented by the following chemical formula (23), or the like.

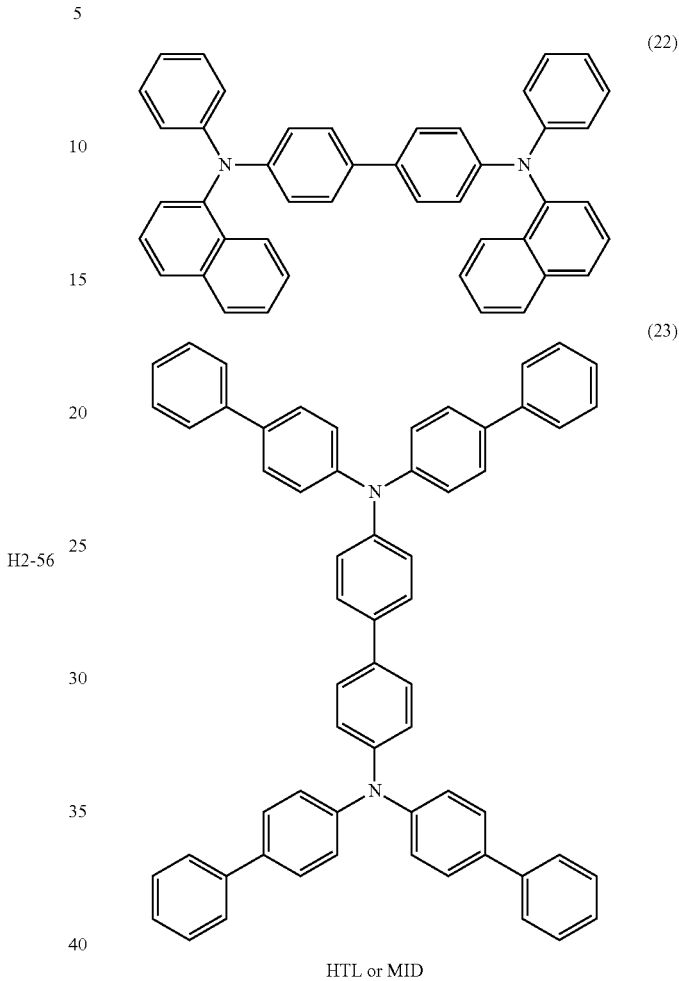

HTL or MID

The content (doping amount) of the trapping material (thiazole based compound) in the carrier trapping layer 6 including the above trapping material and host material is preferably 0.01 to 10 wt % and more preferably 0.1 to 5 wt %. By setting the content of the trapping material to be within the above range, it is possible to optimize the carrier trap efficiency by emitting infrared light as luminescent light.

In addition, the average thickness of the carrier trapping layer 6 is not particularly limited; however, approximately 1 to 60 nm is preferable and approximately 3 to 50 nm is more preferable.

Red Light Emitting Layer

By conducting electricity between the above-described anode 3 and cathode 11, the red light emitting layer 7R emits red light as luminescent light (visible light).

The red light emitting layer 7R is configured by including red light emitting material emitting red light.

The above red light emitting material is not particularly limited; however, it is possible to use one type or combine two or more types of various types of red fluorescent material, or red phosphorescent materials.

The red fluorescent material is not particularly limited as long as it generates red fluorescent light and examples thereof include perylene derivatives, europium complexes, benzopyran derivatives, rhodamine derivatives, benzothioxanthene derivatives, porphyrin derivatives, nile red, 2-(1,1-dimethylethyl)-6-(2-(2,3,6,7-tetrahydro-1,1,7,7-tetramethyl-1H,5H-benzo(ij)quinolizine-9-yl) ethenyl)-4H-pyran-4H-ylidene) propanedinitrile (DCJTB), 4-(dicyanomethylene)-2-methyl-6-(p-dimethylaminostyryl)-4H-pyran (DCM), and the like of compounds (diindenoperylene derivatives) represented by the following chemical formula (17).

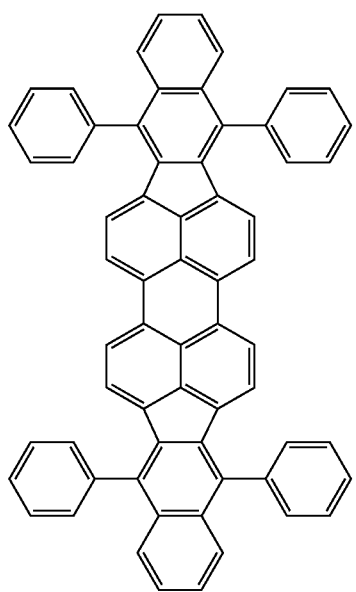

(17)

Among the above, diindenoperylene derivatives are preferably used as the red light emitting material. In this manner, it is possible to cause the red light emitting layer 7R to emit red light with a higher brightness.

The red phosphorescent material is not particularly limited as long as it generates red phosphorescence and examples thereof include metal complexes of iridium, ruthenium, platinum, osmium, rhenium, and palladium, and further examples thereof include those in which at least one in the ligands of the above metal complexes has a phenyl pyridine skeleton, a bipyridyl skeleton, a porphyrin skeleton, or the like. More specifically, examples thereof include tris(1-phenylisoquinoline) iridium, bis[2-(2'-benzo[4,5-α]thienyl)pyridinate-N, C$^{3'}$]iridium (acetylacetonate) (btp2Ir(acac)), 2,3,7,8,12,13,17,18-octaethyl-12H,23H-porphyrin-platinum (II), bis[2-(2'-benzo[4,5-α]thienyl)pyridinate-N,C$^{3'}$]iridium, and bis(2-phenylpyridine) iridium (acetylacetonate).

In addition, as well as the above-described red light emitting materials, the red light emitting layer 7R preferably includes a host material in which a red light emitting material is set as the guest material.

As the host material, it is possible to use materials similar to those described as host materials included in the carrier trapping layer 6.

Here, as in the present embodiment, in a case of a configuration where the carrier trapping layer 6 and the red light emitting layer 7R are adjacent and the carrier trapping layer 6 is positioned at the anode 3 side, it is preferable that naphthacene based material be used as the host material of the red light emitting layer 7R and that at least one type from among naphthacene based material, anthracene based material, and amine based material be used as the host material of the carrier trapping layer 6. In this manner, since it is possible to reduce the difference of the band gap between the carrier trapping layer 6 and the red light emitting layer 7R, it becomes possible to reduce the voltage increase and emit red light with a further improved balance. That is, even if the carrier trapping layer 6 and the red light emitting layer 7R are made to be adjacent, it is possible to emit red light with a further improved balance and it is possible to trap the carriers coming through the red light emitting layer 7R in the carrier trapping layer 6.

Furthermore, in a case where anthracene based material is used as the host material of the red light emitting layer 7R, it is preferable that at least one type from among anthracene based material, and amine based material be used as the host material of the carrier trapping layer 6. In this manner, it is possible to obtain the same effect as above.

Intermediate Layer

The intermediate layer 8 is provided between the layers of the red light emitting layer 7R and the blue light emitting layer 7B so as to be in contact therewith, and has a function of adjusting the movement of the carrier (holes and electrons) between the red light emitting layer 7R and the blue light emitting layer 7B. According to the above function, it is possible to cause the red light emitting layer 7R and the blue light emitting layer 7B to emit light more efficiently, respectively.

The intermediate layer 8 may have any configuration as long as it has a function of adjusting the movement of the carrier (holes and electrons); however, in particular, a configuration including the same type or the same material as the host material of the above-described red light emitting layer 7R and substantially not including material having luminescence is preferable.

As the constituent material of the above intermediate layer 8, for example, the same materials as described above as the host material of the carrier trapping layer 6 may be used, in particular, material including acene based material may be suitably used.

By using such materials, the energy level of the highest occupied molecular orbital (HOMO) of the intermediate layer 8 are capable of being set to be lower than the energy levels of the highest occupied molecular orbital (HOMO) of both the red light emitting layer 7R and the blue light emitting layer 7B and, furthermore, the energy level of the lowest unoccupied molecular orbital (LUMO) of the intermediate layer 8 are capable of being set to be higher than the lowest unoccupied molecular orbital (LUMO) of both the red light emitting layer 7R and the blue light emitting layer 7B. As a result, the energy transfer of the excitons between the red light emitting layer 7R and the blue light emitting layer 7B is more reliably prevented.

The acene material is not particularly limited as long as it has an acene skeleton and exhibits the above-described effects and examples thereof include naphthalene derivatives, anthracene derivatives, tetracene derivatives (naphthacene derivatives), pentacene derivatives, hexacene derivatives, heptacene derivatives, and the like, and, while it is possible to use one type or a combination of two or more types from the above, it is preferable to use tetracene (naphthacene) derivatives.

The tetracene (naphthacene) derivatives are not particularly limited; however, it is possible to use the same ones as the naphthacene derivatives described as the host material of the above-described carrier trapping layer 6.

The above tetracene (naphthacene) derivatives have a bipolar property. Accordingly, the intermediate layer 8 is capable of smoothly transporting holes from the red light emitting layer 7R to the blue light emitting layer 7B and, along with this, is capable of smoothly transporting electrons from blue light emitting layer 7B to the red light emitting layer 7R. In addition, the intermediate layer 8 has excellent resistance with respect to electrons and holes. Accordingly, the degradation of the intermediate layer 8 is prevented and it is possible to improve the durability of the light emitting element 1 as a result.

The content of the acene based material in the above intermediate layer 8 is not particularly limited; however, 10 to 90 wt % is preferable, 30 to 70 wt % is more preferable, and 40 to 60 wt % is even more preferable.

As the constituent material of the intermediate layer 8, it is particularly preferable to include an amine based material (amine derivative) as well as the above-described acene based material.

The amine based material (that is, the material having an amine skeleton) has an excellent hole transporting property, and the acene based material (that is, the material having an scene skeleton) described above has an excellent electron transporting property in comparison with the amine based material. In this manner, the intermediate layer 8 has both an electron transporting property and a hole transporting property. That is, the intermediate layer 8 has a bipolar property. When the intermediate layer 8 has a bipolar property in this manner, it is possible for holes to smoothly pass from the red light emitting layer 7R through the intermediate layer 8 to the blue light emitting layer 7B and, along with this, it is possible for electrons to smoothly pass from the blue light emitting layer 7B through the intermediate layer 8 to the red light emitting layer 7R. As a result, it is possible to efficiently inject electrons and holes into the red light emitting layer 7R and the blue light emitting layer 7B respectively, to thereby cause light to be emitted.

In addition, since the intermediate layer 8 above has a bipolar property, the resistance with respect to carriers (electrons, holes) is excellent. Moreover, since the acene based material has excellent resistance with respect to excitons, even if the electrons and holes recombine in the intermediate layer 8 and generate excitons, it is possible to prevent or suppress the degradation of the intermediate layer 8. In this manner, the degradation of the intermediate layer 8 due to excitons is prevented or suppressed, and, as a result, it is possible to achieve excellent durability in the light emitting element 1.

As the amine based material used in the above intermediate layer 8, it is possible to use the same material exemplified as the host material of the carrier trapping layer 6.

Here, the amine based material such as N,N'-bis(1-naphthyl)-N,N'-diphenyl-[1,1'-biphenyl]-4,4'-diamine (α-NPD) represented by the above-described chemical formula (22), N,N,N',N'-tetra-naphthyl-benzidine (TNB) represented by the above-described chemical formula (23), or the like, generally has an excellent hole transporting property, and the degree of hole transfer of the amine based material is higher than the degree of hole transfer of the acene based material. Accordingly, it is possible for holes to smoothly pass from the red light emitting layer 7R through the intermediate layer 8 to the blue light emitting layer 7B.

The content of the amine based material in the above intermediate layer 8 is not particularly limited; however, 10 to 90 wt % is preferable, 30 to 70 wt % is more preferable, and 40 to 60 wt % is even more preferable.

In addition, the average thickness of the intermediate layer 8 is not particularly limited; however, 1 to 100 nm is preferable, 3 to 50 nm is more preferable, and 5 to 30 nm is even more preferable. In this manner, it is possible for the intermediate layer 8 to reliably adjust the transfer of the holes and electrons between the red light emitting layer 7R and the blue light emitting layer 7B while continuing to suppress the driving voltage.

In contrast, when the average thickness of the intermediate layer 8 exceeds the upper limit value, according to the constituent material or the like of the intermediate layer 8, there are cases where the driving voltage is remarkably increased and the light emission (in particular, the white light emission) of the light emitting element 1 becomes difficult. Meanwhile, when the average thickness of the intermediate layer 8 is lower than the lower limit value, according to the constituent material, driving voltage, and the like of the intermediate layer 8, there is a concern that it may be difficult for the intermediate layer 8 to reliably adjust the transfer of the holes and electrons between the red light emitting layer 7R and the blue light emitting layer 7B.

Blue Light Emitting Layer

By conducting electricity between the above-described anode 3 and cathode 11, the blue light emitting layer 7B emits blue light as luminescent light (visible light).

The blue light emitting layer 7B is configured by including blue light emitting material emitting blue light.

Examples of the above blue light emitting material include various types of blue fluorescent material or blue phosphorescent material and it is possible to use one type or combine two or more types thereof.

The blue fluorescent material is not particularly limited as long as it generates a blue fluorescence and examples thereof include styrylamine based compound represented by the following chemical formula (24A) or the following chemical formula (24B) such as styrylamine derivatives, fluoranthene derivatives, pyrene derivatives, perylene and perylene derivatives, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9.9-dioctylfluorene-2,7-diyl)-co-(2,5-dimethoxy-benzene-1,4-diyl)], poly[(9,9-oxydihexylfluorene-2,7-diyl)-ortho-co-(2-methoxy-5-{2-ethoxyhexyloxy}phenylene-1,4-diyl)], poly[(9,9-dioctylfluorene-2,7-diyl)-co-(ethyl benzene)], and the like.

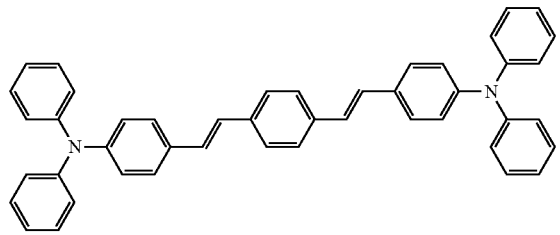

(24A)

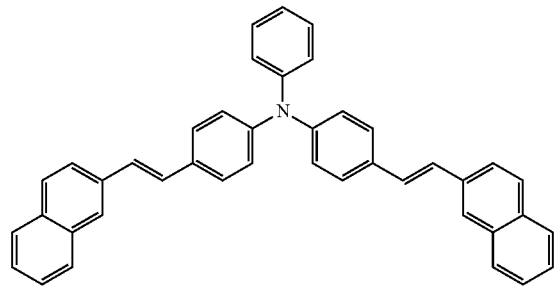

(24B)

The blue phosphorescent material is not particularly limited as long as it generates blue phosphorescence and examples thereof include metal complexes such as iridium, ruthenium, platinum, osmium, rhenium, and palladium, specifically, bis[4,6-difluorophenyl pyridinate-N, $C^{2'}$]-picolinate-iridium, tris[2-(2,4-difluorophenyl)pyridinate-N,$C^{2'}$] iridium, bis[2-(3,5-trifluoromethyl)pyridinate-N,$C^{2'}$]-picolinate-iridium, bis(4,6-difluorophenyl pyridinate-N,$C^{2'}$)-iridium (acetylacetonate), and the like.

In addition, as well as the above-described blue light emitting materials, the blue light emitting layer 7B preferably includes a host material in which a blue light emitting material is set as the guest material.

As the host material, it is possible to use materials similar to those described as host materials included in the carrier trapping layer 6.

Green Light Emitting Layer

By conducting electricity between the above-described anode 3 and cathode 11, the green light emitting layer 7G emits green light as luminescent light (visible light).

The green light emitting layer 7G is configured by including green light emitting material emitting green light.

The above green light emitting material is not particularly limited and it is possible to use one type or combine two or more types of various types of green fluorescent material or green phosphorescent material.

The green fluorescent material is not particularly limited as long as it generates green fluorescence and examples thereof include coumarin derivatives, quinacridone and derivatives thereof such as the quinacridone derivatives and the like shown in the following chemical formula (25), 9,10-bis[(9-ethyl-3-carbazole)-vinylenyle]-anthracene, poly(9,9-dihexyl-2,7-vinylenefluorolenylene), poly[(9,9-dioctylfluorene-2,7-diyl)-co-(1,4-diphenylene-vinylene-2-methoxy-5-{2-ethylhexyloxy}benzene)], poly[(9,9-dioctyl-2,7-divinylenefluorolenylene)-ortho-co-(2-methoxy-5-(2-ethoxylhexyloxy)-1,4-phenylene)], and the like.

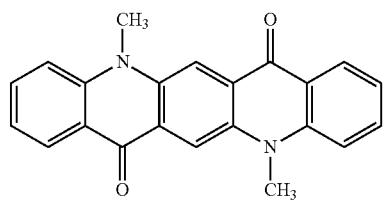

(25)

The green phosphorescent material is not particularly limited as long as it generates green phosphorescence and examples thereof include metal complexes of iridium, ruthenium, platinum, osmium, rhenium, and palladium, and, specifically, examples thereof include fac-tris(2-phenylpyridine) iridium (Ir(ppy)3), bis(2-phenyl pyridinate-N,$C^{2'}$) iridium (acetylacetonate), fac-tris[5-fluoro-2-(5-trifluoromethyl-2-pyridine)phenyl-C,N]iridium, and the like.

In addition, as well as the above-described green light emitting materials, the green light emitting layer 7G preferably includes a host material in which a green light emitting material is set as the guest material.

As the host material, it is possible to use materials similar to those described as host materials included in the carrier trapping layer 6.

In addition, the host material of the above green light emitting layer 7G preferably uses an acene derivative (acene based material) in the same manner as the host material of the red light emitting layer 7R. In this manner, it is possible to cause the green light emitting layer 7G to emit green light with higher brightness and higher efficiency.

Further, the host material of the green light emitting layer 7G is preferably the same as the host material of the above-described blue light emitting layer 7B. In this manner, since a band gap is not generated between the two light emitting layers 7G and 7B, it becomes possible to emit light with a good balance of green light and blue light.

Electron Transporting Layer

The electron transporting layer 9 has a function of transporting injected electrons from the cathode 11 through the electron injection layer 10 to the green light emitting layer 7G.

Examples of the constituent material (electron transporting material) of the electron transporting layer 9 include phenanthroline derivatives such as 2,9-dimethyl-4,7-diphenyl-1,10-phenanthroline (BCP), quinoline derivative such as organic metal complexes in which 8-quinolinol such as tris(8-quinolinolato)aluminium ($Alq_3$) and derivatives thereof are set as ligand, azaindolizine derivatives, oxadiazole derivatives, perylene derivative, pyridine derivatives, pyrimidine derivatives, quinoxaline derivatives, diphenyl quinone derivatives, nitro-substituted fluorene derivatives, and the like, and it is possible to use one type or a combination of two or more types from the above.

Among the above, as the electron transporting material used in the electron transporting layer 9, the use of azaindolizine derivatives is preferable, in particular, the use of compounds (below, simply referred to as "azaindolizine based compounds") having an azaindolizine skeleton and an anthracene skeleton in the molecule is more preferable.

In this manner, since a compound having an azaindolizine skeleton and an anthracene skeleton in the molecule is used as the electron transporting material of the electron transporting layer 9 adjacent to the green light emitting layer 7G, it is possible to efficiently transport the electrons from the electron transporting layer 9 to the green light emitting layer 7G. Therefore, it is possible to give the light emitting element 1 excellent light emitting efficiency.

In addition, since the electrons are efficiently transported from the electron transporting layer 9 to the green light emitting layer 7G, it is possible to lower the voltage of the driving voltage of the light emitting element 1 and, along with this, it is possible to achieve a lengthening of the life span of the light emitting element 1.

Further, since the compound having an azaindolizine skeleton and an anthracene skeleton in the molecule has excellent stability (resistance) with respect to the electrons and holes, in this respect, it is possible to achieve a lengthening of the life span of the light emitting element 1.

For the electron transporting material (azaindolizine based compound) used in the electron transporting layer 9, the number of azaindolizine skeletons and anthracene skeletons included in one molecule is preferably one or two, respectively. In this manner, it is possible for the electron transport ing property and electron injection property of the electron transporting layer 9 to be made to be excellent.

Specifically, as the azaindolizine based compound used in the electron transporting layer 9, for example, it is preferable to use compounds represented by the following formulas ELT-A1 to ELT-A24, compounds represented by the following formulas ELT-B1 to ELT-B12, and compounds represented by the following formulas ELT-C1 to ELT-C20.

ETL-A1
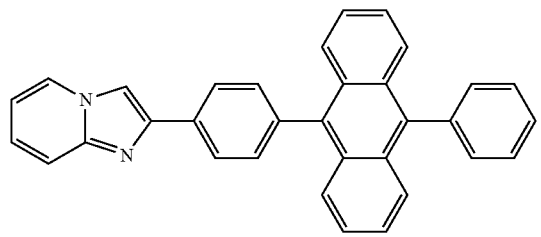
ETL-A2
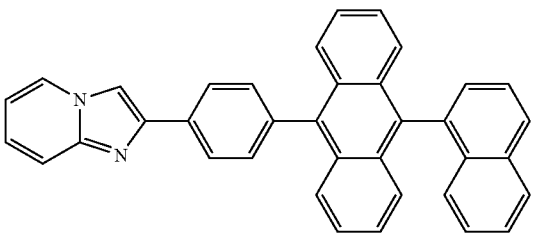
ETL-A3
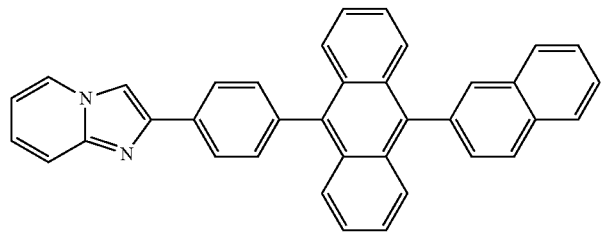
ETL-A4
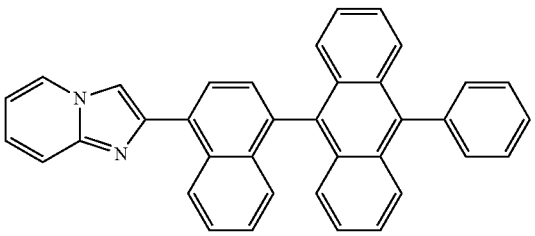
ETL-A5
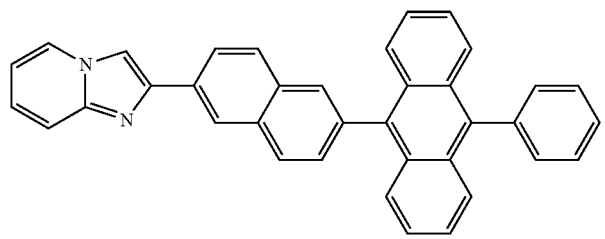
ETL-A6
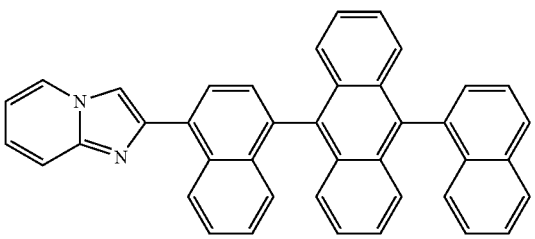
ETL-A7
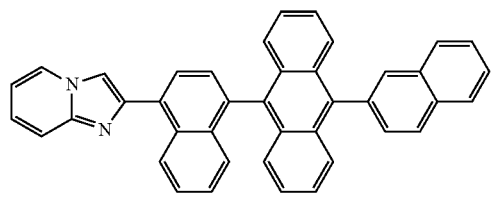
ETL-A8
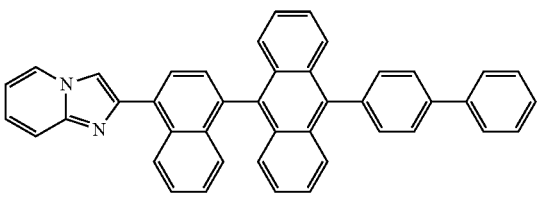
ETL-A9
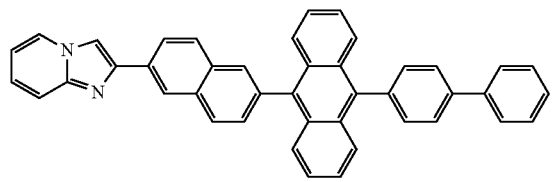
ETL-A10
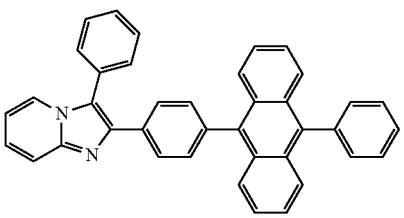
ETL-A11
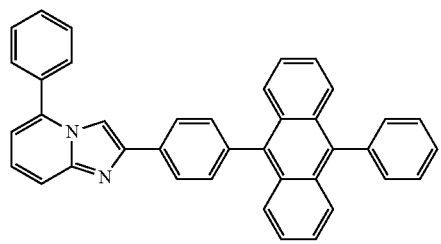
ETL-A12
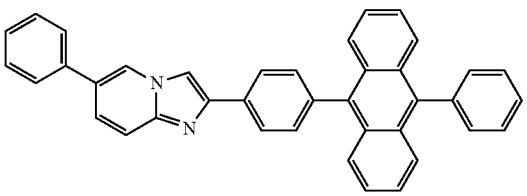

-continued
ETL-A13
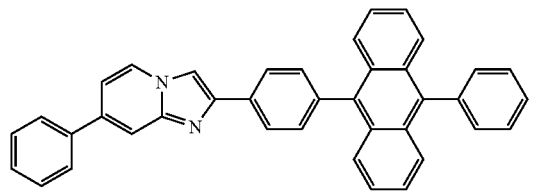
ETL-A14
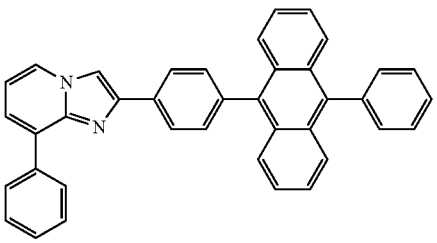
ETL-A15
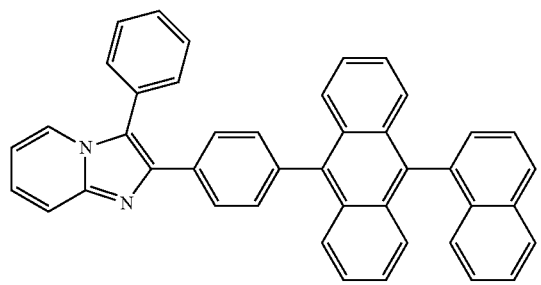
ETL-A16
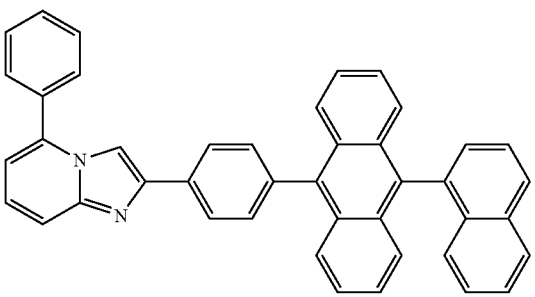
ETL-A17
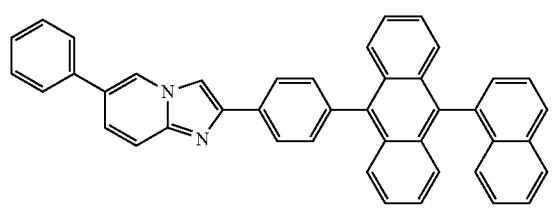
ETL-A18
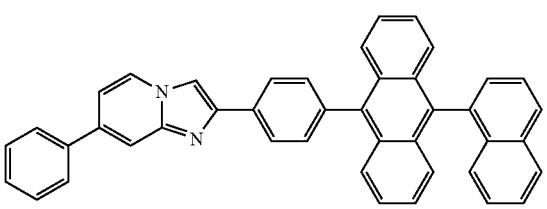
ETL-A19
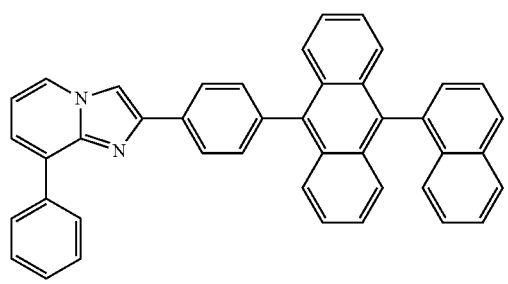
ETL-A20
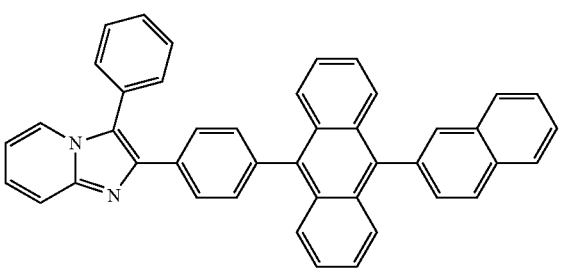
ETL-A21
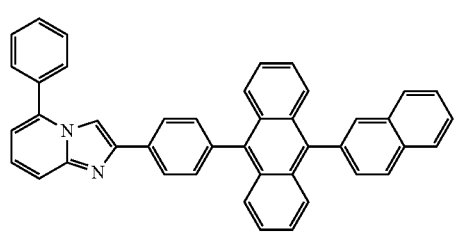
ETL-A22
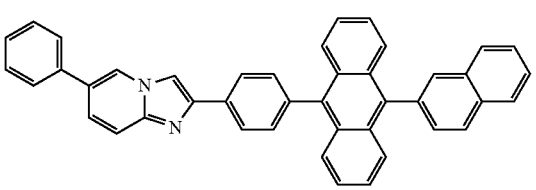
ETL-A23
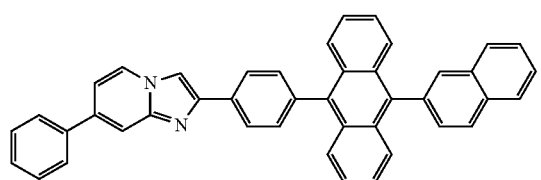
ETL-A24
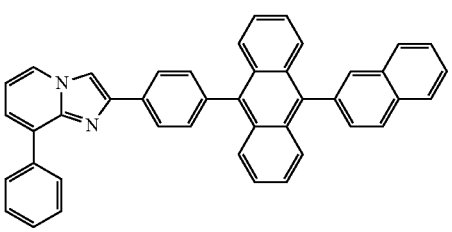

-continued
ETL-B1
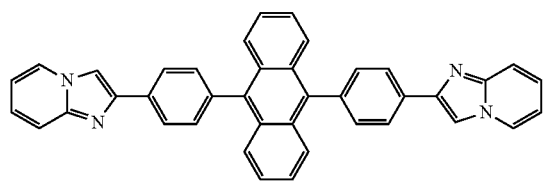
ETL-B2
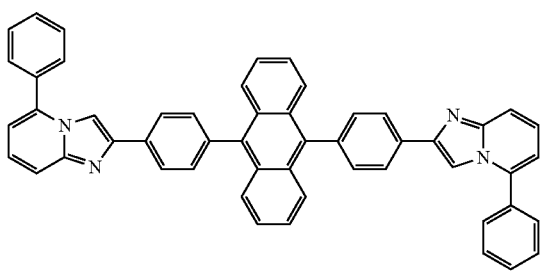
ETL-B3
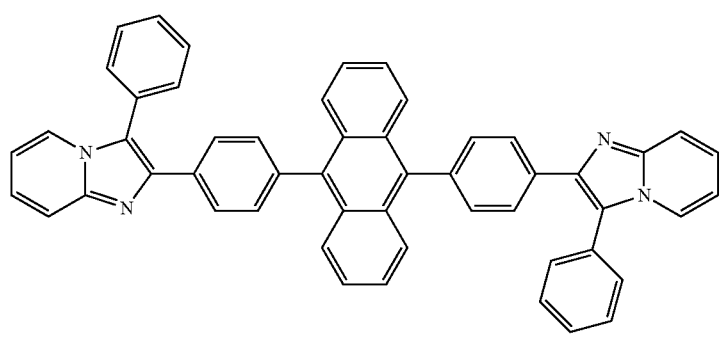
ETL-B4
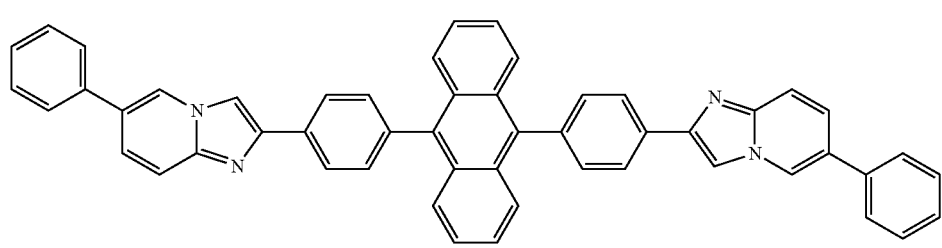
ETL-B5
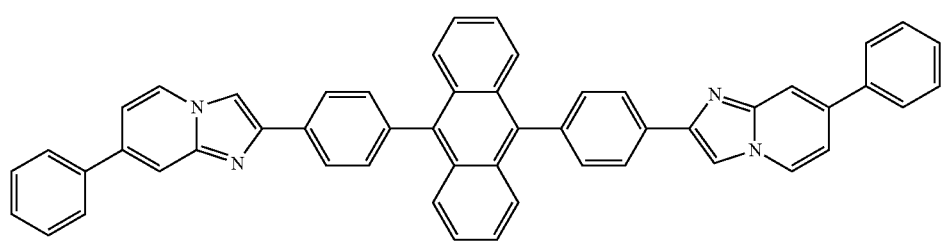
ETL-B6
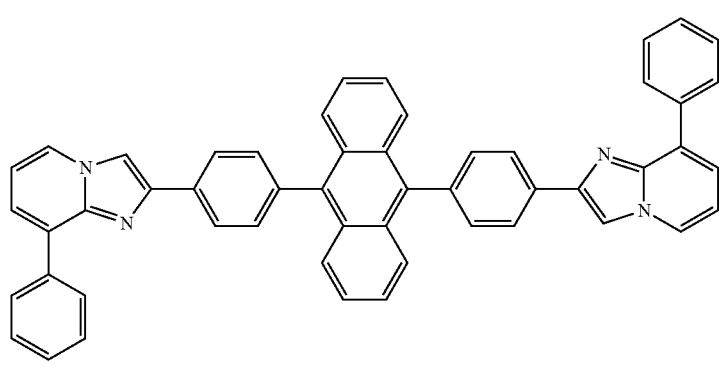

-continued
ETL-B7
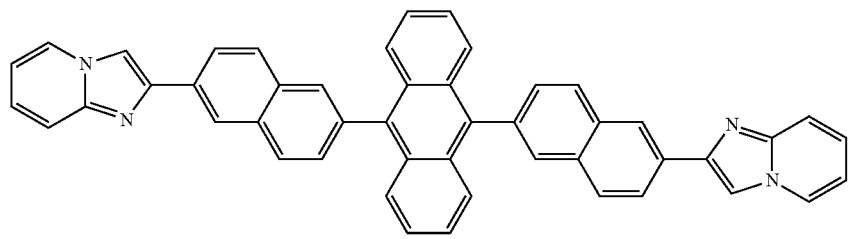
ETL-B8
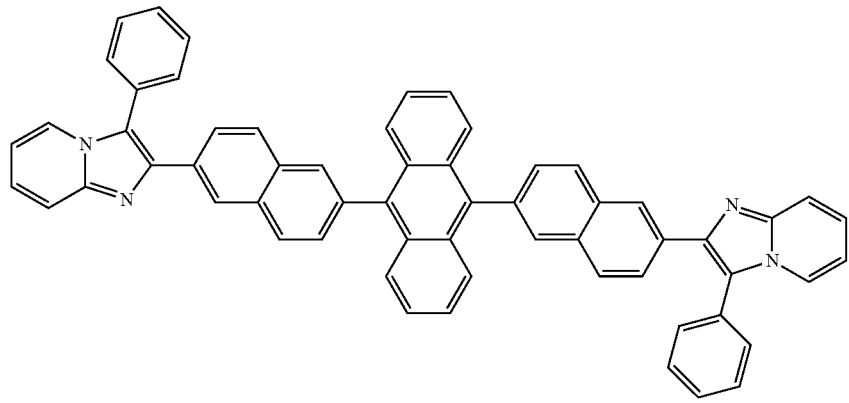
ETL-B9
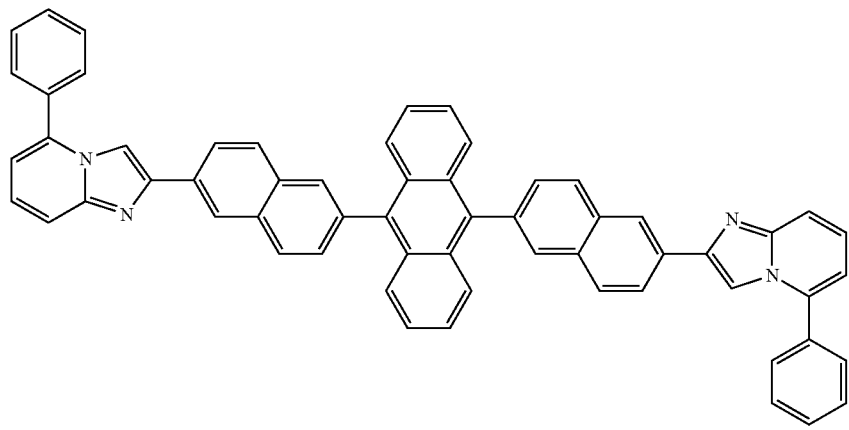
ETL-B10
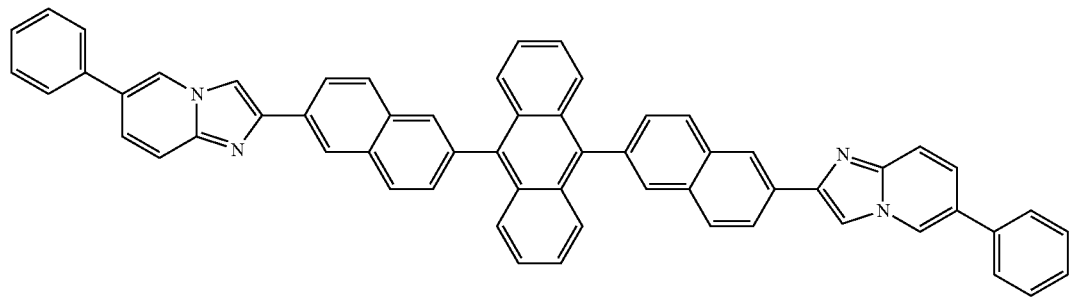
ETL-B11
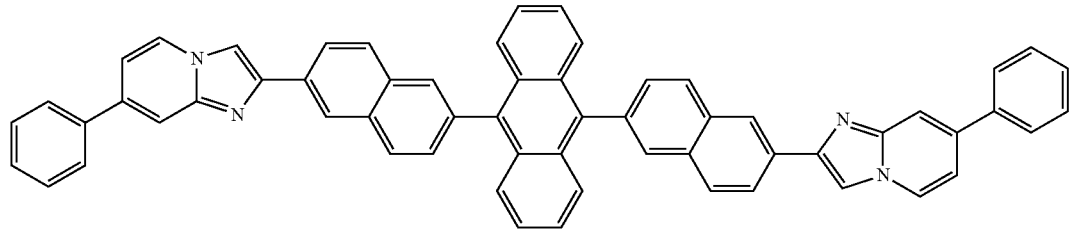

-continued
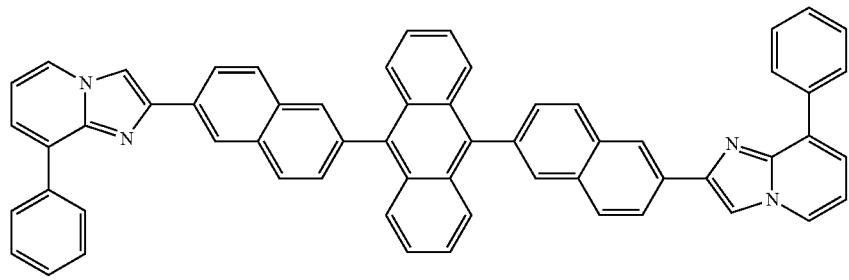
ETL-B12
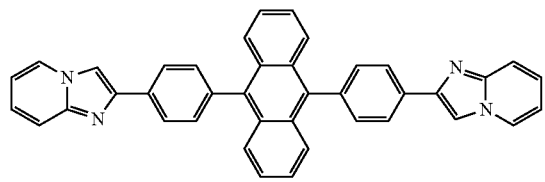
ETL-C1
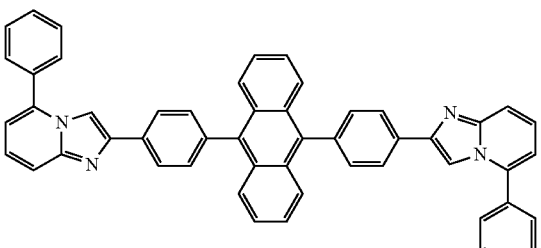
ETL-C2
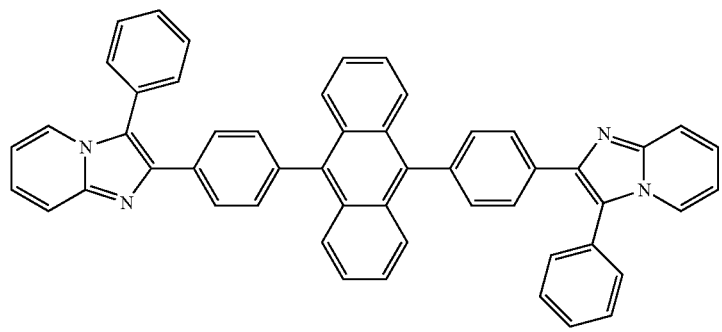
ETL-C3
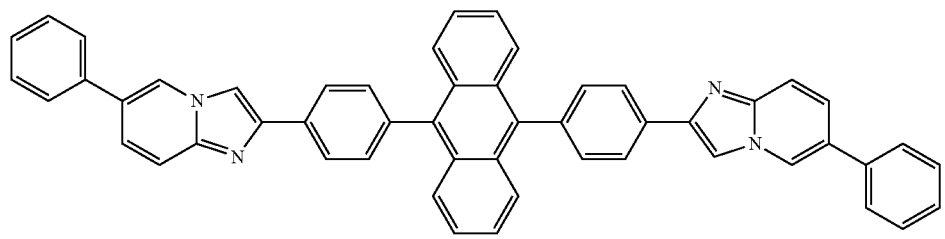
ETL-C4
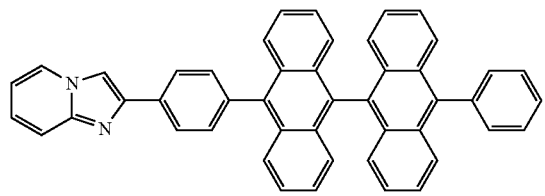
ETL-C5
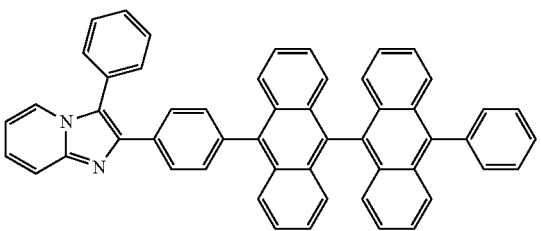
ETL-C6
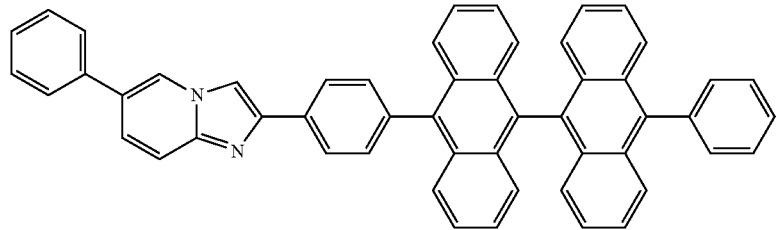
ETL-C7

-continued
ETL-C8
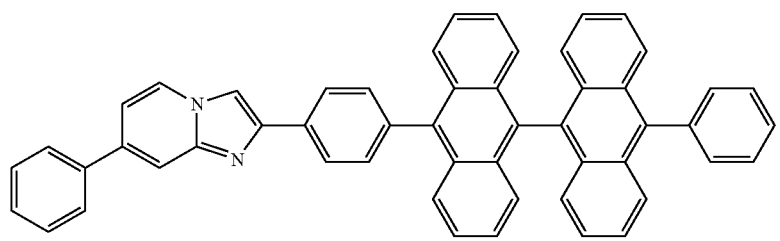
ETL-C9
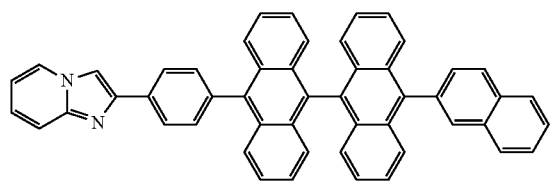
ETL-C10
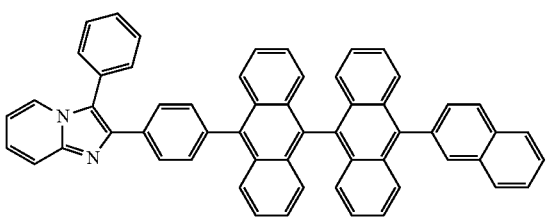
ETL-C11
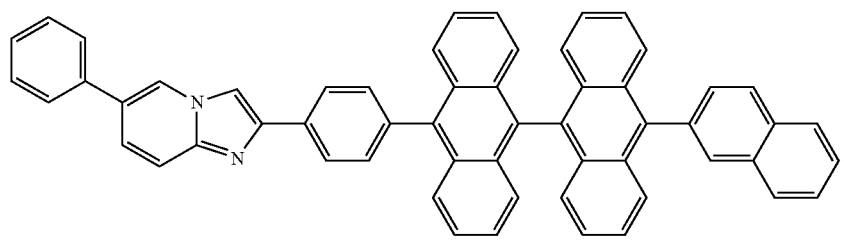
ETL-C12
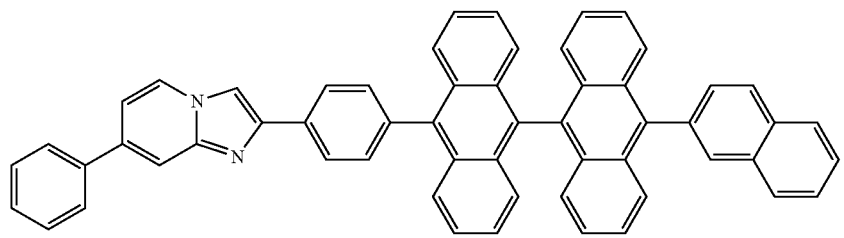
ETL-C13
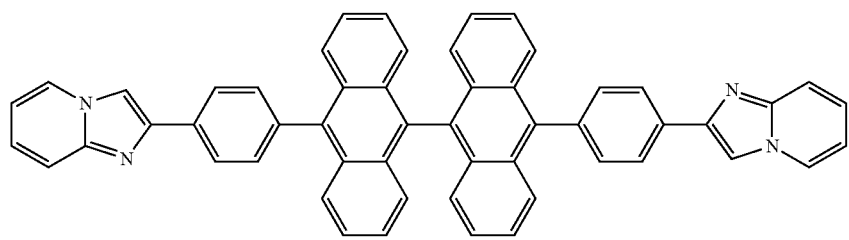
ETL-C14
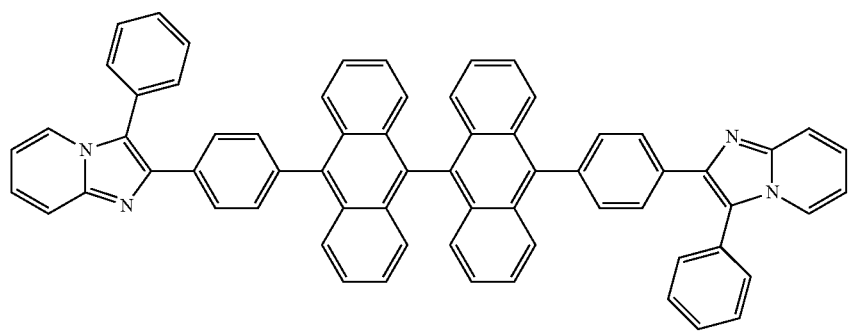

-continued
ETL-C15
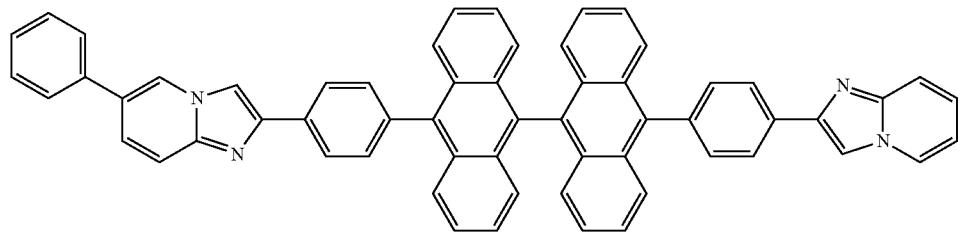
ETL-C16
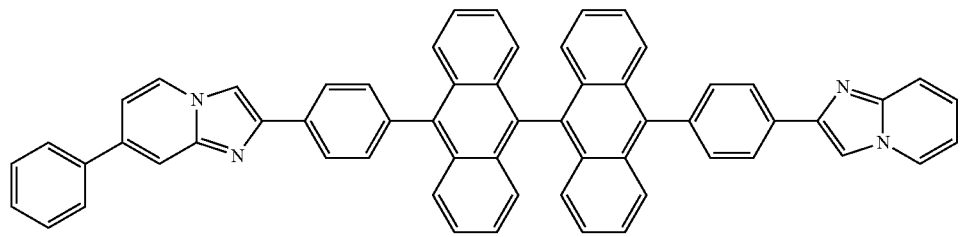
ETL-C17
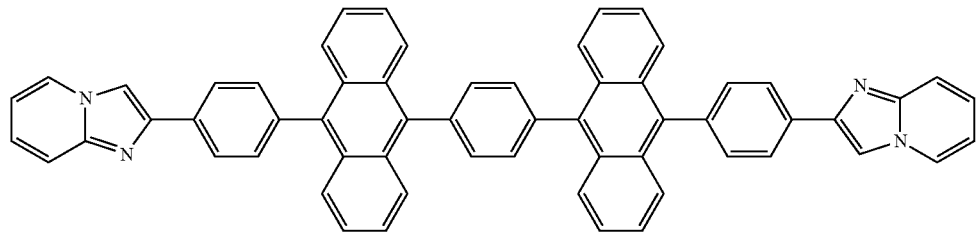
ETL-C18
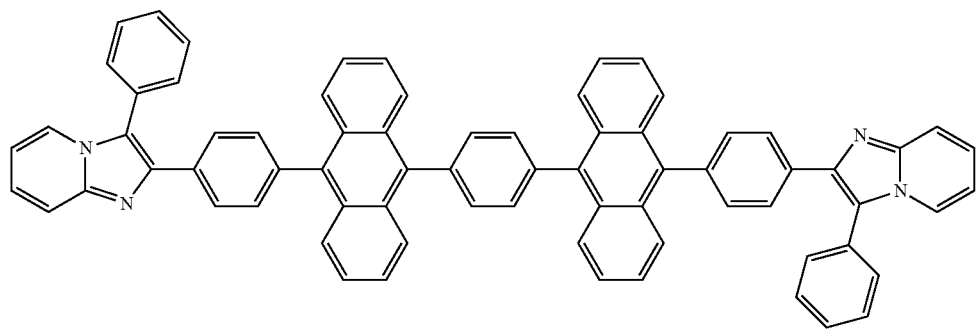
ETL-C19
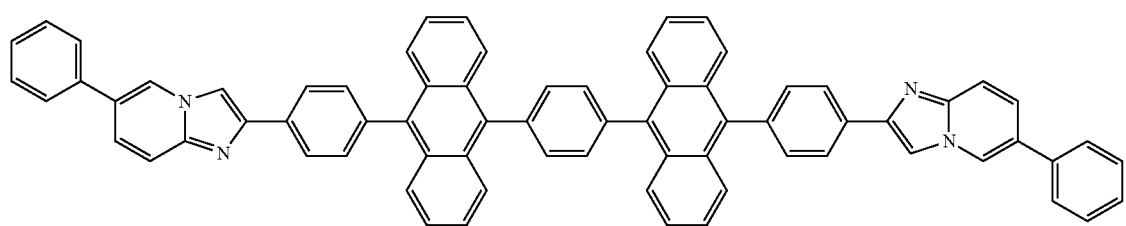
ETL-C20
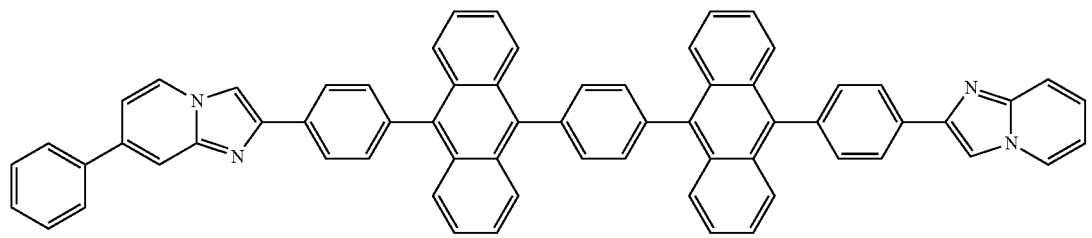

The above azaindolizine compound has an excellent electron transporting property and an electron injection property. Therefore, it is possible to improve the light emitting efficiency of the light emitting element 1.

The fact that the electron transporting property and electron injection property of the above azaindolizine compound are excellent is considered to be for the following reasons.

Since the entire molecule of the azaindolizine based compound having an azaindolizine skeleton and an anthracene skeleton in the molecule as described above is connected by the π-conjugated system, the electron cloud is spread over the entire molecule.

Thus, a portion of the azaindolizine skeleton of the above azaindolizine based compound has a function of receiving electrons and a function of sending out the received electrons to the portion of the anthracene skeleton. On the other hand, a portion of the anthracene skeleton of the above azaindolizine based compound has a function of receiving electrons from the portion of the azaindolizine skeleton and a function of delivering the received electrons to the layer adjacent to the anode 3 side of the electron transporting layer 9, that is, the green light emitting layer 7G.

Specifically, a portion of the azaindolizine skeleton of the above azaindolizine based compound has two nitrogen atoms, of which one (side near the portion of the anthracene skeleton) nitrogen atom has an sp2 hybrid orbital and the other (side far from the portion of the anthracene skeleton) has an sp3 hybrid orbital. The nitrogen atom having the sp2 hybrid orbital configures a part of a conjugated system of a molecule of the azaindolizine based compound, and, along with this, functions as a portion receiving electrons since the electronegativity is higher than a carbon atom and the electron attraction force is strong. Meanwhile, the nitrogen atom having the sp3 hybrid orbital is not a normal conjugated system; however, since it has an unshared electron pair, it has a function as a portion in which the electrons are sent out toward the conjugated system of the molecule of the azaindolizine based compound.

On the other hand, since the portion of the anthracene skeleton of the above azaindolizine based compound is electrically neutral, it is possible to easily receive electrons from the portion of the azaindolizine skeleton. In addition, since the portion of the anthracene skeleton of the above azaindolizine based compound has a large overlap between the constituent material of the green light emitting layer 7G, in particular, the host material (acene based material), and the orbit, it is possible to easily deliver electrons to the host material of the green light emitting layer 7G.

In addition, since the above azaindolizine based compound has an excellent electron transporting property and an electron injecting property as described above, as a result, it is possible to lower the voltage of the driving voltage of the light emitting element 1.

In addition, in the portion of the azaindolizine skeleton, the nitrogen atom having an sp2 hybrid orbital is stable even when reduced, and the nitrogen atom having an sp3 hybrid orbital is stable even when oxidized. Therefore, the above azaindolizine based compound has high stability with respect to the electrons and the holes. As a result, it is possible to achieve a lengthening of the life span of the light emitting element 1.

In addition, in a case where two or more types from among the electron transporting material described above are used in combination, the electron transporting layer 9 may be configured by a mixed material mixing two or more types of electron transporting material, and may be configured by laminating a plurality of layers configured by different electron transporting materials.

The average thickness of the electron transporting layer 9 is not particularly limited; however, approximately 1.0 to 200 nm is preferable and 10 to 100 nm is more preferable.

Electron Injection Layer

The electron injection layer 10 has a function of improving the electron injection efficiency from the cathode 11.

Examples of the constituent material (electron injection material) of the electron injection layer 10 include, for example, various types of inorganic insulating material and various types of inorganic semiconductor material.

Examples of the above inorganic insulating material include alkali metal chalcogenides (oxides, sulfides, selenides, tellurides), alkaline earth metal chalcogenides, alkali metal halides and alkaline earth metal halides, and the like, and it is possible to use one type or a combination of two or more types from the above. By configuring the electron injection layer 10 with the above as the main material, it is possible to further improve the electron injection property. In particular, alkali metal compounds (alkali metal chalcogenides, alkali metal halides, and the like) have an extremely small work function, and, by using these to configure the electron injection layer 10, the light emitting element 1 is able to obtain a high brightness.

Examples of the alkali metal chalcogenides include $Li_2O$, LiO, $Na_2S$, $Na_2Se$, NaO and the like.

Examples of the alkaline earth metal chalcogenides include CaO, BaO, SrO, BeO, BaS, MgO, CaSe, and the like.

Examples of the alkali metal halides include CsF, LiF, NaF, KF, LiCl, KCl, NaCl, and the like.

Examples of the alkaline earth metal halides include $CaF_2$, $BaF_2$, $SrF_2$, $MgF_2$, $BeF_2$, and the like. Examples of the inorganic semiconductor material include oxides including at least one element from among Li, Na, Ba, Ca, Sr, Yb, Al, Ga, In, Cd, Mg, Si, Ta, Sb, and Zn; nitrides or oxynitrides; and the like, and it is possible to use one type or a combination of two or more types from the above.

The average thickness of the electron injection layer 10 is not particularly limited; however, approximately 0.1 to 1000 nm is preferable, approximately 0.2 to 100 nm is more preferable, and approximately 0.2 to 50 nm is even more preferable.

Here, the electron injection layer 10 may be omitted depending on the constituent materials, thicknesses, and the like of the cathode 11 and the electron transporting layer 9.

Sealing Member

The sealing member 12 is provided so as to cover the anode 3, the laminate body 14, and the cathode 11, and has a function of hermetically sealing the above and blocking oxygen and moisture. By providing the sealing member 12, it is possible to obtain an improvement in the reliability of the light emitting element 1 and effects such as preventing alteration or degradation (improving the durability) thereof.

Examples of the constituent material of the sealing member 12 may include Al, Au, Cr, Nb, Ta, or Ti, or an alloy including the above, silicon oxide, various types of resin materials, and the like. Here, in a case of using material having conductivity as a constituent material of the sealing member 12, in order to prevent a short circuit, it is preferable to provide an insulating film as necessary between the sealing member 12 and the anode 3, and the laminate body 14 and the cathode 11. In addition, the sealing member 12 is made to correspond to the substrate 2 as a flat plate shape and may be sealed with sealing material such as thermosetting resin, for example, therebetween.

According to the light emitting element 1 configured as described above, by providing the carrier trapping layer 6, it is possible to suppress or prevent the injection of electrons into the hole transporting layer 5 and the hole injection layer 4 positioned at the anode 3 side relative to the carrier trapping layer 6, and it is possible to accurately suppress or prevent alteration or degradation of the constituent materials of the above layers 4 and 5, whereby it is possible to attempt to lengthen the life span of the light emitting element 1. Furthermore, since the carrier trapping layer 6 contains the thiaazole based compound represented by the above-described formula (1) as the trapping material, infrared light in a near infrared region which the human eye is not capable of recognizing is emitted as luminescent light, whereby the luminescent light to be recognized is white light emitted from the three layers of the red light emitting layer 7R, the blue light emitting layer 7B, and the green light emitting layer 7G. Accordingly, in a case of use as a white device, since there is no need to provide a color filter for extracting the desired luminescent light in the light emitting device, it is possible to reliably prevent the device configuration from becoming complicated and the number of processes during the manufacturing of the light emitting device from increasing.

It is possible to manufacture the above light emitting element 1 in the following manner, for example.

[1] First, the substrate 2 is prepared, and the anode 3 is formed on the substrate 2.

It is possible to form the anode 3, for example, using chemical vapor deposition (CVD) such as thermal CVD, and plasma CVD, dry plating methods such as vacuum deposition, wet plating methods such as electrolytic plating, thermal spraying coating methods, sol-gel methods, MOD methods, metal foil bonding, or the like.

[2] Next, the hole injection layer 4 is formed on the anode 3.

For example, the hole injection layer 4 is preferably formed by a vapor phase process using a dry plating method such as a CVD method, vacuum deposition, sputtering, or the like.

Here, for example, it is possible to form the hole injection layer 4 by supplying material for forming the hole injection layer, in which a hole injection material is dissolved in a solvent or dispersed in a dispersion medium, onto the anode 3 and then performing drying (solvent removal or dispersion medium removal).

As the supply method of the material for forming the hole injection layer, it is possible to use, for example, various types of coating method such as a spin coating method, a roll coating method, and an ink jet printing method. By using the above coating methods, it is possible to form the hole injection layer 4 comparatively easily.

Examples of the solvent or dispersion medium used in the preparation of the material for forming the hole injection layer include various types of inorganic solvents, various types of organic solvents, mixed solvents including the above, or the like. Here, for example, it is possible to perform the drying by leaving to stand at atmospheric pressure or in a reduced pressure atmosphere, by a heating process, by the spraying of inert gas, or the like.

In addition, prior to this step, oxygen plasma treatment may be performed upon the upper surface of the anode 3. In this manner, it is possible to impart a lyophilic property to the upper surface of the anode 3, remove (wash) organic matter attached to the upper surface of the anode 3, and adjust the work function in the vicinity of the upper surface of the anode 3. Here, as the conditions of the oxygen plasma treatment, for example, it is preferable to set a plasma power of approximately 100 to 800 W, an oxygen gas flow rate of approximately 50 to 100 mL/min, a transport speed of the member to be treated (anode 3) of approximately 0.5 to 10 mm/sec, and a temperature of the substrate 2 of approximately 70 to 90° C.

[3] Next, the hole transporting layer 5 is formed on the hole injection layer 4.

For example, the hole transporting layer 5 is preferably formed by a vapor phase process using a dry plating method such as a CVD method, vacuum deposition, sputtering, or the like.

Here, for example, it is possible to perform the forming by supplying material for forming the hole transporting layer, in which a hole transporting material is dissolved in a solvent or dispersed in a dispersion medium, onto the hole injection layer 4 and then performing drying (solvent removal or dispersion medium removal).

[4] Next, the carrier trapping layer 6 is formed on the hole transporting layer 5.

It is possible to form the carrier trapping layer 6 by a vapor phase process using a dry plating method such as vacuum deposition, for example.

[5] Next, the red light emitting layer 7R is formed on the carrier trapping layer 6.

It is possible to form the red light emitting layer 7R, for example, by a vapor phase process using a dry plating method such as a CVD method, vacuum deposition, sputtering, or the like.

[6] Next, the intermediate layer 8 is formed on the red light emitting layer 7R.

It is possible to form the intermediate layer 8, for example, by a vapor phase process using a dry plating method such as a CVD method, vacuum deposition, sputtering, or the like.

In addition, it is possible to form the intermediate layer 8 by supplying material for forming the intermediate layer, in which the constituent material thereof is dissolved in a solvent or dispersed in a dispersion medium, onto the red light emitting layer 7R and then performing drying (solvent removal or dispersion medium removal).

[7] Next, a blue light emitting layer 7B is formed on the intermediate layer 8.

It is possible to form the blue light emitting layer 7B, for example, by a vapor phase process using a CVD method, vacuum deposition, a dry plating method such as sputtering, or the like.

[8] Next, the green light emitting layer 7G is formed on the blue light emitting layer 7B.

It is possible to form the green light emitting layer 7G, for example, by a vapor phase process using a CVD method, vacuum deposition, a dry plating method such as sputtering, or the like.

[9] Next, the electron transporting layer 9 is formed on the green light emitting layer 7G.

It is possible to form the electron transporting layer 9, for example, by a vapor phase process using a CVD method, vacuum deposition, a dry plating method such as sputtering, or the like.

In addition, it is possible to form the electron transporting layer 9 by supplying material for forming the electron transporting layer, in which electron transporting material is dissolved in a solvent or dispersed in a dispersion medium, onto the green light emitting layer 7G and then performing drying (solvent removal or dispersion medium removal).

[10] Next, the electron injection layer 10 is formed on the electron transporting layer 9.

In a case where inorganic material is used as the constituent material of the electron injection layer 10, it is possible to form the electron injection layer 10, for example, by using a vapor phase process using a CVD method, vacuum deposition, a dry plating method such as sputtering, or the like, coating and firing ink having inorganic fine particles, or the like.

[11] Next, the cathode 11 is formed on the electron injection layer 10.

It is possible to form the cathode 11, for example, using a vacuum deposition method, a sputtering method, metal foil bonding, coating and firing ink having metal fine particles, or the like.

Through the steps described above, it is possible to obtain the light emitting element 1.

Finally, the sealing member 12 is used as a cover so as to cover the obtained light emitting element 1 and bonded to the substrate 2.

Second Embodiment

Figure 2:
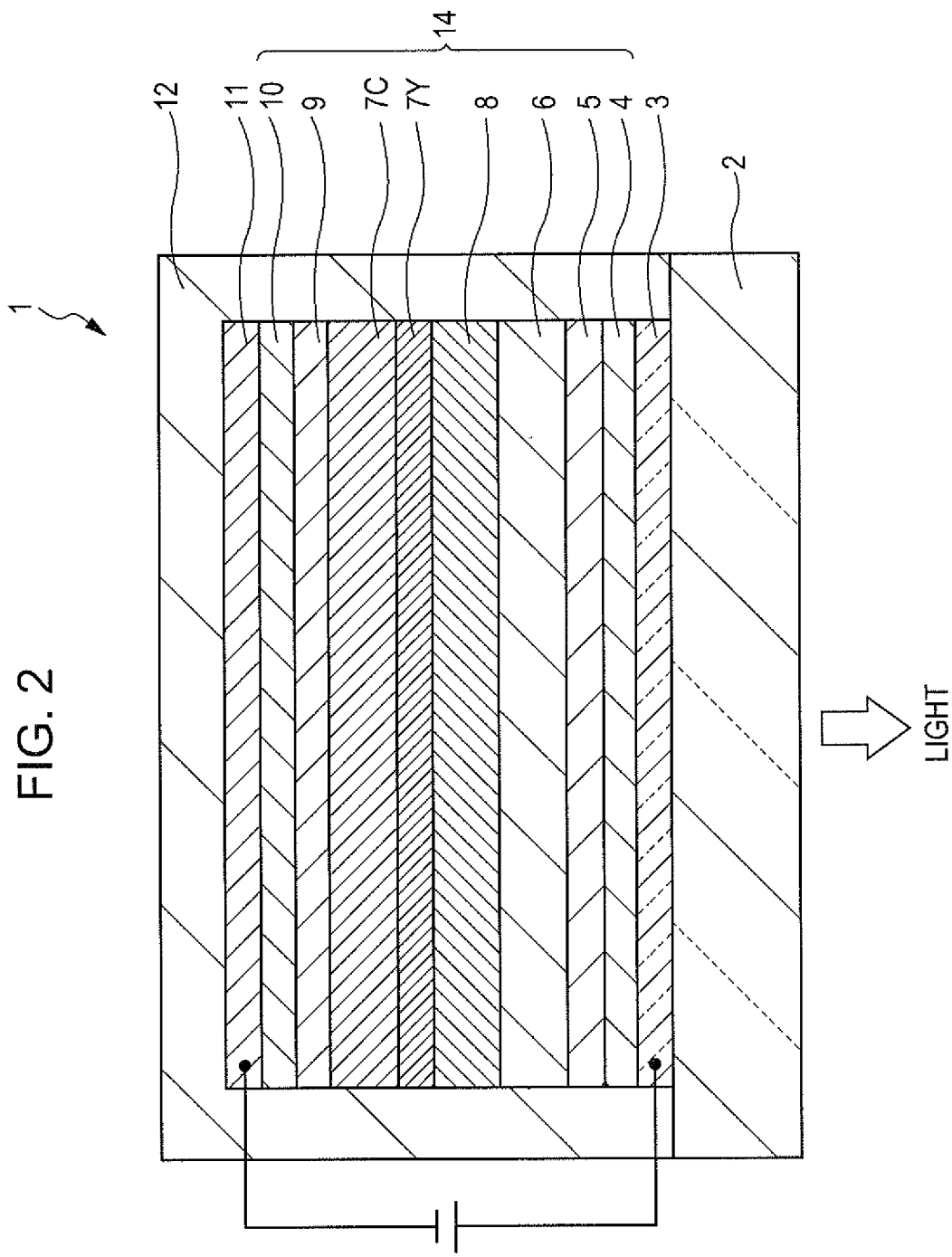
FIG. 2 is a view schematically showing a longitudinal section in a second embodiment of the light emitting element according to an aspect of the invention.

FIG. 2 is a cross-sectional view schematically showing the second embodiment of the light emitting element according to an aspect of the invention.

Below, description will be given of the light emitting element of the second embodiment centering on the differences with the above-described first embodiment, and description of similar matters will be omitted.

Apart from the fact that the light emitting element 1 of the second embodiment omits the forming of the red light emitting layer 7R, the blue light emitting layer 7B, and the green light emitting layer 7G as light emitting layers emitting visible light, and forms a yellow light emitting layer 7Y, and a cyan light emitting layer 7C, the light emitting element is the same as the light emitting element of the first embodiment.

That is, in the light emitting element 1 shown in FIG. 2, an anode 3, a hole injection layer 4, a hole transporting layer 5, a carrier trapping layer 6, an intermediate layer 8, a yellow light emitting layer 7Y, a cyan light emitting layer 7C, an electron transporting layer 9, an electron injection layer 10, and a cathode 11 are laminated in this order. In other words, in the light emitting element 1, between the anode 3 and the cathode 11, from the anode 3 side to the cathode 11 side, a laminate body 14, in which the hole injection layer 4, the hole transporting layer 5, the carrier trapping layer 6, the intermediate layer 8, the yellow light emitting layer 7Y, the cyan light emitting layer 7C, the electron transporting layer 9, and the electron injection layer 10 are laminated in this order, is interposed.

Thus, the entirety of the light emitting element 1 is provided on the substrate 2 and is also sealed with a sealing member 12.

In the above light emitting element 1, with respect to each light emitting layer of the yellow light emitting layer 7Y and the cyan light emitting layer 7C, electrons are supplied (injected) from the cathode 11 side and, along with this, holes are supplied (injected) from the anode 3 side. Thus, in each light emitting layer, the holes and the electrons are recombined, excitons are generated by the energy released during the recombination, and energy (fluorescence and phosphorescence) is released when the excitons return to the ground state. Therefore, the yellow light emitting layer 7Y and the cyan light emitting layer 7C respectively emit yellow and cyan visible light. In this manner, the light emitting element 1 of the present embodiment emits white visible light. Here, in the present embodiment, the visible light emitting layer 7 emitting visible light is configured by the two layers of the yellow light emitting layer 7Y and the cyan light emitting layer 7C.

In addition, in the present embodiment, the carrier trapping layer 6 is positioned on the anode 3 side relative to the visible light emitting layer 7 and is provided between the intermediate layer 8 and the hole transporting layer 5. In this manner, the electrons coming through the intermediate layer 8 are injected into the hole transporting layer 5, whereby it is possible to accurately suppress or prevent the alteration or degradation of the constituent material of the hole transporting layer 5 and the hole injection layer 4, and, as a result, it is possible to achieve a lengthening of the life span of the light emitting element 1.

In addition, as luminescent light, the carrier trapping layer 6 emits infrared light in a near infrared range which is not capable of being recognized by the human eye. Therefore, the luminescent light to be recognized is white light emitted from the two layers of the yellow light emitting layer 7Y and the cyan light emitting layer 7C. Therefore, in a case of use as a white device, since there is no need to provide a color filter for extracting the desired luminescent light in the light emitting element, it is possible to reliably prevent the device configuration from becoming complicated and the number of processes during the manufacturing of the light emitting element from increasing.

As in the present embodiment, the light emitting element according to an aspect of the invention is capable of being suitably applied to a configuration in which the visible light emitting layer 7 is configured of two layers and which is provided with yellow light emitting layer 7Y emitting a yellow luminescent color as visible light.

Yellow Light Emitting Layer

By conducting electricity between the anode 3 and the cathode 11, the yellow light emitting layer 7Y emits yellow light as luminescent light (visible light).

The above yellow light emitting layer 7Y is configured by including a yellow light emitting material emitting yellow light.

The above yellow light emitting material is not particularly limited, and various types of yellow fluorescent material and yellow phosphorescent material are capable of being used singly or in a combination of two types or more.

The yellow fluorescent material is not particularly limited as long as it generates yellow fluorescence, examples thereof include tetracene based compounds represented by the following chemical formula (26A) and tetraphenyl naphthacene (known as rubrene), and it is possible to use one type or a combination of two or more types from the above.

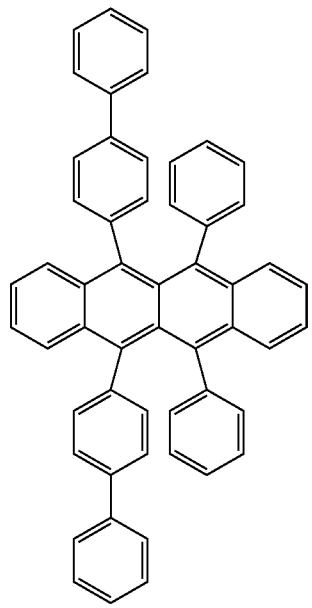

(26A)

In addition, yellow phosphorescent material is not particularly limited as long as it generates yellow phosphorescence, and examples thereof include tris(2-phenyl quinoline)iridium (III) represented by the following formula (26B), and the like.

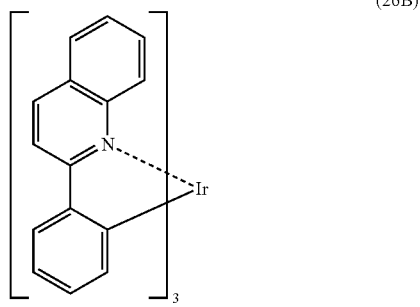

(26B)

Cyan Light Emitting Layer

By conducting electricity between the anode 3 and the cathode 11, the cyan light emitting layer 7C emits cyan light as luminescent light (visible light).

The above cyan light emitting layer 7C is configured by including a cyan light emitting material emitting cyan light.

The above cyan light emitting material is not particularly limited and it is possible to use various types of cyan fluorescent materials and cyan phosphorescent material singly or in a combination of two or more.

The cyan fluorescent material is not particularly limited as long as it generates cyan fluorescence, and examples thereof include styrylamine derivatives such as the styrylamine based compound shown by the chemical formula (24A), 4,4'-bis-diphenylaminodistilbene, and the like, and it is possible to use one type or a combination of two or more types from the above.

In addition, the cyan phosphorescent material is not particularly limited as long as it generates cyan phosphorescence, and examples thereof include bis(3,5-difluoro-2-(2-pyridyl)phenyl)-(2-carboxypyridyl) iridium (III), and the like represented by the following formula (27).

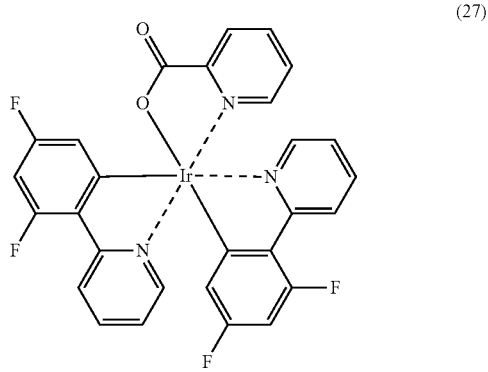

(27)

Furthermore, it is preferable that, in addition to the above-described yellow light emitting material and the cyan light emitting material, host materials in which the yellow light emitting material and the cyan light emitting material are set as guest materials be included in the yellow light emitting layer 7Y and the cyan light emitting layer 7C, respectively.

Here, as the host material, it is possible to use materials similar to those described as host materials included in the carrier trapping layer 6.

Third Embodiment

Figure 3:
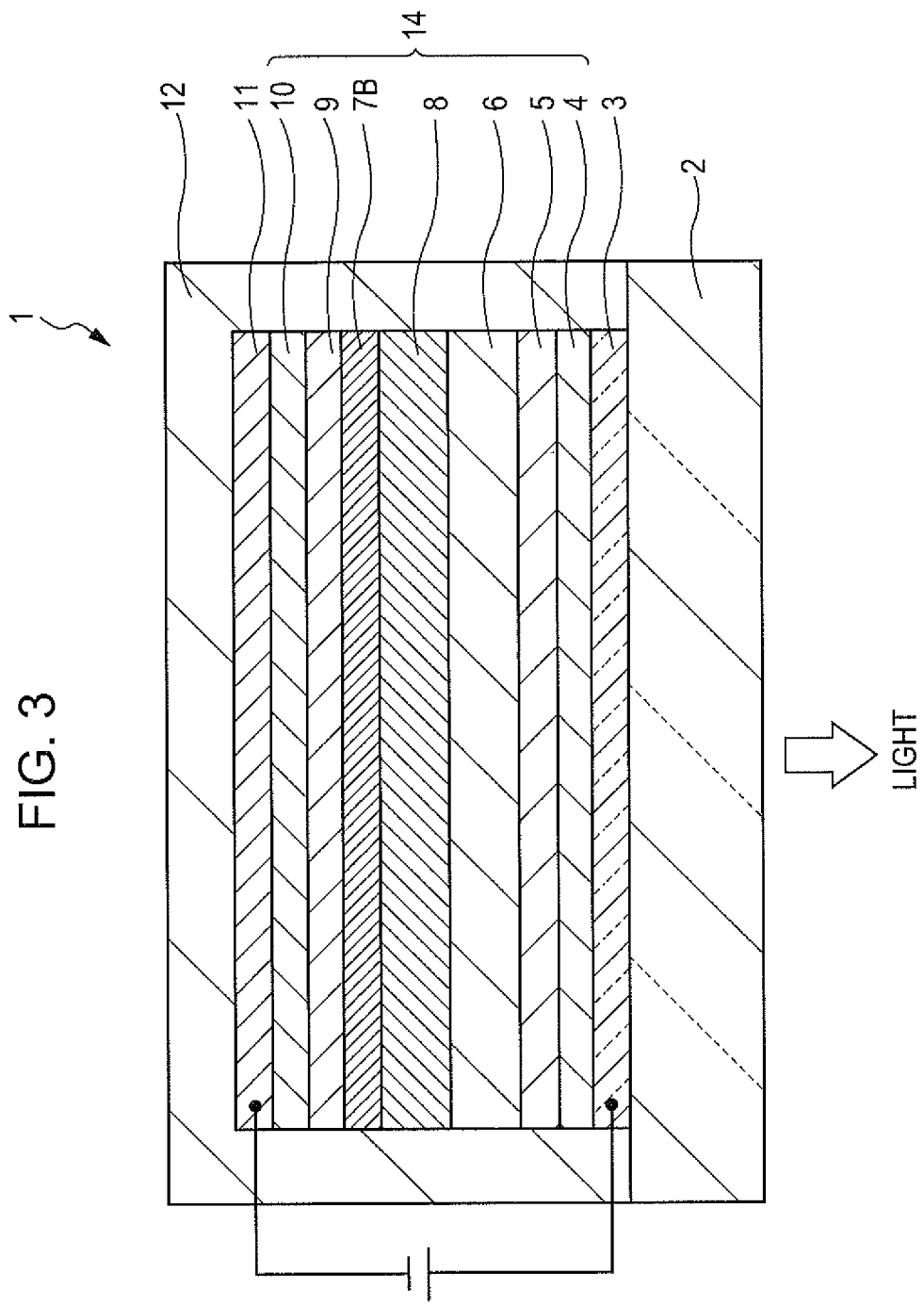
FIG. 3 is a view schematically showing a longitudinal section in a third embodiment of the light emitting element according to an aspect of the invention.

FIG. 3 is a cross-sectional view schematically showing the third embodiment of the light emitting element according to an aspect of the invention.

Below, description will be given of the light emitting element of the third embodiment centering on the differences with the above-described first embodiment, and description of similar matters will be omitted.

Apart from the fact that the light emitting element 1 of the third embodiment omits the forming of the red light emitting layer 7R, and the green light emitting layer 7G as light emitting layers emitting visible light, and forms an independent blue light emitting layer 7B, the light emitting element is the same as the light emitting element of the first embodiment.

That is, in the light emitting element 1 shown in FIG. 3, an anode 3, a hole injection layer 4, a hole transporting layer 5, a carrier trapping layer 6, an intermediate layer 8, a blue light emitting layer 7B, an electron transporting layer 9, an electron injection layer 10, and a cathode 11 are laminated in this order. In other words, in the light emitting element 1, between the anode 3 and the cathode 11, from the anode 3 side to the cathode 11 side, a laminate body 14, in which the hole injection layer 4, the hole transporting layer 5, the carrier trapping layer 6, the intermediate layer 8, the blue light emitting layer 7B, the electron transporting layer 9, and the electron injection layer 10 are laminated in this order, is interposed.

Thus, the entirety of the light emitting element 1 is provided on the substrate 2 and is also sealed with a sealing member 12.

In the above light emitting element 1, with respect to the blue light emitting layer 7B, electrons are supplied (injected) from the cathode 11 side and, along with this, holes are supplied (injected) from the anode 3 side. Thus, in the blue light emitting layer 7B, the holes and the electrons are recombined, excitons are generated by the energy released during the recombination, and energy (fluorescence and phosphorescence) is released when the excitons return to the ground state. Therefore, the blue light emitting layer 7B emits blue visible light. That is, the light emitting element 1 of the present embodiment emits blue visible light. Accordingly, in the present embodiment, the visible light emitting layer 7 emitting visible light is configured by the one layer of the blue light emitting layer 7B.

In addition, in the present embodiment, the carrier trapping layer 6 is positioned at the anode 3 side relative to the blue light emitting layer 7B and is provided between the intermediate layer 8 and the hole transporting layer 5. In this manner, the electrons (carrier) coming through the intermediate layer 8 are injected into the hole transporting layer 5, whereby it is possible to accurately suppress or prevent the alteration or degradation of the constituent material of the hole transporting layer 5 and the hole injection layer 4, and, as a result, it is possible to achieve a lengthening of the life span of the light emitting element 1.

In addition, as luminescent light, the carrier trapping layer 6 emits infrared light in a near infrared range which is not capable of being recognized by the human eye. Therefore, the luminescent light to be recognized is blue light emitted from the one layer of the blue light emitting layer 7B. Therefore, in comparison with the light emitting element configured by combining light emitting layers generating red light as in the past, since there is no need to provide a color filter for extracting the desired luminescent light in the light emitting element, it is possible to reliably prevent the element configuration from becoming complicated and the number of processes during the manufacturing of the light emitting element from increasing.

In addition, in the present embodiment, since the light emitting element 1 includes an intermediate layer 8 between the carrier trapping layer 6 and the blue light emitting layer 7B, it is possible to adjust the transfer of holes and electrons between the carrier trapping layer 6 and the blue light emitting layer 7B, whereby it is possible to prevent energy transfer of the excitons between the carrier trapping layer 6 and the blue light emitting layer 7B. As a result, the blue light emitting layer 7B emits light with good balance, and the light emitting element 1 emits blue light as visible light with greater reliability. In addition, the carrier coming through the intermediate layer 8 is trapped by the carrier trapping layer 6. Here, it is possible to obtain such an effect even more remarkably in a case where the blue light emitting layer 7B contains blue phosphorescent material as the light emitting material. That is, by preventing the energy transfer of the excitons between the carrier trapping layer 6 and the blue light emitting layer 7B, it is possible to reliably prevent deactivation of triplet excitons generated in the blue phosphorescent material.

Here, as in the present embodiment, in a case where the carrier trapping layer 6 is positioned at the anode 3 side relative to the blue light emitting layer 7B, by adopting a configuration using anthracene based material as the host material of the blue light emitting layer 7B and using at least one type from among anthracene based material and amine based material as the host material of the carrier trapping layer 6, it is possible to omit the forming of the intermediate layer 8 between the carrier trapping layer 6 and the blue light emitting layer 7B. By respectively configuring the carrier trapping layer 6 and the blue light emitting layer 7B with the above-described materials, it is possible to reduce the difference of the band gap between the carrier trapping layer 6 and the blue light emitting layer 7B. Therefore, even when the forming of the intermediate layer 8 is omitted, the voltage increase caused by the contact of the carrier trapping layer 6 and the blue light emitting layer 7B is reduced and it is possible to emit the blue light with good balance. That is, even if the carrier trapping layer 6 and the blue light emitting layer 7B are made to be adjacent, it is possible to emit the blue light with good balance, and it is possible to trap the carrier coming through the blue light emitting layer 7B in the carrier trapping layer 6.

In addition, as in the present embodiment, when the visible light emitting layer 7 is configured of one layer and the light emitting element 1 is provided with a light emitting layer emitting blue (short wavelength) luminescent light as in the blue light emitting layer 7B, by applying the light emitting element of the invention, it is possible to more reliably achieve a lengthening of the life span of the blue light emitting layer 7B which is a light emitting layer having a short life span. Therefore, when the light emitting element 1 is provided with a light emitting layer emitting blue luminescent light as in the blue light emitting layer 7B, the light emitting element according to an aspect of the invention may be suitably applied.

In addition, as in the present embodiment, in a case where the carrier trapping layer 6 is provided at the anode 3 side relative to the blue light emitting layer 7B, the intermediate layer 8 is preferably provided between the carrier trapping layer 6 and the blue light emitting layer 7B. In this manner, even in a case where one in which the LUMO (lowest unoccupied molecular orbital) relationship of the host material included in each layer is larger in the blue light emitting layer 7B is selected, since it is possible to accurately suppress or prevent the collection of the electrons in the blue light emitting layer 7B from being reduced, it is possible to cause the blue light emitting layer 7B to reliably emit blue light.

Fourth Embodiment

Figure 4:
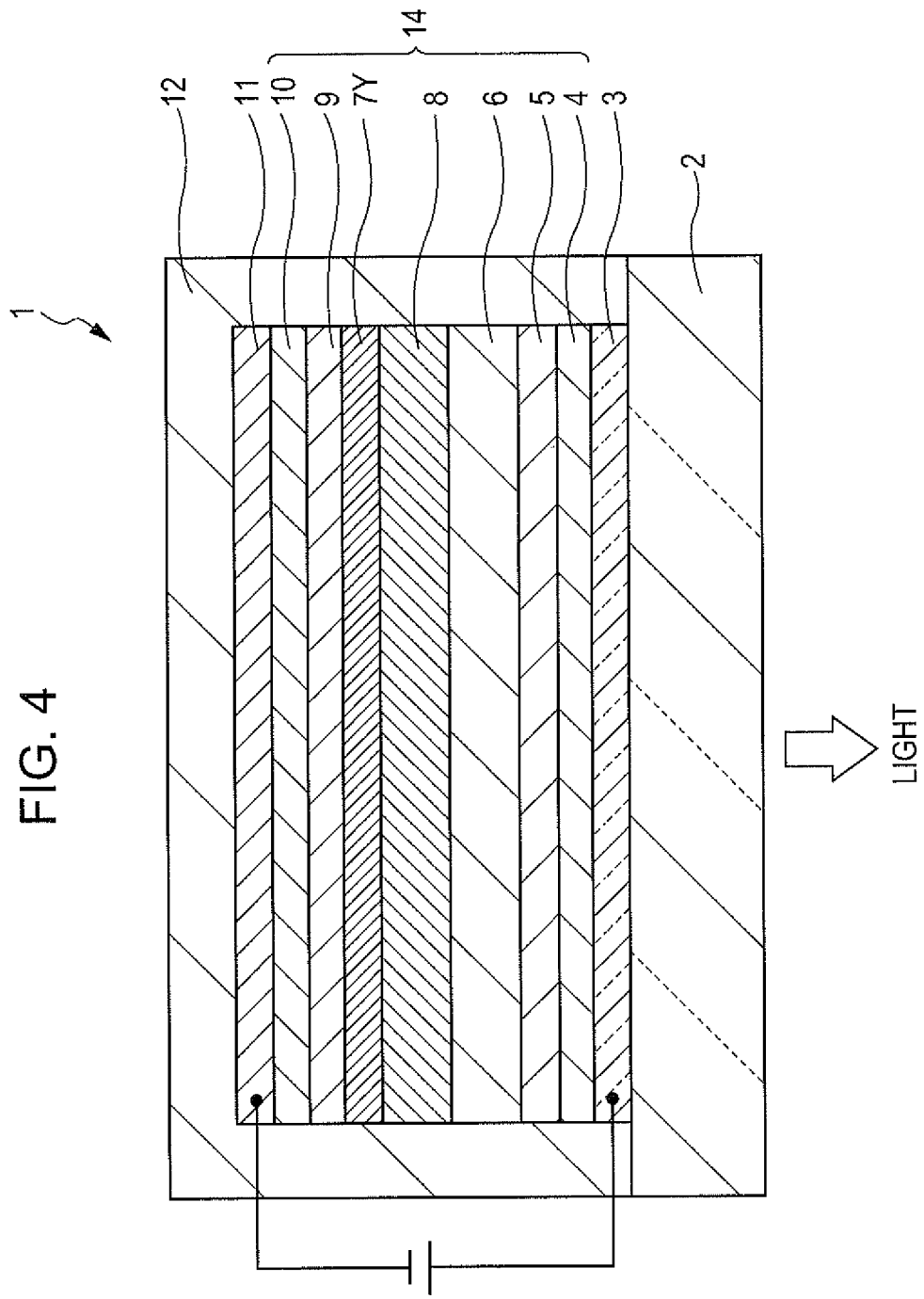
FIG. 4 is a view schematically showing a longitudinal section in a fourth embodiment of the light emitting element according to an aspect of the invention.

FIG. 4 is a cross-sectional view schematically showing a fourth embodiment of the light emitting element according to an aspect of the invention.

Below, description will be given of the light emitting element of the fourth embodiment centering on the differences with the above-described third embodiment, and description of similar matters will be omitted.

The light emitting element 1 of the fourth embodiment is the same as the light emitting element of the third embodiment other than the fact that, as the light emitting layer emitting visible light, a yellow light emitting layer 7Y is independently formed instead of the blue light emitting layer 7B.

That is, in the light emitting element 1 shown in FIG. 4, an anode 3, a hole injection layer 4, a hole transporting layer 5, a carrier trapping layer 6, an intermediate layer 8, a yellow light emitting layer 7Y, an electron transporting layer 9, an electron injection layer 10, and a cathode 11 are laminated in this order. In other words, in the light emitting element 1, between the anode 3 and the cathode 11, from the anode 3 side to the cathode 11 side, a laminate body 14, in which the hole injection layer 4, the hole transporting layer 5, the carrier trapping layer 6, the intermediate layer 8, the yellow light emitting layer 7Y, the electron transporting layer 9, and the electron injection layer 10 are laminated in this order, is interposed.

Thus, the entirety of the light emitting element 1 is provided on the substrate 2 and is also sealed with a sealing member 12.

In the above light emitting element 1, with respect to the yellow light emitting layer 7Y, electrons are supplied (injected) from the cathode 11 side and, along with this, holes are supplied (injected) from the anode 3 side. Thus, in the yellow light emitting layer 7Y, the holes and the electrons are recombined, excitons are generated by the energy released during the recombination, and energy (fluorescence and phosphorescence) is released when the excitons return to the ground state. Therefore, the yellow light emitting layer 7Y emits yellow visible light. That is, the light emitting element 1 of the present embodiment emits yellow visible light. Accordingly, in the present embodiment, the visible light emitting layer 7 emitting visible light is configured by the one layer of the yellow light emitting layer 7Y.

As in the present embodiment, when the visible light emitting layer 7 is configured of one layer and the light emitting element 1 is provided with a light emitting layer emitting yellow (short wavelength) luminescent light as in the yellow light emitting layer 7Y, by applying the light emitting element of the invention, it is possible to more reliably achieve a lengthening of the life span of the yellow light emitting layer 7Y which is a light emitting layer having a short life span. Therefore, when the light emitting element 1 is provided with a light emitting layer emitting yellow luminescent light as in the yellow light emitting layer 7Y, the light emitting element according to an aspect of the invention may be suitably applied.

Fifth Embodiment

Figure 5:
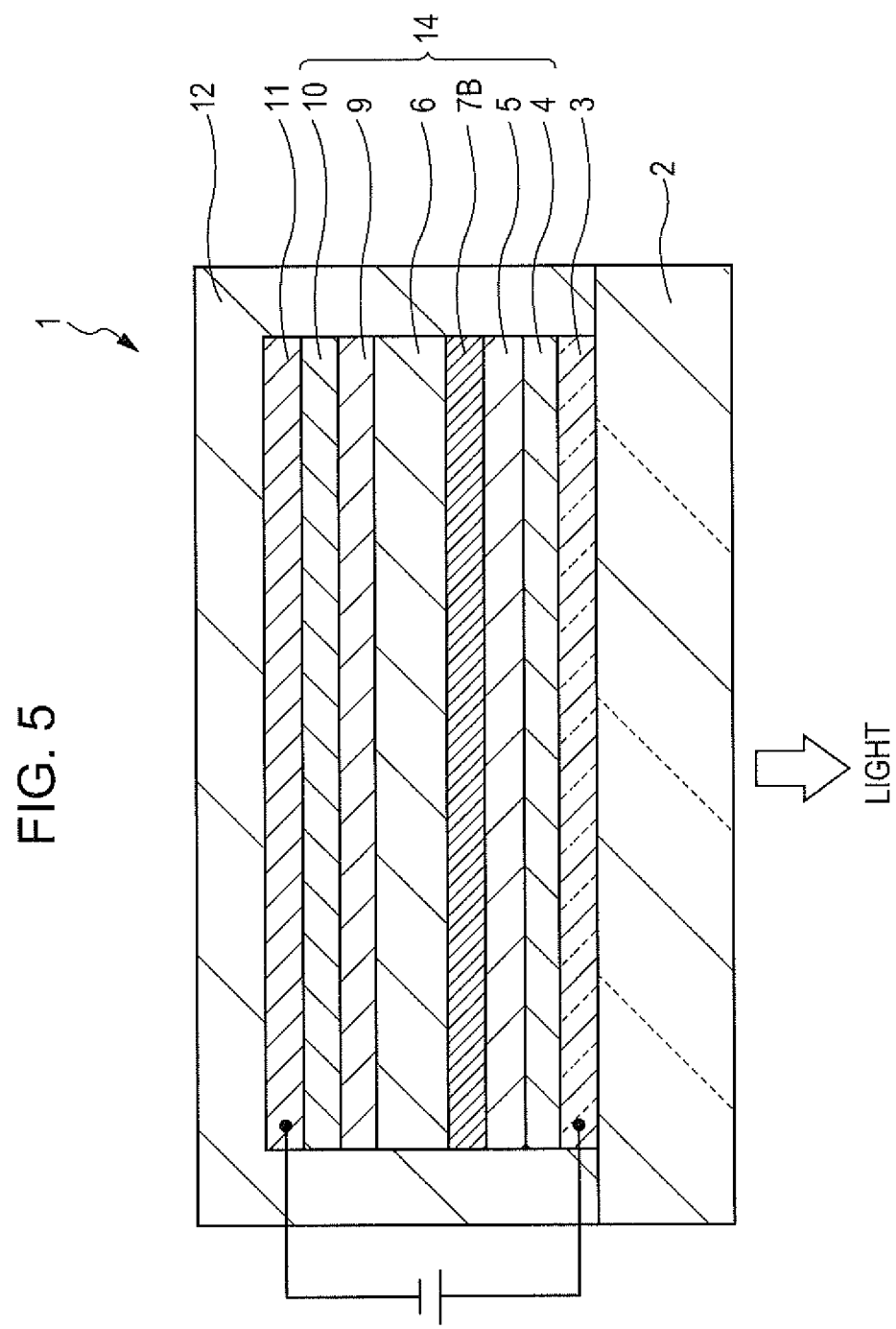
FIG. 5 is a view schematically showing a longitudinal section in a fifth embodiment of the light emitting element according to an aspect of the invention.

FIG. 5 is a cross-sectional view schematically showing a fifth embodiment of the light emitting element according to an aspect of the invention.

Below, description will be given of the light emitting element of the fifth embodiment centering on the differences with the above-described first embodiment, and description of similar matters will be omitted.

The light emitting element 1 of the fifth embodiment is the same as the light emitting element of the third embodiment other than the fact that the laminating position of the carrier trapping layer 6 is different and the forming of the intermediate layer 8 is omitted.

That is, in the light emitting element 1 shown in FIG. 5, an anode 3, a hole injection layer 4, a hole transporting layer 5, a blue light emitting layer 7B, a carrier trapping layer 6, an electron transporting layer 9, an electron injection layer 10, and a cathode 11 are laminated in this order. In other words, in the light emitting element 1, between the anode 3 and the cathode 11, from the anode 3 side to the cathode 11 side, a laminate body 14, in which the hole injection layer 4, the hole transporting layer 5, the blue light emitting layer 7B, the carrier trapping layer 6, the electron transporting layer 9, and the electron injection layer 10 are laminated in this order, is interposed.

Thus, the entirety of the light emitting element 1 is provided on the substrate 2 and is also sealed with a sealing member 12.

In the above light emitting element 1, similarly to the light emitting element 1 of the third embodiment, with respect to the blue light emitting layer 7B, electrons are supplied (injected) from the cathode 11 side and, along with this, holes are supplied (injected) from the anode 3 side. Thus, in the blue light emitting layer 7B, the holes and the electrons are recombined, excitons are generated by the energy released during the recombination, and energy (fluorescence and phosphorescence) is released when the excitons return to the ground state. Therefore, the blue light emitting layer 7B emits blue visible light. That is, the light emitting element 1 of the present embodiment emits blue visible light. Accordingly, in the present embodiment, the visible light emitting layer 7 emitting visible light is configured by the one layer of the blue light emitting layer 7B.

In addition, by conducting electricity between the anode 3 and the cathode 11, the carrier trapping layer 6 emits infrared light as luminescent light (visible light).

It is possible to configure the carrier trapping layer 6 in the same manner as the carrier trapping layer 6 provided in the light emitting element 1 of the above-described first embodiment; however, as in the present embodiment, in a case where the carrier trapping layer 6 is positioned at the cathode 11 side relative to the blue light emitting layer 7B, it is preferable to use an acene based material or a quinolinolate based metal complex as the host material included in the carrier trapping layer 6. Since the above materials are excellent in electron transportability and excellent in resistance to electrons and holes, it is possible to achieve a lengthening of the life span while providing the carrier trapping layer 6 with a function as an electron transporting layer.

Here, the quinolinolate based metal complex is not particularly limited; however, examples thereof include bis(2-methyl-8-quinolinolato)(p-phenyl phenolate)aluminium (BAlq), tris(8-quinolinolato)aluminium complex ($Alq_3$), or the like, and it is possible to use one type or a combination of two or more types from the above.

In addition, the carrier trapping layer 6 is provided so as to be positioned between the blue light emitting layer 7B and the electron transporting layer 9 at the cathode 11 side relative to the blue light emitting layer 7B. In this manner, holes (carrier) coming through the blue light emitting layer 7B are injected into the electron transporting layer 9 whereby it is possible to accurately suppress or prevent the alteration or degradation of the constituent material of the electron transporting layer 9 and the electron injection layer 10, and, as a result, it is possible to achieve a lengthening of the life span of the light emitting element 1.

In addition, as luminescent light, the carrier trapping layer 6 emits infrared light in a near infrared range which is not capable of being recognized by the human eye. Therefore, the luminescent light to be recognized is blue light emitted from the one layer of the blue light emitting layer 7B. Therefore, since there is no need to provide a color filter for extracting the desired luminescent light in the light emitting element as in the past, it is possible to reliably prevent the element configuration from becoming complicated and the number of processes during the manufacturing of the light emitting element from increasing.

In addition, in a case where an anthracene based material is used as the host material, as in the present embodiment, the application is more preferable in a case where the carrier trapping layer 6 is positioned at the cathode 11 side relative to the blue light emitting layer 7B. For example, in a case where the host of the blue light emitting layer 7B is an anthracene based compound, the light emitting efficiency is increased by providing a hole transporting layer or the like configured by an aryl amine based material at the anode 3 side, forming a collection of the carrier in the vicinity of the interface thereof, and causing the blue light emitting layer 7B to emit light. However, if a configuration is adopted in which a carrier trapping layer 6 configured by an anthracene based compound is further provided between the blue light emitting layer 7B and the hole transporting layer, it is easier to collect the carrier in the carrier trapping layer 6. For the above reason, the carrier trapping layer 6 is preferably arranged at the cathode 11 side relative to the blue light emitting layer 7B.

Sixth Embodiment

Figure 6:
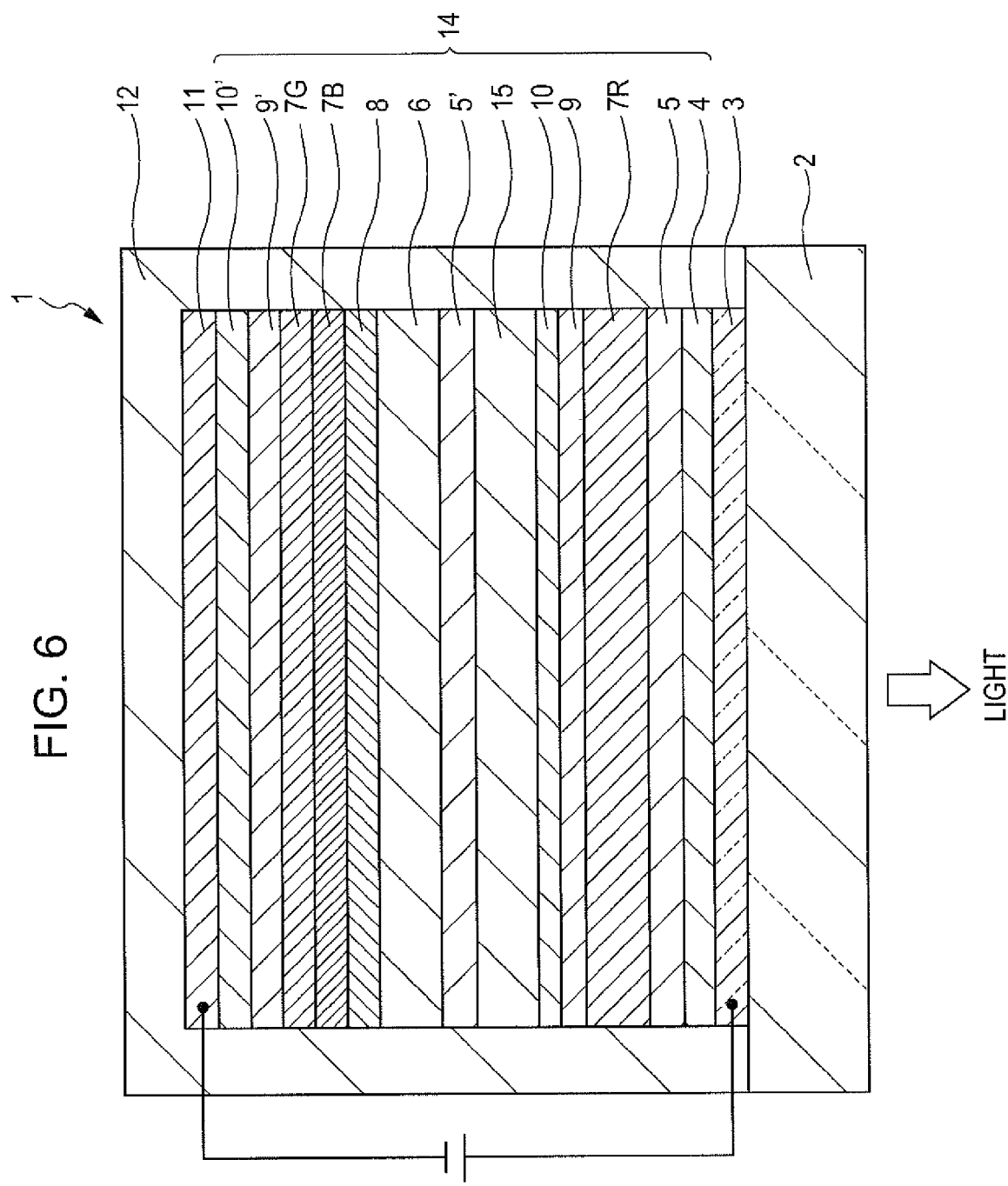
FIG. 6 is a view schematically showing a longitudinal section in a sixth embodiment of the light emitting element according to an aspect of the invention.

FIG. 6 is a cross-sectional view schematically showing a sixth embodiment of the light emitting element according to an aspect of the invention.

Below, description will be given of the light emitting element of the sixth embodiment centering on the differences with the above-described first embodiment, and description of similar matters will be omitted.

In the sixth embodiment, the layer configuration thereof is the same as that of the light emitting element of the first embodiment other than the fact that a light emitting element 1 provided with a carrier generating layer 15 is set to be applied.

That is, in the light emitting element 1 shown in FIG. 6, an anode 3, a hole injection layer 4, a hole transporting layer 5, a red light emitting layer 7R, an electron transporting layer 9, an electron injection layer 10, a carrier generating layer 15, a hole transporting layer 5', a carrier trapping layer 6, an intermediate layer 8, a blue light emitting layer 7B, a green light emitting layer 7G, an electron transporting layer 9', an electron injection layer 10', and a cathode 11 are laminated in this order. In other words, in the light emitting element 1, between the anode 3 and the cathode 11, from the anode 3 side to the cathode 11 side, a laminate body 14, in which the hole injection layer 4, the hole transporting layer 5, the red light emitting layer 7R, the electron transporting layer 9, the electron injection layer 10, the carrier generating layer 15, the hole transporting layer 5', the carrier trapping layer 6, the intermediate layer 8, the blue light emitting layer 7B, the green light emitting layer 7G, the electron transporting layer 9', and the electron injection layer 10', are laminated in this order, is interposed.

Thus, the entirety of the light emitting element 1 is provided on the substrate 2 and is also sealed with a sealing member 12.

In the above light emitting element 1, with respect to each layer of the red light emitting layer 7R, the blue light emitting layer 7B, and the green light emitting layer 7G, electrons are supplied (injected) from the cathode 11 side and, along with this, holes are supplied (injected) from the anode 3 side. Thus, in each light emitting layer, the holes and the electrons are recombined, excitons are generated by the energy released during the recombination, and energy (fluorescence and phosphorescence) is released when the excitons return to the ground state. Therefore, the red light emitting layer 7R, the blue light emitting layer 7B, and the green light emitting layer 7G respectively emit red, blue, and green visible light. In this manner, the light emitting element 1 of the present embodiment emits white visible light. Here, in the present embodiment, the visible light emitting layer 7 emitting visible light is configured by the three layers of the red light emitting layer 7R, the blue light emitting layer 7B, and the green light emitting layer 7G.

In addition, in the present embodiment, the carrier trapping layer 6 is positioned at the anode 3 side relative to the blue light emitting layer 7B and the green light emitting layer 7G and is provided between the intermediate layer 8 and the hole transporting layer 5'. In this manner, the electrons (carrier) coming through the intermediate layer 8 are injected into the hole transporting layer 5' side, whereby it is possible to accurately suppress or prevent the alteration or degradation of the constituent material of the hole transporting layer 5' and the carrier generating layer 15, and, as a result, it is possible to achieve a lengthening of the life span of the light emitting element 1.

In addition, as luminescent light, the carrier trapping layer 6 emits infrared light in a near infrared range which is not capable of being recognized by the human eye. Therefore, the luminescent light to be recognized is white light emitted from the three layers of the red light emitting layer 7R, the blue light emitting layer 7B, and the green light emitting layer 7G. Therefore, in a case of use as a white device, since there is no need to provide a color filter for extracting the desired luminescent light in the light emitting element, it is possible to reliably prevent the element configuration from becoming complicated and the number of processes during the manufacturing of the light emitting element from increasing.

In addition, in the light emitting element 1 of the present embodiment, since holes and electrons are generated in the carrier generating layer 15, and, among these, the electrons are injected into the red light emitting layer 7R and the holes are injected into the blue light emitting layer 7B and the green light emitting layer 7G, it is possible to cause the light emitting element 1 to emit light with a greater brightness, whereby it is possible to obtain a light emitting element 1 with excellent light emitting efficiency.

Carrier Generating Layer

The carrier generating layer 15 includes an organic cyan compound (below referred to as "an aromatic ring-containing organic cyan compound") having an aromatic ring.

The aromatic ring-containing organic cyan compound has an excellent electron attraction property. Therefore, the aromatic ring-containing organic cyan compound is capable of taking out electrons from the hole transporting material included in the hole transporting layer 5' in contact therewith. As a result, even if a voltage is not applied to the carrier generating layer 15, in the vicinity of the interface between the carrier generating layer 15 and the hole transporting layer 5', electrons are generated at the carrier generating layer 15 side and the holes are generated at the hole transporting layer 5' side. In such a state, when a driving voltage is applied between the anode 3 and the cathode 11, that is, a voltage is applied to the carrier generating layer 15, holes generated in the vicinity of the interface between the carrier generating layer 15 and the hole transporting layer 5' are transported by the driving voltage and contribute to the light emission of the blue light emitting layer 7B and the green light emitting layer 7G. In addition, the electrons generated in the vicinity of the interface between the carrier generating layer 15 and the hole transporting layer 5' are transported by the driving voltage and contribute to the light emission of the red light emitting layer 7R and the green light emitting layer 7G.

Thus, the generation of the holes and electrons in the carrier generating layer 15 is continuously performed while the driving voltage is applied and the above holes and electrons respectively contribute to the light emission of the blue light emitting layer 7B, the red light emitting layer 7R, and the green light emitting layer 7G.

In addition, since the aromatic ring-containing organic cyan compound is organic material, in comparison with a case where the carrier generating layer is configured of metal oxide, since it is possible to reliably prevent the metal oxide from contacting the hole transporting material (organic material) included in the hole transporting layer 5', the alteration or degradation of the hole transporting material may be prevented.

In addition, as well as being a comparatively stable compound, the aromatic ring-containing organic cyan compound is a compound capable of easily forming the carrier generating layer 15 using a vapor phase film formation method such as vapor deposition. For this reason, the invention is capable of being suitably used in the manufacturing of the light emitting element 1, whereby not only does the quality of the manufactured light emitting element 1 become more easily stabilized, but the yield of the light emitting element 1 also becomes high.

The above aromatic ring-containing organic cyan compound is not particularly limited; however, examples thereof include hexaazatriphenylene derivatives into which a cyano group has been introduced, in particular, the use of the hexaazatriphenylene derivatives as shown in the following chemical formula (40) is more preferable.

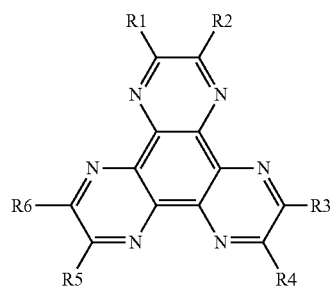

(40)

In the above-described chemical formula (40), R1 to R6 are each independently a cyano group (—CN), a sulfonic group (—SO$_2$R'), a sulfoxide group (—SOR'), a sulfonamide group (—SO$_2$NR'$_2$), a sulfonate group (—SO$_3$R'), a nitro group (—NO$_2$), or a trifluoromethane (—CF$_3$) group, and at least one substituent among R1 to R6 is a cyano group. In addition, R' is an amine group, an amide group, an ether group, or an alkyl group which is substituted with an ester group or unsubstituted and which has 1 to 60 carbon atoms, an aryl group, or a heterocyclic group.

Such compounds have an excellent function as an aromatic ring-containing organic cyan compound, that is, an electron attraction property, whereby it is possible to more reliably take out electrons from the adjacent hole transporting layer 5' and it is possible to more reliably transport the taken out electrons to the electron injection layer 10 (anode 3) side.

In addition, as the aromatic ring-containing organic cyan compound, it is more preferable that, in the compounds shown in chemical formula (40) as described above, R1 to R6 be all cyano groups. That is, as the aromatic ring-containing organic cyan compound, the use of hexacyanohexaazatriphenylene as shown in the following chemical formula (50) is preferable. By having a plurality of cyano groups having a high electron extracting property in this manner, the compound shown in the following formula (50) may exhibit the above-described functions more remarkably.

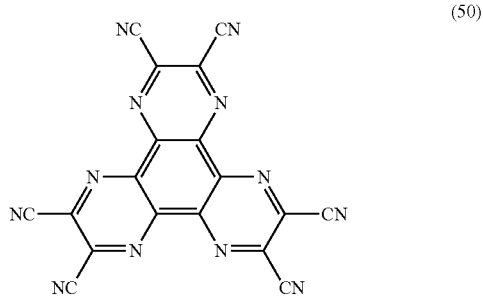 [SMILES: N#Cc1nc2c3nc(C#N)c(C#N)nc3c3nc(C#N)c(C#N)nc3c2nc1C#N]

(50)

In addition, the aromatic ring-containing organic cyan compound is preferably present in an amorphous state in the carrier generating layer 15. In this manner, it is possible to obtain a more remarkable effect of the aromatic ring-containing organic cyan compound described above. Here, by forming the carrier generating layer 15 using a vapor phase film formation method such as a vacuum deposition method, it is possible to set the aromatic ring-containing organic cyan compound to an amorphous state.

In addition, the average thickness of the carrier generating layer 15 is not particularly limited; however, approximately 5 nm or more to 40 nm or less is preferable, and approximately 10 nm or more to 30 nm or less is more preferable. In this manner, it is possible to reliably exhibit the functions of the carrier generating layer 15 while preventing the driving voltage of the light emitting element 1 from becoming high.

Here, as the constituent materials of the hole transporting layer 5', the electron transporting layer 9', and the electron injection layer 10', it is possible to use the examples given for the constituent materials of the hole transporting layer 5, the electron transporting layer 9, and the electron injection layer 10, and the constituent materials configuring each corresponding layer may be the same or different, respectively.

Seventh Embodiment

Figure 7:
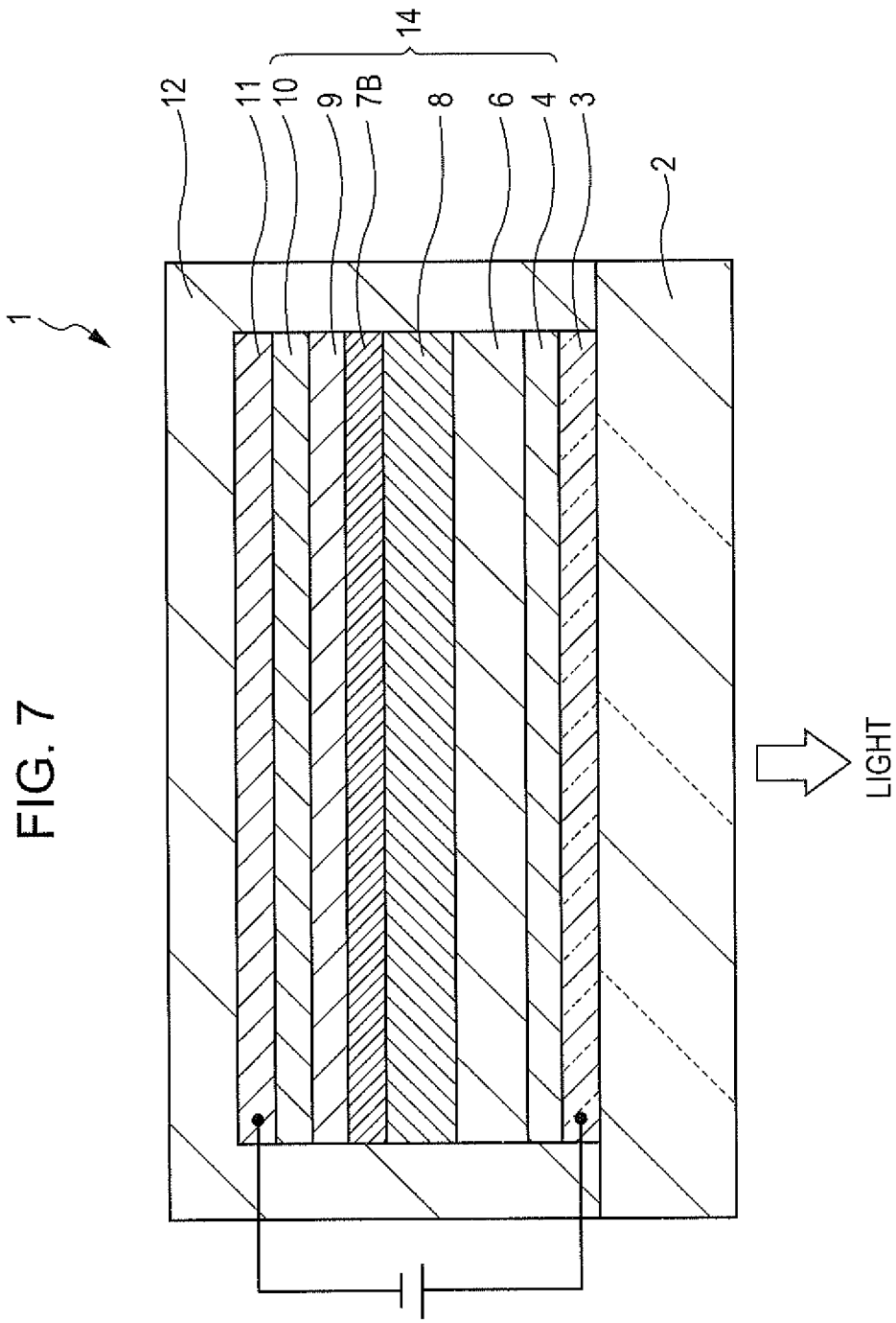
FIG. 7 is a view schematically showing a longitudinal section in a seventh embodiment of the light emitting element according to an aspect of the invention.

FIG. 7 is a cross-sectional view schematically showing a seventh embodiment of the light emitting element according to an aspect of the invention.

Below, description will be given of the light emitting element of the seventh embodiment centering on the differences with the above-described third embodiment, and description of similar matters will be omitted.

The light emitting element 1 of the seventh embodiment is the same as the light emitting element of the third embodiment other than the fact that the forming of the hole transporting layer 5 having a function of transporting holes is omitted and the carrier trapping layer 6 is made to have both a function as the hole transporting layer 5 and a function as the carrier trapping layer 6.

That is, in the light emitting element 1 shown in FIG. 7, an anode 3, a hole injection layer 4, a carrier trapping layer 6, an intermediate layer 8, a blue light emitting layer 7B, an electron transporting layer 9, an electron injection layer 10, and a cathode 11 are laminated in this order. In other words, in the light emitting element 1, between the anode 3 and the cathode 11, from the anode 3 side to the cathode 11 side, a laminate body 14, in which the hole injection layer 4, the carrier trapping layer 6, the intermediate layer 8, the blue light emitting layer 7B, the electron transporting layer 9, and the electron injection layer 10 are laminated in this order, is interposed.

Thus, the entirety of the light emitting element 1 is provided on the substrate 2 and is also sealed with a sealing member 12.

In the above light emitting element 1, with respect to the blue light emitting layer 7B, electrons are supplied (injected) from the cathode 11 side and, along with this, holes are supplied (injected) from the anode 3 side. Thus, in the blue light emitting layer 7B, the holes and the electrons are recombined, excitons are generated by the energy released during the recombination, and energy (fluorescence and phosphorescence) is released when the excitons return to the ground state. Therefore, the blue light emitting layer 7B emits blue visible light. That is, the light emitting element 1 of the present embodiment emits blue visible light. Accordingly, in the present embodiment, the visible light emitting layer 7 emitting visible light is configured by the one layer of the blue light emitting layer 7B.

In addition, it is possible to realize the configuring of the carrier trapping layer 6 to have both of the function as a hole transporting layer 5 and the function as a carrier trapping layer 6 by doping (adding) a thiazole based compound represented by the above-described formula (1) to the constituent material (hole transporting material) of the hole transporting layer 5, which was exemplified in the first embodiment. Furthermore, in such a case, as the hole transporting material, the use of an amine based material is particularly preferable. In this manner, it becomes possible to allow more remarkable exhibition of both functions.

Next, description will be given of a light emitting device (light emitting device according to an aspect of the invention) provided with the light emitting element according to an aspect of the invention described above.

Illumination Light Source

Figure 8:
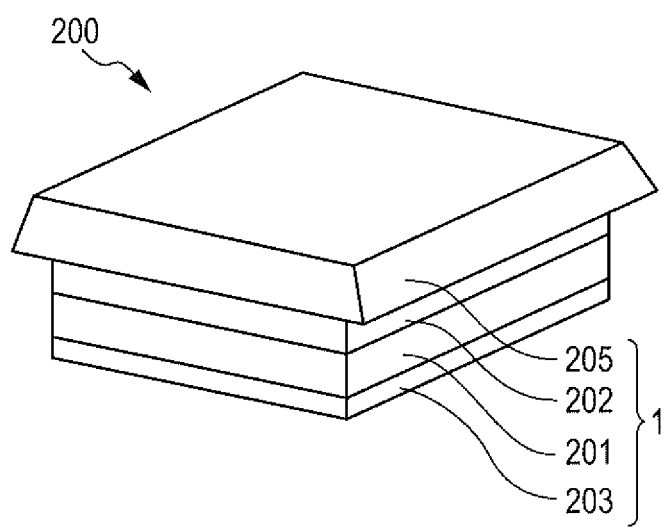
FIG. 8 is a view showing an embodiment of an illumination light source applying the light emitting device according to an aspect of the invention.

First, description will be given of a case where the light emitting device according to an aspect of the invention is applied to an illumination light source. FIG. 8A to 8B are views showing an embodiment of an illumination light source applying the light emitting device according to an aspect of the invention.

The illumination light source 200 shown in FIG. 8A to 8B is a light source used for illumination, in particular, illuminating the inside of a room.

The illumination light source 200 includes a transparent substrate 205 and a light emitting element 1.

The light emitting element 1 includes a transparent electrode 202, a counter electrode 203, and a laminate body 201, and, by applying an electric field between the transparent electrode 202 and the counter electrode 203, the light emitting layers provided in the laminate body 201 are made to emit light. Thus, for example, the inside of a room may be illuminated by luminescent light generated in the light emitting layer passing through the transparent substrate 205.

In the present embodiment, the light emitting element 1 provided in the illumination light source 200 emits infrared light of a near infrared region which is not capable of being recognized by the human eye and visible light.

Accordingly, by configuring the illumination light source 200 to be provided with the light emitting elements described in each embodiment as the light emitting element 1, it is possible to use the illumination light source 200 as a light source emitting various colors of luminescent light.

In addition, since the illumination light source 200 is provided with the light emitting element 1 having a long life span without changing the chromaticity, the reliability thereof is excellent.

Light Emitting Device

Next, description will be given of a case where the light emitting device according to an aspect of the invention is applied to a display apparatus.

Figure 9:
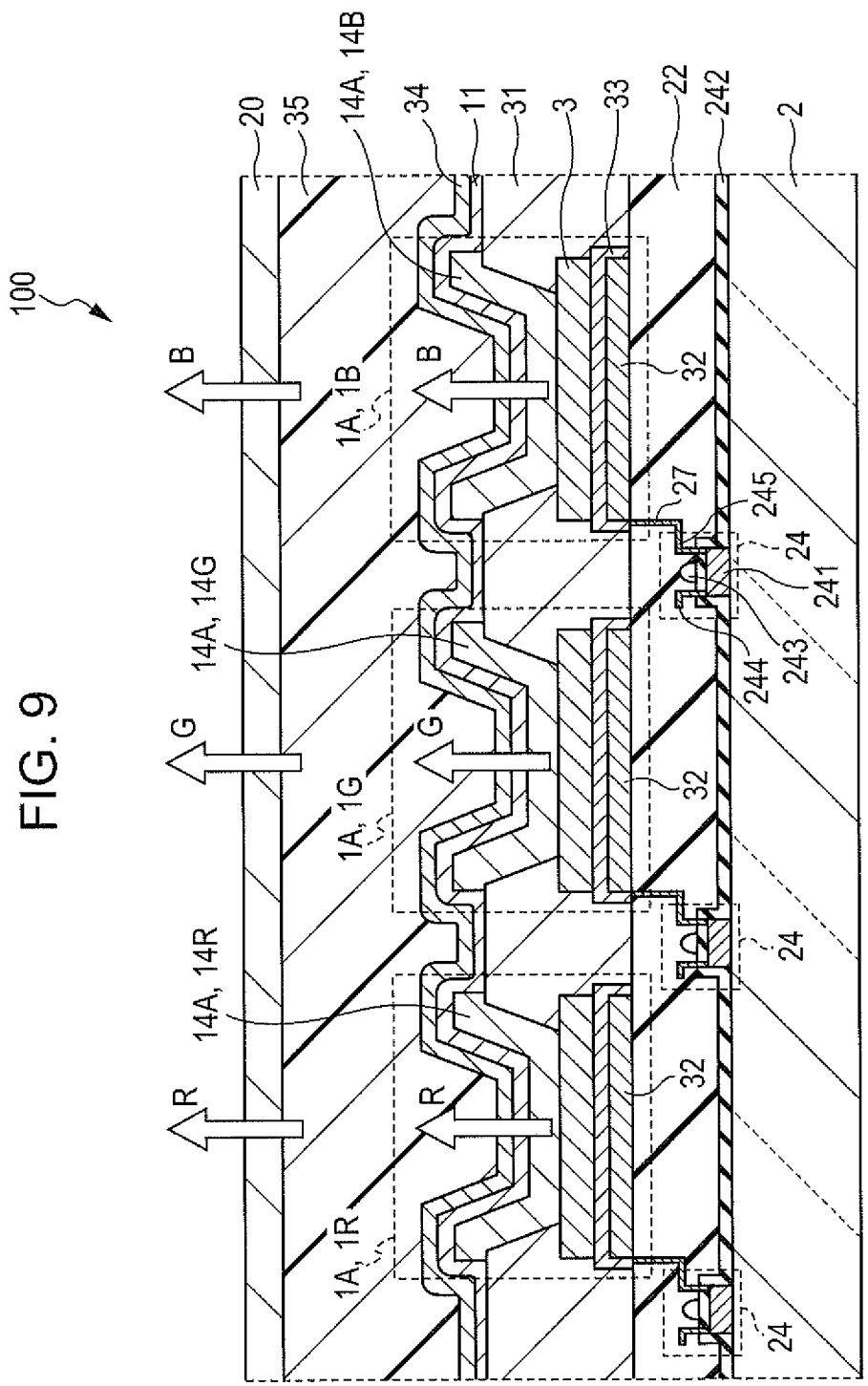
FIG. 9 is a view showing an embodiment of a display apparatus in which the light emitting device according to an aspect of the invention is applied.

FIG. 9 is a longitudinal cross-sectional view showing an embodiment of a display apparatus in which the light emitting device according to an aspect of the invention is applied.

The display apparatus 100 shown in FIG. 9 includes a substrate 2, a plurality of light emitting elements 1A, and a plurality of driving transistors 24 for respectively driving each light emitting element 1A. Here, the display apparatus 100 is a display panel having a top emission structure.

A plurality of driving transistors 24 are provided on the substrate 2 and a planarization layer 22 configured of an insulating material is formed so as to cover the above driving transistors 24.

Each driving transistor 24 includes a semiconductor layer 241 formed of silicon, a gate insulating layer 242 formed on the semiconductor layer 241, a gate electrode 243 formed on the gate insulating layer 242, a source electrode 244, and a drain electrode 245.

On the planarization layer, light emitting elements 1A are provided to correspond to each driving transistor 24.

On the planarization layer 22 in the light emitting element 1A, a reflective film 32, an anti-corrosion film 33, the anode 3, a laminate body 14A, the cathode 11, and a cathode cover 34 are laminated in this order. In the present embodiment, the anodes 3 of each light emitting element 1A configure pixel electrodes, and are electrically connected to the drain electrodes 245 of each driving transistor 24 by conductive units (wiring) 27. In addition, the cathode 11 of each light emitting element 1A is set as a common electrode.

Among the light emitting elements 1A in FIG. 9, respectively, the light emitting element 1R emits red light as visible light, the light emitting element 1G emits green light as visible light, and the light emitting element 1B emits blue light as visible light.

Among the above light emitting elements 1A, a light emitting element 1 emitting infrared light which is not capable of being recognized by the human eye in addition to the visible light is applied in the light emitting element 1B. That is, the light emitting element 1 described in the third embodiment, the fifth embodiment, and the seventh embodiment is applied to the light emitting element 1B.

Partition walls 31 are provided between adjacent light emitting elements 1A. In addition, an epoxy layer 35 configured of epoxy resin is formed so as to cover the above. Then, on the epoxy layer 35, the sealing substrate 20 is provided so as to cover them.

Since a light emitting element 1A having a long life span is provided without changing the chromaticity, the above display apparatus 100 has excellent reliability.

Such a display apparatus 100 is capable of being incorporated into various types of electronic apparatuses.

Electronic Apparatus

Figure 10:
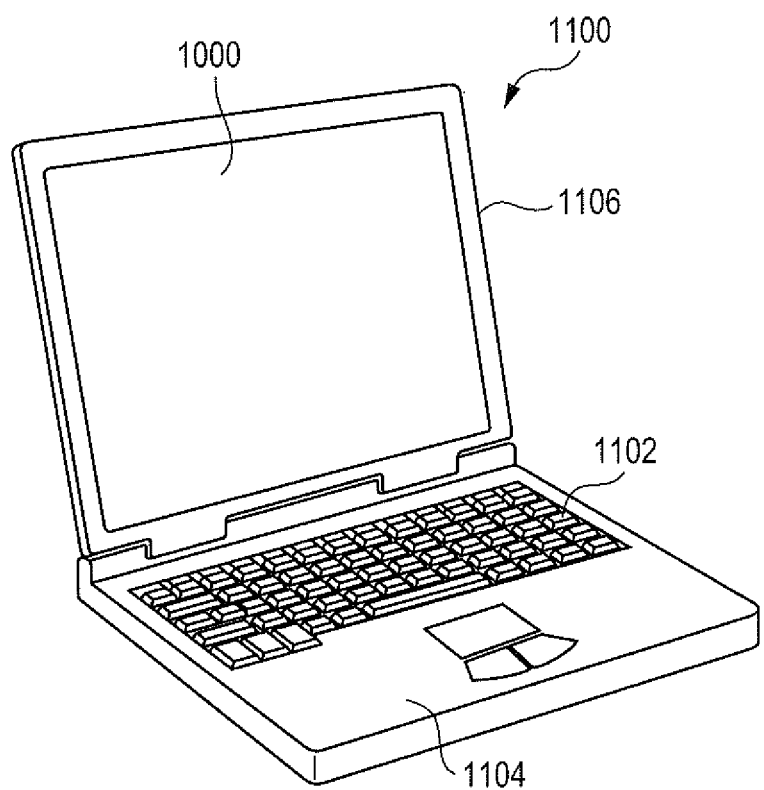
FIG. 10 is a perspective view showing a configuration of a mobile type (or a notebook type) personal computer in which the electronic apparatus according to an aspect of the invention is applied.
Figure 11:
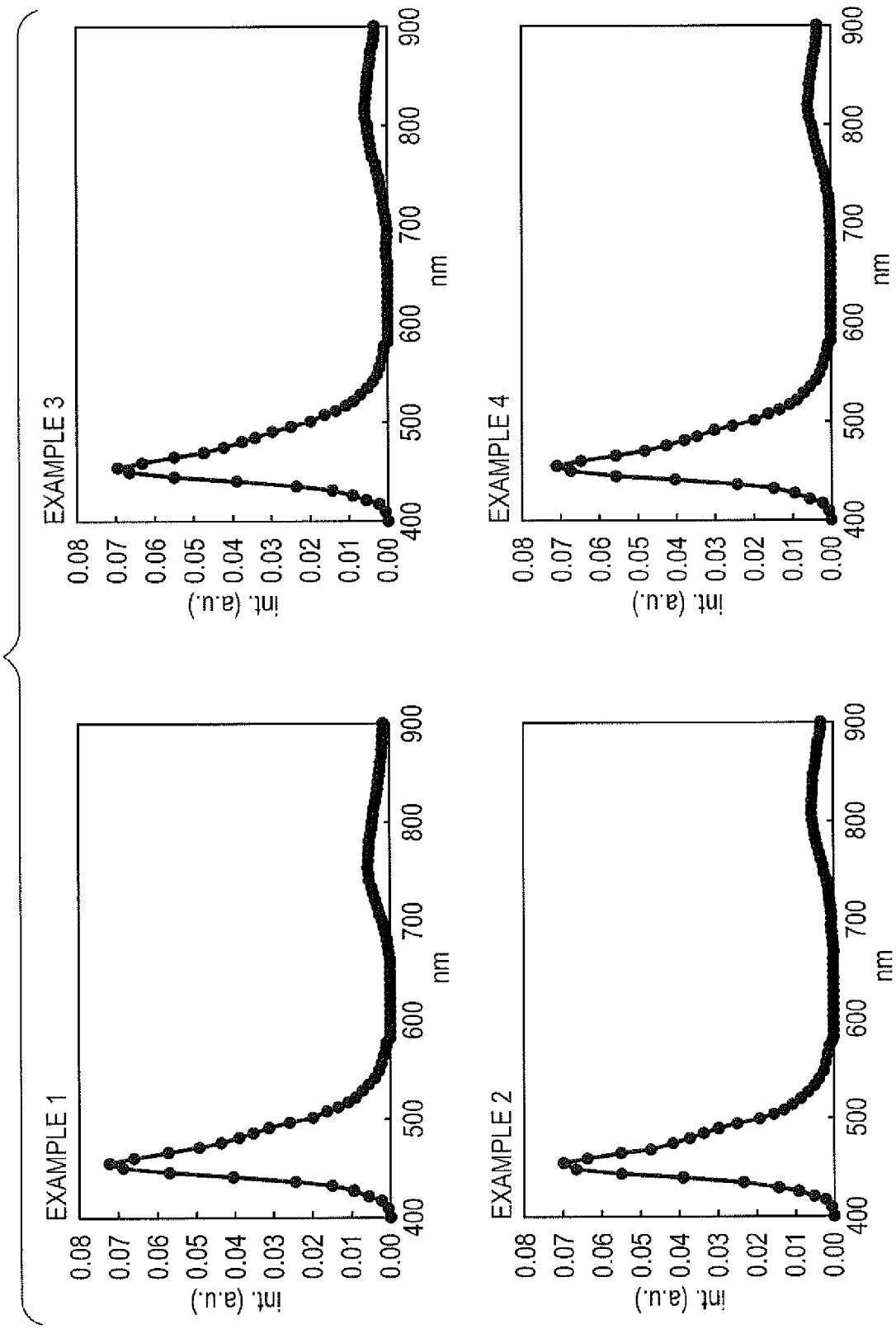
FIG. 11 is a view showing the light emitting spectra in the light emitting elements of Examples 1 to 4.
Figure 12:
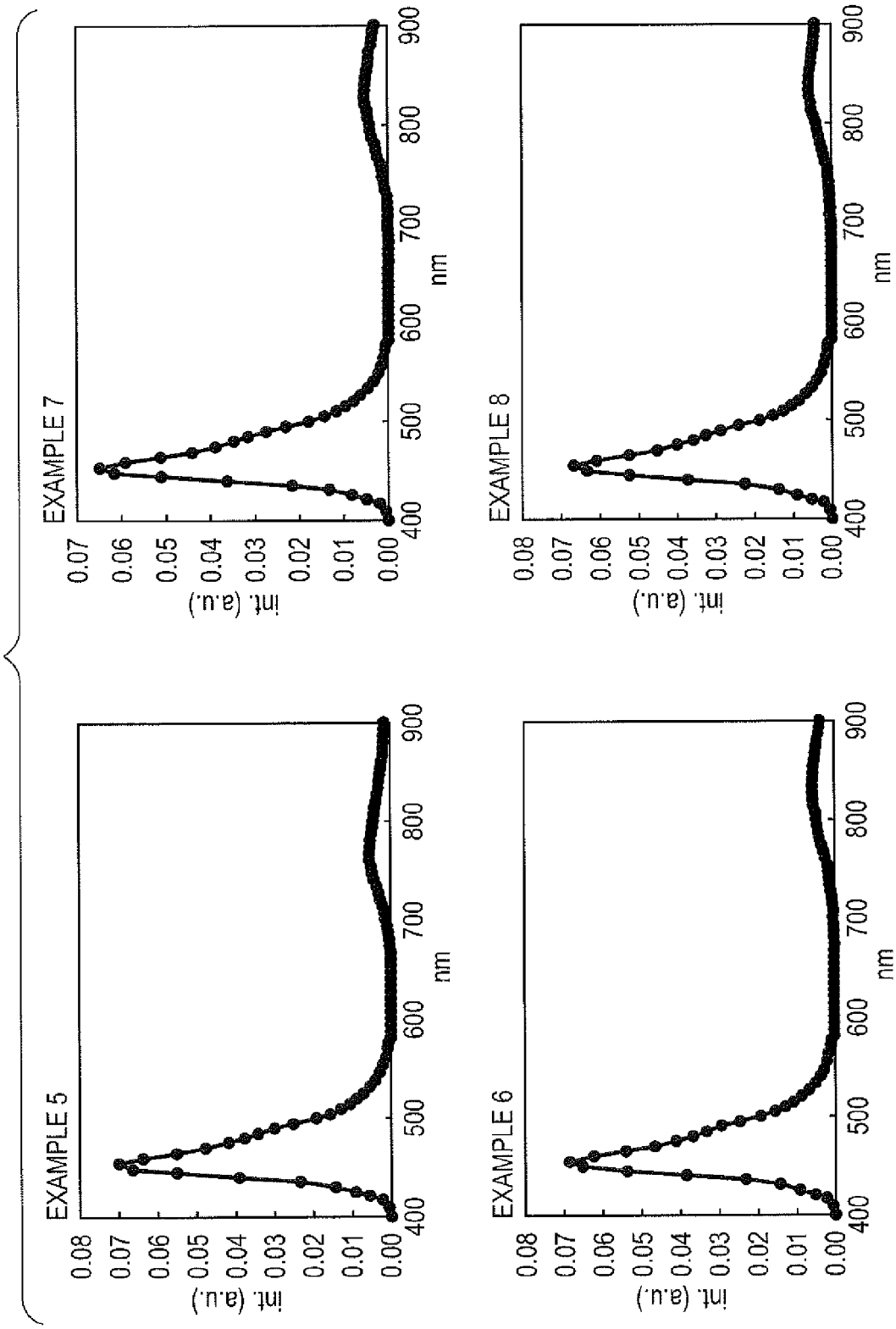
FIG. 12 is a view showing the light emitting spectra in the light emitting elements of Examples 5 to 8.
Figure 13:
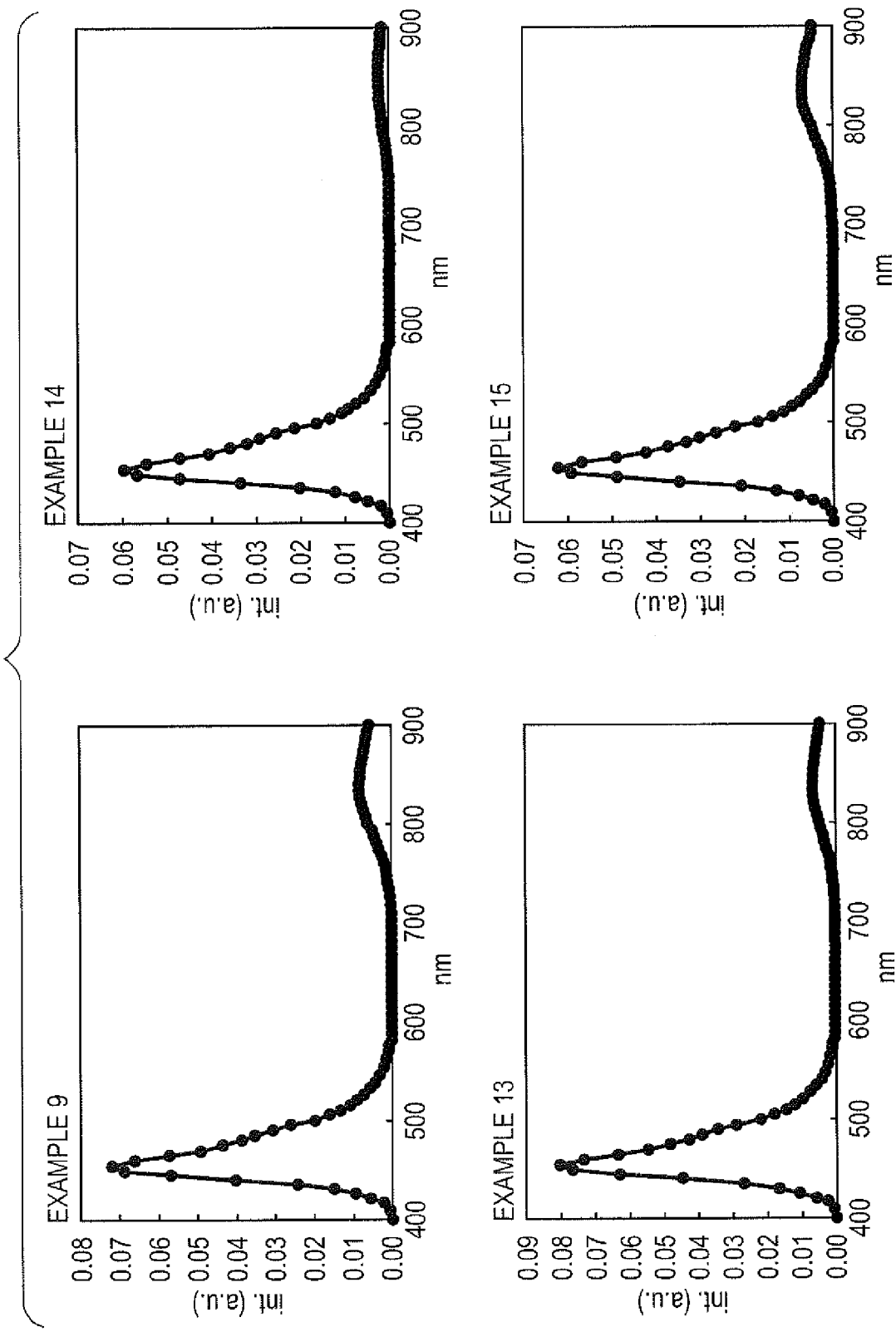
FIG. 13 is a view showing the light emitting spectra in the light emitting elements of Examples 9, and 13 to 15.

FIG. 10 is a perspective view showing a configuration of a mobile type (or a notebook type) personal computer in which the electronic apparatus according to an aspect of the invention is applied.

In the drawing, a personal computer 1100 is configured by a main body unit 1104 provided with a keyboard 1102, and a display unit 1106 provided with a display section 1000, and the display unit 1106 is rotatably supported through a hinge structure unit with respect to the main body unit 1104.

In the personal computer 1100, the above-described display apparatus 100 is applied to the display section 1000.

Since a light emitting element 1 having high efficiency and a long life span is provided, the above personal computer 1100 has excellent reliability.

Here, in addition to the personal computer of FIG. 10 (mobile type personal computer), the electronic apparatus according to an aspect of the invention is capable of being applied to mobile phones, digital still cameras, televisions, video cameras, viewfinder type and monitor direct-view type video tape recorders, laptop personal computers, car navigation systems, pagers, electronic organizers (including those with communication function), electronic dictionaries, calculators, electronic game machines, word processors, workstations, videophones, television monitors for security, electronic binoculars, electronic thermometers, POS terminals, apparatuses provided with touch screen (for example, cash dispensers of financial institutions, automatic ticket vending machines), medical equipment (for example, electronic thermometers, sphygmomanometers, blood glucose meters, pulse measuring devices, pulse wave measuring devices, ECG display devices, ultrasonic diagnostic devices, and display devices for endoscopes), fishfinders, various types of measurement apparatuses, meters (for example, instruments for vehicles, aircraft, and ships), flight simulators, various other types of monitor, projection-type display devices such as projectors, or the like.

Above, description has been given of the light emitting element, light emitting device, and electronic apparatus according to an aspect of the invention based on the embodiments of the drawings; however, the invention is not limited thereto.

For example, it is possible to substitute the light emitting element, light emitting device, and electronic apparatus according to an aspect of the invention with arbitrary replacements capable of exhibiting similar functions, or to add arbitrary configurations thereto.

For example, in the light emitting element according to an aspect of the invention, two or more arbitrary configurations shown in the first to seventh embodiments may be combined.

EXAMPLES

Next, description will be given of specific examples according to an aspect of the invention.

1. Manufacturing of Thiazole Based Compound

Synthesis Example A1

Synthesis of Compound Represented by the Above-Described Formula D-2

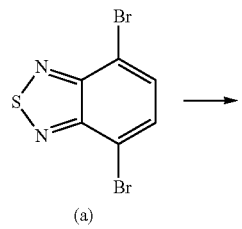
(a)

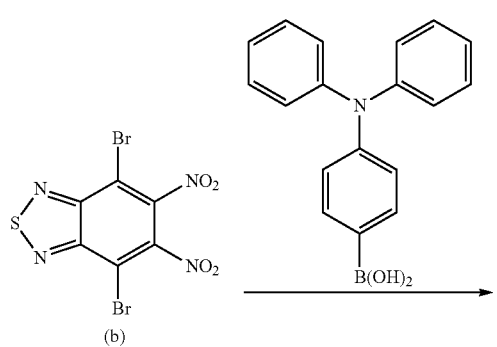
(b)

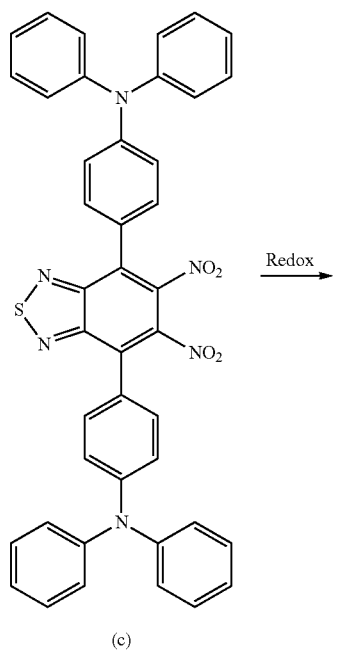
(c)

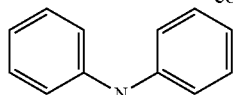

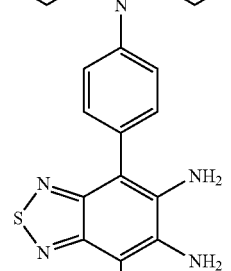

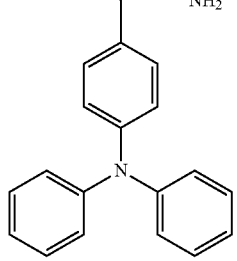
(d)

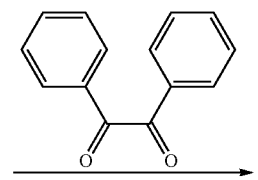

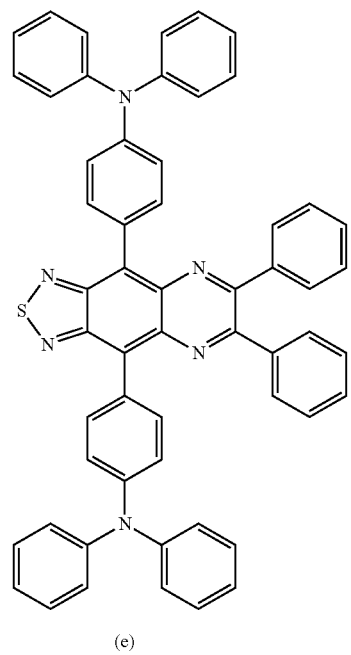 [SMILES: c1ccc(-c2nc3c(-c4ccc(N(c5ccccc5)c5ccccc5)cc4)c4nsnc4c(-c4ccc(N(c5ccccc5)c5ccccc5)cc4)c3nc2-c2ccccc2)cc1]
(e)

Synthesis (A1-1)

1500 ml of fuming nitric acid was put into a 5 liter flask and cooled. 1500 ml of sulfuric acid was added separately while preserving the temperature at 10 to 50° C. Further, 150 g of compound (a) which is dibromo benzothiadiazole which is a raw material was added thereto in small amounts over 1 hour. At that time, the solution temperature was set to be 5° C. or less. After addition of the total amount, a reaction was caused for 20 hours at room temperature (25° C.). After the reaction, the reaction solution was poured into 3 kg of ice and was stirred overnight. Thereafter, the resultant was filtered, and washed with methanol and heptane.

After heating and dissolving the remaining material after the filtering in 200 ml of toluene, filtering was performed after cooling to room temperature, the remaining material was washed with a small amount of toluene, and dried under reduced pressure.

In this manner, 60 g of a compound (b) (4,7-dibromo-5,6-dinitrobenzo[1,2,5]thiadiazole) having an HPLC purity of 95% was obtained.

Synthesis (A1-2)

Under an argon atmosphere, 30 g of compound (b) which is the obtained dibromo body, 54.2 g of a boronic acid body of triphenylamine, 2500 ml of toluene, and a 2M cesium carbonate aqueous solution (152 g/(distilled water) 234 ml) were put into a 5 liter flask, and reaction was performed overnight at 90° C. After the reaction, the resultant was filtered, separated, and concentrated, 52 g of the obtained coarse solid were separated using silica gel columns ($SiO_2$ 5 kg), and a red-purple solid was obtained.

In this manner, 8.9 g of a compound (c) having an HPLC purity of 96% was obtained.

Here, during the synthesis of the boronic acid body of triphenylamine, under an argon atmosphere, 246 g of 4-bromotriphenylamine (commercial product) and 1500 ml of dehydrated tetrahydrofuran were put into a 5 liter flask, and 570 ml of a 1.6M n-BuLi/hexane solution was added dropwise over 3 hours at −60° C. After 30 minutes, 429 g of boric acid triisopropyl was added dropwise over 1 hour. After the dropping, reaction was performed overnight without modifying the temperature. After the reaction, 2 liters of water were added dropwise thereto, followed by extraction and separation with 2 liters of toluene. An organic layer was concentrated, recrystallized, filtered, and dried, whereby 160 g of a white boronic acid body which was the desired product was obtained.

The HPLC purity of the obtained boronic acid body was 99%.

Synthesis (A1-3)

Under an argon atmosphere, 8 g of the obtained compound (c), which is a dinitro body, 7 g of reduced iron, and 600 ml of acetic acid were put in a 1 liter flask, reacted for 4 hours at 80° C., and cooled to room temperature. After the reaction, the reaction solution was poured into 1.5 liters of ion exchanged water, and 1.5 liters of ethyl acetate were further added thereto. After the addition, since the solid was precipitated, 1 liter of tetrahydrofuran and 300 g of salt were added thereto and separation was performed. An aqueous layer was re-extracted with 1 liter of tetrahydrofuran. The concentrated and dried resultant was again washed with a small amount of water and methanol, and an orange solid was obtained.

In this manner, 7 g of the compound (d) having an HPLC purity of 80% were obtained.

Synthesis (A1-4)

Under an argon atmosphere, 4.5 g of the obtained compound (d), which is a diamine body, 3.7 g of benzyl, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 7 g of a black-green solid were obtained. Then, the black-green solid was purified using a silica gel column ($SiO_2$ 1 kg).

In this manner, 4 g of compound (e) (compound represented by the formula D-2) having an HPLC purity of 99% were obtained. The result of mass spectrometry of the compound (e) was M+: 826.

Furthermore, the obtained compound (e) was purified by sublimation at a set temperature of 340° C. After the sublimation purification, the HPLC purity of the compound (e) was 99%.

Synthesis Example A2

Synthesis of Compound Represented by the Formula D-1

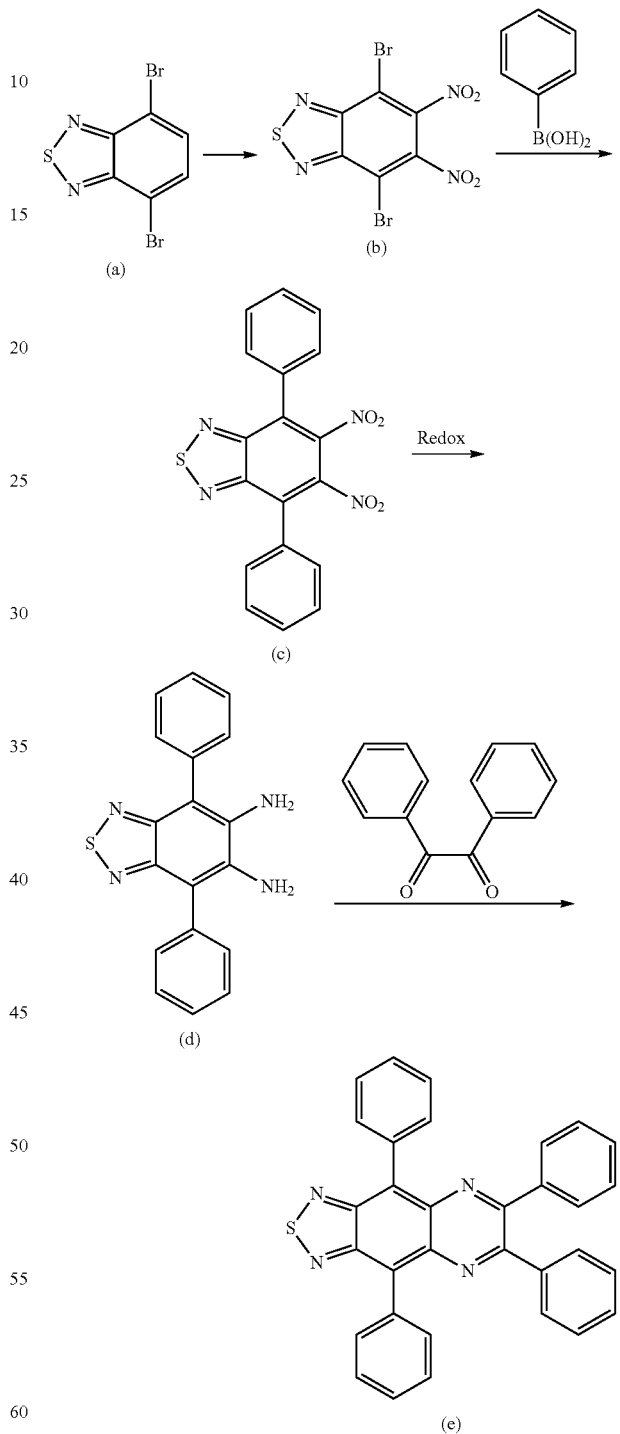

Synthesis (A2-1) to (A2-3)

In the synthesis (A1-2) described in the synthesis example A1, compound (d), which is a diamine body, was obtained in the same manner as synthesis (A1-1) to (A1-3) other than the fact that phenylboronic acid was used instead of the boronic acid body of triphenylamine.

Synthesis (A2-4)

Under an argon atmosphere, 2.3 g of the obtained compound (d), which is a diamine body, 3.7 g of benzyl, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 7 g of a black-green solid were obtained. Then, the black-green solid was purified using a silica gel column (SiO$_2$ 1 kg).

In this manner, 2.7 g of compound (e) (compound represented by the formula D-1) having an HPLC purity of 99% were obtained. The result of mass spectrometry of the compound (e) was M+: 492.

Furthermore, the obtained compound (e) was purified by sublimation at a set temperature of 340° C. After the sublimation purification, the HPLC purity of the compound (e) was 99%.

Synthesis Example A3
Synthesis of Compound Represented by the Formula D-11

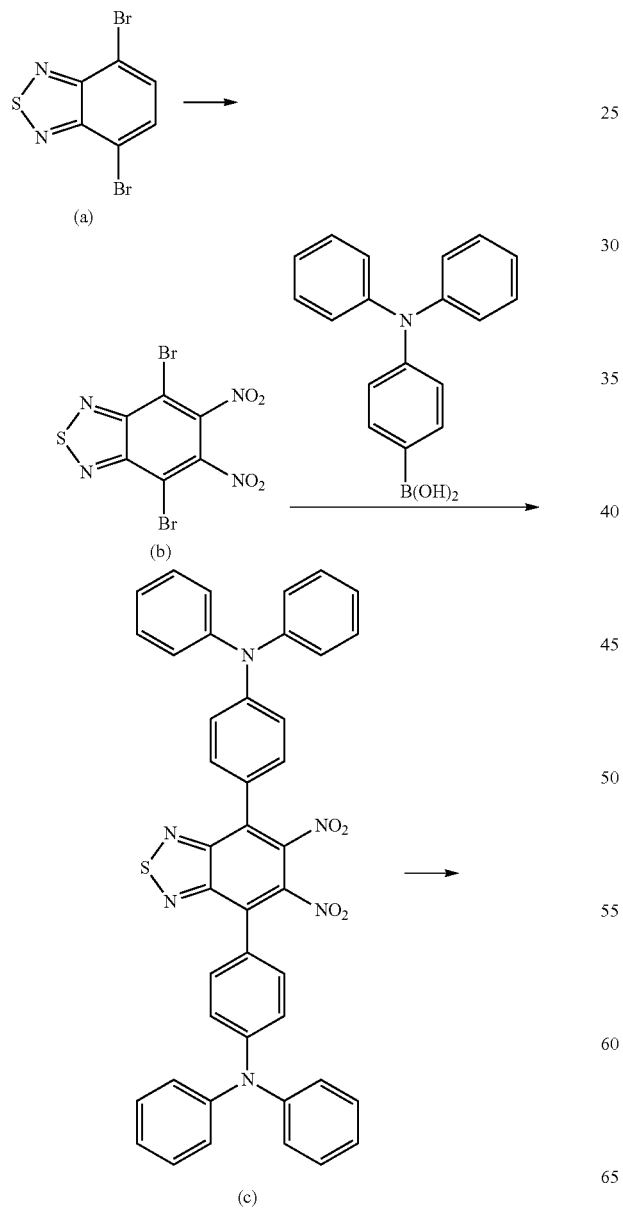

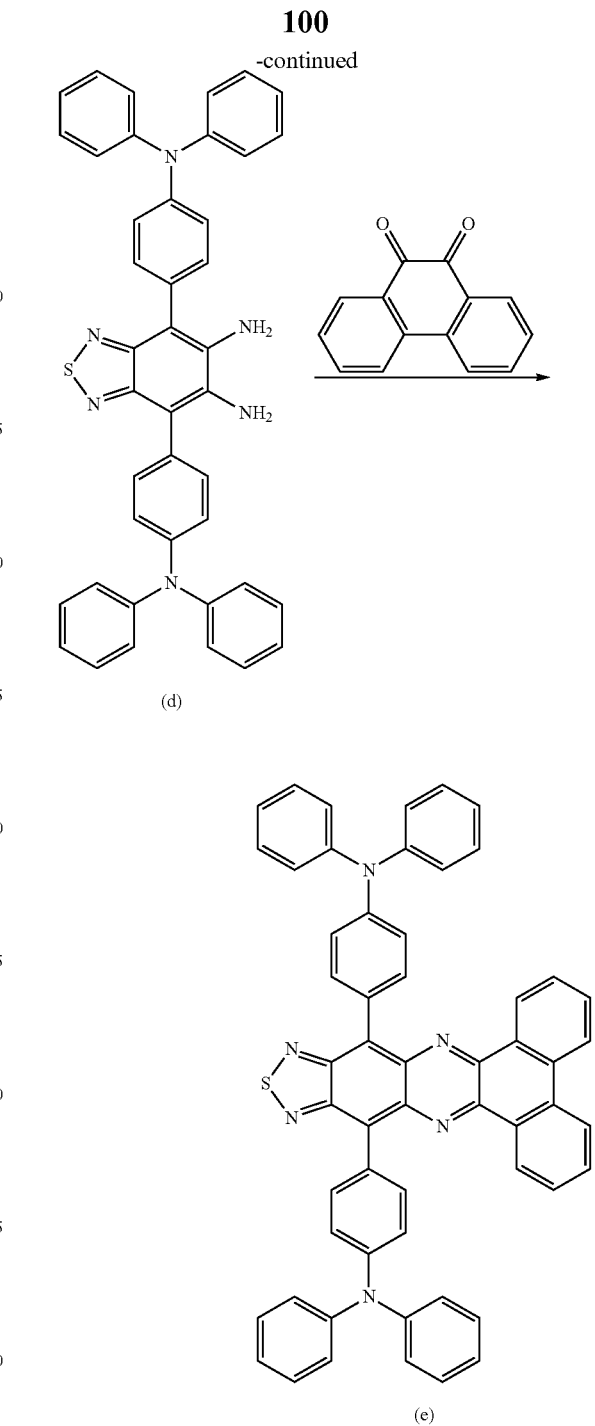

Synthesis (A3-1) to (A3-3)

Similarly to the synthesis (A1-1) to (A1-3) described above by synthesis example A1, compound (d), which is a diamine body, was obtained.

Synthesis (A3-4)

Under an argon atmosphere, 1.5 g of the obtained compound (d), which is a diamine body, 0.6 g of 9,10-phenanthrenequinone, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column (SiO$_2$ 1 kg).

In this manner, 1.5 g of compound (e) (compound represented by the formula D-11) having an HPLC purity of 99% were obtained. The result of mass spectrometry of the compound (e) was M+: 824.

Furthermore, the obtained compound (e) was purified by sublimation at a set temperature of 340° C. After the sublimation purification, the HPLC purity of the compound (e) was 99%.

Synthesis Example A4

Synthesis of Compound Represented by the Formula D-10

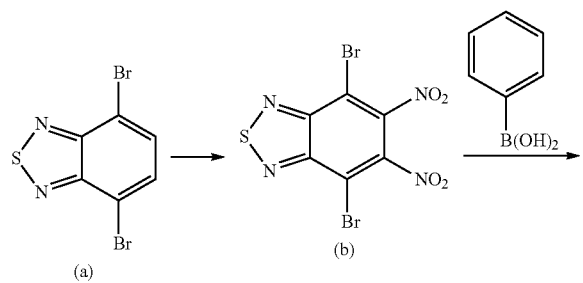

(a) (b)

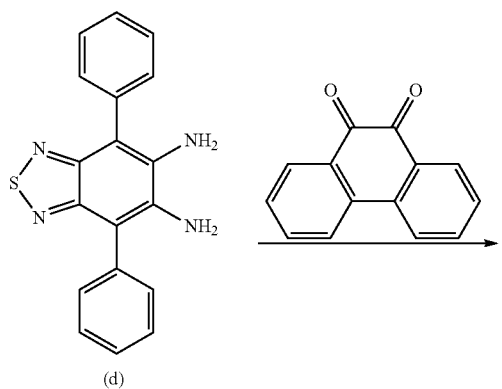

(c)

(d)

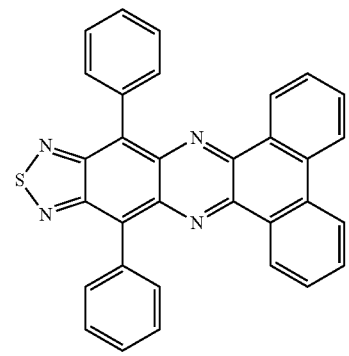

(e)

Synthesis (A4-1) to (A4-3)

In the synthesis (A1-2) described in the synthesis example A1, compound (d), which is a diamine body, was obtained in the same manner as synthesis (A1-1) to (A1-3) other than the fact that phenylboronic acid was used instead of the boronic acid body of triphenylamine.

Synthesis (A4-4)

Under an argon atmosphere, 1.5 g of the obtained compound (d), which is a diamine body, 2.4 g of 9,10-phenanthrenequinone, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column (SiO$_2$ 1 kg).

In this manner, 1.8 g of compound (e) (compound represented by the formula D-10) having an HPLC purity of 99% were obtained. The result of mass spectrometry of the compound (e) was M+: 490.

Furthermore, the obtained compound (e) was purified by sublimation at a set temperature of 340° C. After the sublimation purification, the HPLC purity of the compound (e) was 99%.

Synthesis Example A5

Synthesis of Compounds Represented by the Formula D-5

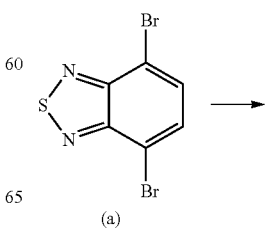

(a)

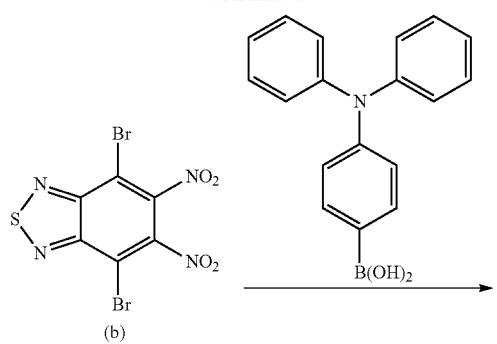

(b)

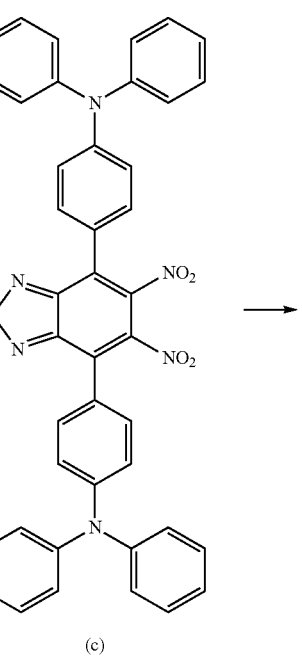

(c)

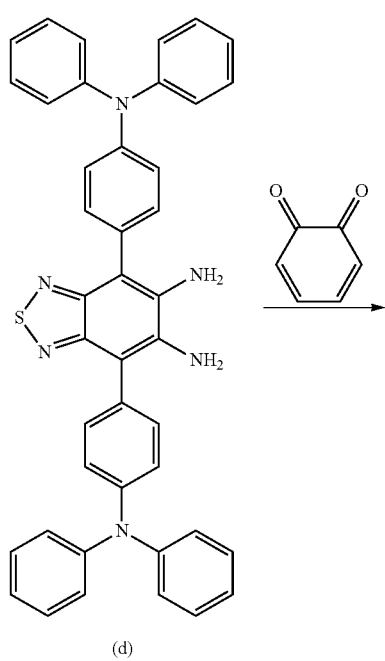

(d)

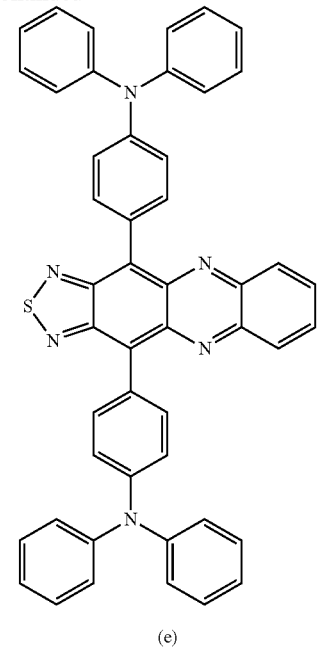 [SMILES: c1ccc(N(c2ccccc2)c2ccc(-c3c4nsnc4c(-c4ccc(N(c5ccccc5)c5ccccc5)cc4)c4nc5ccccc5nc34)cc2)cc1]

(e)

Synthesis (A5-1) to (A5-3)

Compound (d), which is a diamine body, was obtained in the same manner as synthesis (A1-1) to (A1-3) described in the synthesis example A1.

Synthesis (A5-4)

Under an argon atmosphere, 1.5 g of the obtained compound (d), which is a diamine body, 5.7 ml (1 mol/L) of o-benzoquinone solution (Voigt Global Distribution Inc.), and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column ($SiO_2$ 1 kg).

In this manner, 0.8 g of compound (e) (compound represented by the formula D-5) having an HPLC purity of 99% were obtained. The result of mass spectrometry of the compound (e) was M+: 724.

Furthermore, the obtained compound (e) was purified by sublimation at a set temperature of 340° C. After the sublimation purification, the HPLC purity of the compound (e) was 99%.

Synthesis Example A6

Synthesis of Compound Represented by the Formula D-4

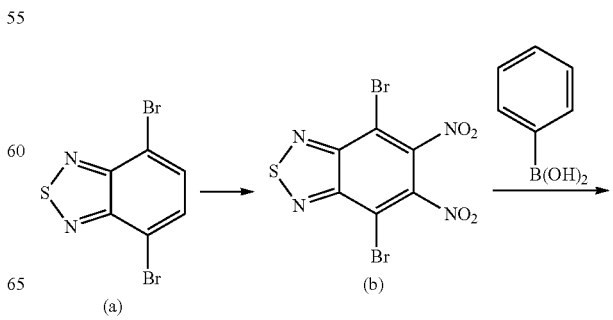

(a) (b)

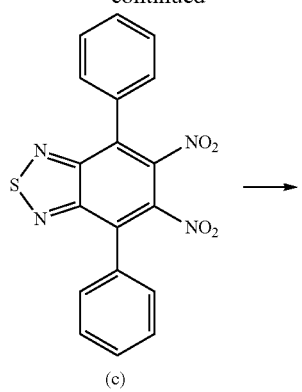

(c)

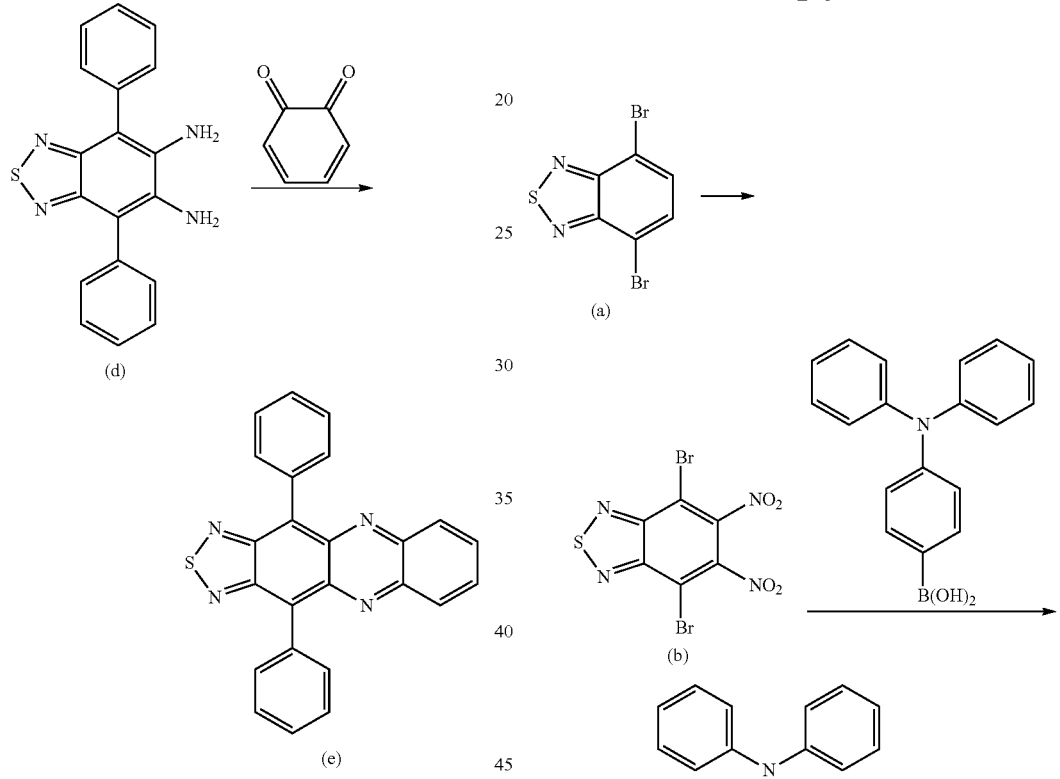

Synthesis (A6-1) to (A6-3)

In the synthesis (A1-2) described in the synthesis example A1, compound (d), which is a diamine body, was obtained in the same manner as synthesis (A1-1) to (A1-3) other than the fact that phenylboronic acid was used instead of the boronic acid body of triphenylamine.

Synthesis (A6-4)

Under an argon atmosphere, 1.5 g of the obtained compound (d), which is a diamine body, 12 ml (1 mol/L) of o-benzoquinone aqueous solution (Voigt Global Distribution Inc.), and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column (SiO₂ 1 kg).

In this manner, 0.9 g of compound (e) (compound represented by the formula D-4) having an HPLC purity of 99% were obtained. The result of mass spectrometry of the compound (e) was M+: 390.

Furthermore, the obtained compound (e) was purified by sublimation at a set temperature of 340° C. After the sublimation purification, the HPLC purity of the compound (e) was 99%.

Synthesis Example A7

Synthesis of Compound Represented by the Formula D-8

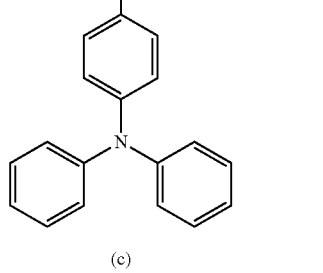

(c)

-continued

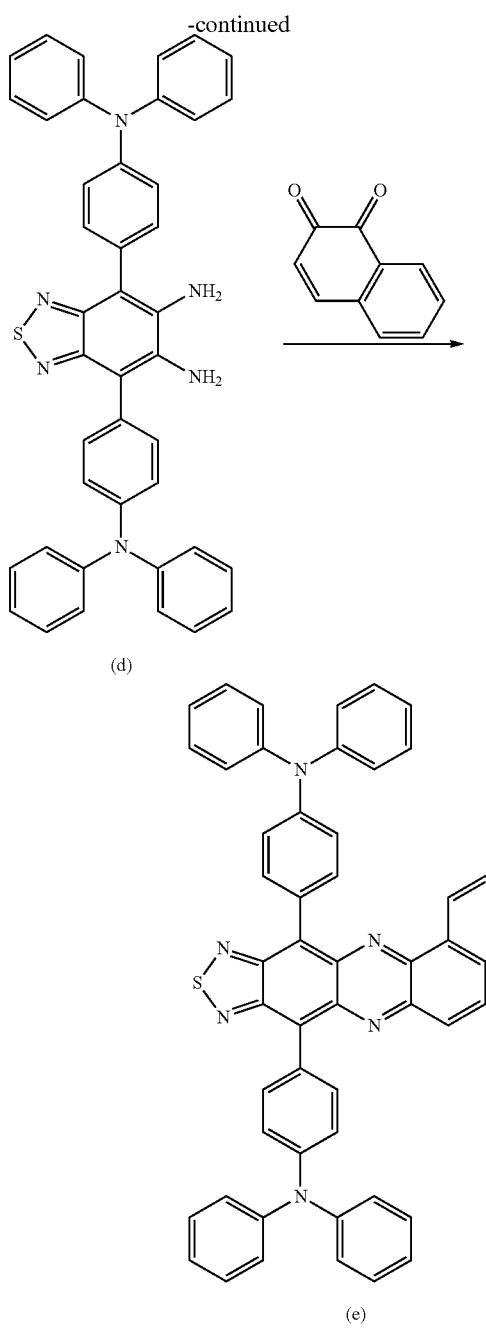

(d)

(e)

Synthesis (A7-1) to (A7-3)

The compound (d), which is a diamine body, was obtained in the same manner as synthesis (A1-1) to (A1-3) described in the synthesis example A1.

Synthesis (A7-4)

Under an argon atmosphere, 1.5 g of the obtained compound (d), which is a diamine body, 0.9 g of 1,2-naphthoquinone, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column (SiO$_2$ 1 kg).

In this manner, 1.4 g of compound (e) (compound represented by the formula D-8) having an HPLC purity of 99% were obtained. The result of mass spectrometry of the compound (e) was M+: 774.

Furthermore, the obtained compound (e) was purified by sublimation at a set temperature of 340° C. After the sublimation purification, the HPLC purity of the compound (e) was 99%.

Synthesis Example A5

Synthesis of Compound Represented by the Formula D-7

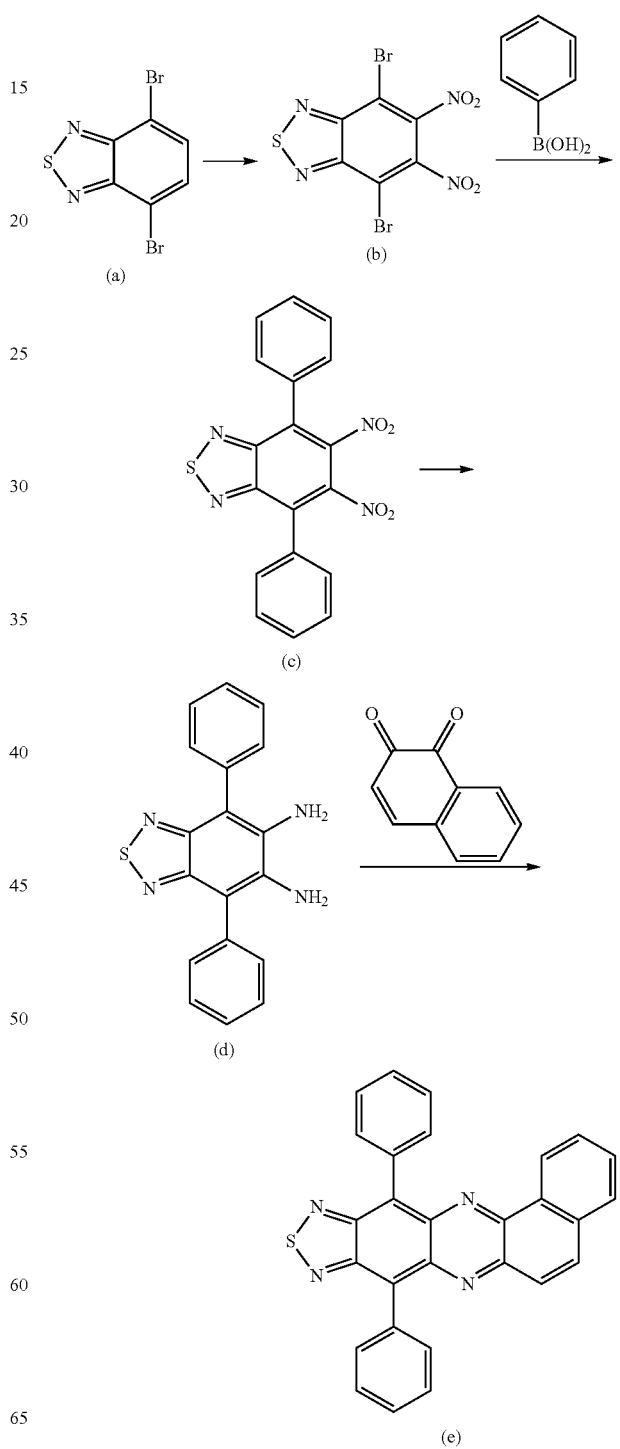

(a)

(b)

(c)

(d)

(e)

Synthesis (A8-1) to (A8-3)

In the synthesis (A1-2) described in the synthesis example A1, compound (d), which is a diamine body, was obtained in the same manner as synthesis (A1-1) to (A1-3) other than the fact that phenylboronic acid was used instead of the boronic acid body of triphenylamine.

Synthesis (A8-4)

Under an argon atmosphere, 1.5 g of the obtained compound (d), which is a diamine body, 1.9 g of 1,2-naphthoquinone, and 300 ml of acetic acid as a solvent were put into a 1 liter flask, and reaction was performed for 2 hours at 80° C. After the reaction, cooling was performed to room temperature, and the reaction solution was poured into 1 liter of ion exchanged water, the crystals were filtered, washed, and 2 g of a black-green solid were obtained. Then, the black-green solid was purified using a silica gel column ($SiO_2$ 1 kg).

In this manner, 1.4 g of compound (e) (compound represented by the formula D-7) having an HPLC purity of 99% were obtained. The result of mass spectrometry of the compound (e) was M+: 440.

Furthermore, the obtained compound (e) was purified by sublimation at a set temperature of 340° C. After the sublimation purification, the HPLC purity of the compound (e) was 99%.

2. Manufacturing of Light Emitting Element

Example 1

<1> First, a transparent glass substrate having an average thickness of 0.5 mm was prepared. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 40 nm.

<3> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-1 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<4> Next, on the carrier trapping layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<5> Next, on the intermediate layer, a blue light emitting layer having an average thickness of 30 nm was formed by using the vacuum deposition method to vapor deposit the constituent materials of the blue light emitting layer. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 6.0 wt %.

<6> Next, an electron transporting layer having an average thickness of 40 nm was formed on the blue light emitting layer by forming a film with the compound represented by the formula ETL-A3 using the vacuum deposition method.

<7> Next, an electron injection layer having an average thickness of 1 nm was formed on the electron transporting layer by forming a film with lithium fluoride (LiF) using the vacuum deposition method.

<8> Next, an Al film was formed on the electron injection layer using the vacuum deposition method. In this manner, a cathode, which had an average thickness of 150 nm and was configured of Al, was formed.

<9> Next, a protective cover (sealing member) made of glass was used as a cover so as to cover each of the formed layers and fixed and sealed using epoxy resin.

Through the above steps, a light emitting element was manufactured.

Example 2

A light emitting element was manufactured in the same manner as Example 1 other than that a compound represented by the formula D-4 was used as the thiadiazole based compound of the carrier trapping layer in step 3 of Example 1, instead of the compound represented by the formula D-1.

Example 3

A light emitting element was manufactured in the same manner as Example 1 other than that a compound represented by the formula D-7 was used as the thiadiazole based compound of the carrier trapping layer in step 3 of Example 1, instead of the compound represented by the formula D-1.

Example 4

A light emitting element was manufactured in the same manner as Example 1 other than that a compound represented by the formula D-10 was used as the thiadiazole based compound of the carrier trapping layer in step 3 of Example 1, instead of the compound represented by the formula D-1.

Example 5

A light emitting element was manufactured in the same manner as Example 1 other than that a compound represented by the formula D-2 was used as the thiadiazole based compound of the carrier trapping layer in step 3 of Example 1, instead of the compound represented by the formula D-1.

Example 6

A light emitting element was manufactured in the same manner as Example 1 other than that a compound represented by the formula D-5 was used as the thiadiazole based compound of the carrier trapping layer in step 3 of Example 1, instead of the compound represented by the formula D-1.

Example 7

A light emitting element was manufactured in the same manner as Example 1 other than that a compound represented by the formula D-8 was used as the thiadiazole based compound of the carrier trapping layer in step 3 of Example 1, instead of the compound represented by the formula D-1.

Example 8

A light emitting element was manufactured in the same manner as Example 1 other than that a compound represented by the formula D-11 was used as the thiadiazole based compound of the carrier trapping layer in step 3 of Example 1, instead of the compound represented by the formula D-1.

Example 9

A light emitting element was manufactured in the same manner as Example 1 other than that a compound represented by the formula D-11 was used as the thiadiazole based compound of the carrier trapping layer in step 3 of Example 1, instead of the compound represented by the formula D-1 and that the adding of the host material was omitted and an intermediate layer was formed in step 4 of Example 1.

Comparative Example 1

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 60 nm.

<3> Next, on the hole transporting layer, the constituent material of the blue light emitting layer was vapor deposited with a vacuum deposition method to form a blue light emitting layer having an average thickness of 30 nm. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 6.0 wt %.

<4> Next, an electron transporting layer having an average thickness of 40 nm was formed on the blue light emitting layer by forming a film with the compound represented by the formula ETL-A3 using the vacuum deposition method.

<5> Next, an electron injection layer having an average thickness of 1 nm was formed on the electron transporting layer by forming a film with lithium fluoride (LiF) using the vacuum deposition method.

<6> Next, an Al film was formed on the electron injection layer using the vacuum deposition method. In this manner, a cathode, which had an average thickness of 150 nm and was configured of Al, was formed.

<7> Next, a protective cover (sealing member) made of glass was used as a cover so as to cover each of the formed layers and fixed and sealed using epoxy resin.

Through the above steps, a light emitting element was manufactured.

Example 10

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 40 nm.

<3> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<4> Next, on the carrier trapping layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<5> Next, on the intermediate layer, a yellow light emitting layer having an average thickness of 30 nm was formed by using the vacuum deposition method to vapor deposit the constituent materials of the yellow light emitting layer. As the constituent materials of the yellow light emitting layer, a compound (tetracene based compound) represented by the chemical formula (26A) was used as the light emitting material (guest material), and a compound (anthracene based material) represented by the formula H2-30 was used as the host material. In addition, the content (doping concentration) of the light emitting material (dopant) in the yellow light emitting layer was set to 3.0 wt %.

<6> Next, an electron transporting layer having an average thickness of 40 nm was formed on the yellow light emitting layer by forming a film with the compound represented by the formula ETL-A3 using the vacuum deposition method.

<7> Next, an electron injection layer having an average thickness of 1 nm was formed on the electron transporting layer by forming a film with lithium fluoride (LiF) using the vacuum deposition method.

<8> Next, an Al film was formed on the electron injection layer using the vacuum deposition method. In this manner, a cathode, which had an average thickness of 150 nm and was configured of Al, was formed.

<9> Next, a protective cover (sealing member) made of glass was used as a cover so as to cover each of the formed layers and fixed and sealed using epoxy resin.

Through the above steps, a light emitting element was manufactured.

Comparative Example 2

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 60 nm.

<3> Next, on the hole transporting layer, the constituent material of the yellow light emitting layer was vapor deposited with a vacuum deposition method to form a yellow light emitting layer having an average thickness of 30 nm. As the constituent materials of the yellow light emitting layer, a compound (tetracene based compound) represented by the chemical formula (26A) was used as the light emitting material (guest material), and a compound (anthracene based material) represented by the formula H2-30 was used as the host material. In addition, the content (doping concentration) of the light emitting material (dopant) in the yellow light emitting layer was set to 3.0 wt %.

<4> Next, an electron transporting layer having an average thickness of 40 nm was formed on the yellow light emitting layer by forming a film with the compound represented by the formula ETL-A3 using the vacuum deposition method.

<5> Next, an electron injection layer having an average thickness of 1 nm was formed on the electron transporting layer by forming a film with lithium fluoride (LiF) using the vacuum deposition method.

<6> Next, an Al film was formed on the electron injection layer using the vacuum deposition method. In this manner, a cathode, which had an average thickness of 150 nm and was configured of Al, was formed.

<7> Next, a protective cover (sealing member) made of glass was used as a cover so as to cover each of the formed layers and fixed and sealed using epoxy resin.

Through the above steps, a light emitting element was manufactured.

Example 11

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 35 nm.

<3> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<4> Next, on the carrier trapping layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<5> Next, on the intermediate layer, a yellow light emitting layer having an average thickness of 20 nm was formed by using the vacuum deposition method to vapor deposit the constituent materials of the yellow light emitting layer. As the constituent materials of the yellow light emitting layer, a compound (tetracene based compound) represented by the chemical formula (26A) was used as the light emitting material (guest material), and a compound (anthracene based material) represented by the formula H2-30 was used as the host material. In addition, the content (doping concentration) of the light emitting material (dopant) in the yellow light emitting layer was set to 3.0 wt %.

<6> Next, on the yellow light emitting layer, a cyan light emitting layer having an average thickness of 20 nm was formed by using the vacuum deposition method to vapor deposit the constituent materials of the cyan light emitting layer. As the constituent materials of the cyan light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the cyan light emitting layer was set to 6.0 wt %.

<7> Next, an electron transporting layer having an average thickness of 25 nm was formed on the cyan light emitting layer by forming a film with the compound represented by the formula ETL-A3 using the vacuum deposition method.

<8> Next, an electron injection layer having an average thickness of 1 nm was formed on the electron transporting layer by forming a film with lithium fluoride (LiF) using the vacuum deposition method.

<9> Next, an Al film was formed on the electron injection layer using the vacuum deposition method. In this manner, a cathode, which had an average thickness of 150 nm and was configured of Al, was formed.

<10> Next, a protective cover (sealing member) made of glass was used as a cover so as to cover each of the formed layers and fixed and sealed using epoxy resin.

Through the above steps, a light emitting element was manufactured.

Comparative Example 3

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 55 nm.

<3> Next, on the hole transporting layer, a yellow light emitting layer having an average thickness of 20 nm was formed by using the vacuum deposition method to vapor deposit the constituent materials of the yellow light emitting layer. As the constituent materials of the yellow light emitting layer, a compound (tetracene based compound) represented by the chemical formula (26A) was used as the light emitting material (guest material), and a compound (anthracene based material) represented by the formula H2-30 was used as the host material. In addition, the content (doping concentration) of the light emitting material (dopant) in the yellow light emitting layer was set to 3.0 wt %.

<4> Next, on the yellow light emitting layer, a cyan light emitting layer having an average thickness of 20 nm was formed by using the vacuum deposition method to vapor deposit the constituent materials of the cyan light emitting layer. As the constituent materials of the cyan light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the cyan light emitting layer was set to 6.0 wt %.

<5> Next, an electron transporting layer having an average thickness of 25 nm was formed on the cyan light emitting layer by forming a film with the compound represented by the formula ETL-A3 using the vacuum deposition method.

<6> Next, an electron injection layer having an average thickness of 1 nm was formed on the electron transporting layer by forming a film with lithium fluoride (LiF) using the vacuum deposition method.

<7> Next, an Al film was formed on the electron injection layer using the vacuum deposition method. In this manner, a cathode, which had an average thickness of 150 nm and was configured of Al, was formed.

<8> Next, a protective cover (sealing member) made of glass was used as a cover so as to cover each of the formed layers and fixed and sealed using epoxy resin.

Through the above steps, a light emitting element was manufactured.

Example 12

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 30 nm.

<3> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<4> Next, on the carrier trapping layer, a red light emitting layer having an average thickness of 15 nm was formed by using the vacuum deposition method to vapor deposit the constituent materials of the red light emitting layer. As the constituent materials of the red light emitting layer, a compound (diindenoperylene derivative) represented by the chemical formula (17) was used as the light emitting material (guest material), and a compound (tetracene based material) represented by the formula H1-5 was used as the host material. In addition, the content (doping concentration) of the light emitting material (dopant) in the red light emitting layer was set to 2.0 wt %.

<5> Next, on the red light emitting layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<6> Next, on the intermediate layer, a blue light emitting layer having an average thickness of 20 nm was formed by using the vacuum deposition method to vapor deposit the constituent materials of the blue light emitting layer. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 5.0 wt %.

<7> Next, on the blue light emitting layer, a green light emitting layer having an average thickness of 20 nm was formed by using the vacuum deposition method to vapor deposit the constituent materials of the green light emitting layer. As the constituent materials of the green light emitting layer, a compound (quinacridone derivative) represented by the chemical formula (25) was used as the light emitting material (guest material), and a compound (anthracene based material) represented by the formula H2-30 was used as the host material. In addition, the content (doping concentration) of the light emitting material (dopant) in the green light emitting layer was set to 6.0 wt %.

<8> Next, an electron transporting layer having an average thickness of 25 nm was formed on the green light emitting layer by forming a film with the compound represented by the formula ETL-A3 using the vacuum deposition method.

<9> Next, an electron injection layer having an average thickness of 1 nm was formed on the electron transporting layer by forming a film with lithium fluoride (LiF) using the vacuum deposition method.

<10> Next, an Al film was formed on the electron injection layer using the vacuum deposition method. In this manner, a cathode, which had an average thickness of 150 nm and was configured of Al, was formed.

<11> Next, a protective cover (sealing member) made of glass was used as a cover so as to cover each of the formed layers and fixed and sealed using epoxy resin.

Through the above steps, a light emitting element was manufactured.

Comparative Example 4

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 35 nm.

<3> Next, on the hole transporting layer, a red light emitting layer having an average thickness of 15 nm was formed by using the vacuum deposition method to vapor deposit the constituent materials of the red light emitting layer. As the constituent materials of the red light emitting layer, a compound (diindenoperylene derivative) represented by the chemical formula (17) was used as the light emitting material (guest material), and a compound (tetracene based material) represented by the formula H1-5 was used as the host material. In addition, the content (doping concentration) of the light emitting material (dopant) in the red light emitting layer was set to 2.0 wt %.

<4> Next, on the red light emitting layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<5> Next, on the intermediate layer, a blue light emitting layer having an average thickness of 20 nm was formed by using the vacuum deposition method to vapor deposit the constituent materials of the blue light emitting layer. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 5.0 wt %.

<6> Next, on the blue light emitting layer, a green light emitting layer having an average thickness of 20 nm was formed by using the vacuum deposition method to vapor deposit the constituent materials of the green light emitting layer. As the constituent materials of the green light emitting layer, a compound (quinacridone derivative) represented by the chemical formula (25) was used as the light emitting material (guest material), and a compound (anthracene based material) represented by the formula H2-30 was used as the host material. In addition, the content (doping concentration) of the light emitting material (dopant) in the green light emitting layer was set to 6.0 wt %.

<7> Next, an electron transporting layer having an average thickness of 25 nm was formed on the green light emitting layer by forming a film with the compound represented by the formula ETL-A3 using the vacuum deposition method.

<8> Next, an electron injection layer having an average thickness of 1 nm was formed on the electron transporting layer by forming a film with lithium fluoride (LiF) using the vacuum deposition method.

<9> Next, an Al film was formed on the electron injection layer using the vacuum deposition method. In this manner, a cathode, which had an average thickness of 150 nm and was configured of Al, was formed.

<10> Next, a protective cover (sealing member) made of glass was used as a cover so as to cover each of the formed layers and fixed and sealed using epoxy resin.

Through the above steps, a light emitting element was manufactured.

Example 13

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 60 nm.

<3> Next, on the hole transporting layer, the constituent material of the blue light emitting layer was vapor deposited with a vacuum deposition method to form a blue light emitting layer having an average thickness of 30 nm. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 6.0 wt %.

<4> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (anthracene based material) represented by the formula H2-30 was used as the host material. In addition, the content (doping concentration) of the thiadiazole based compound (dopant) in the carrier trapping layer was set to 3.0 wt %.

<5> Next, an electron transporting layer having an average thickness of 35 nm was formed on the carrier trapping layer by forming a film with the compound represented by the formula ETL-A3 using the vacuum deposition method.

<6> Next, an electron injection layer having an average thickness of 1 nm was formed on the electron transporting layer by forming a film with lithium fluoride (LiF) using the vacuum deposition method.

<7> Next, an Al film was formed on the electron injection layer using the vacuum deposition method. In this manner, a cathode, which had an average thickness of 150 nm and was configured of Al, was formed.

<8> Next, a protective cover (sealing member) made of glass was used as a cover so as to cover each of the formed layers and fixed and sealed using epoxy resin.

Through the above steps, a light emitting element was manufactured.

Example 14

A light emitting element was manufactured in the same manner as Example 13 other than that a tris(8-quinolinolato) aluminium complex ($Alq_3$) was used as the host material of the carrier trapping layer in step 4 of Example 1, instead of the compound represented by the formula H2-30.

Example 15

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 40 nm.

<3> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<4> Next, on the carrier trapping layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<5> Next, on the intermediate layer, a blue light emitting layer having an average thickness of 30 nm was formed by using the vacuum deposition method to vapor deposit the constituent materials of the blue light emitting layer. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 6.0 wt %.

<6> Next, on the blue light emitting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (anthracene based material) represented by the formula H2-30 was used as the host material. In addition, the content (doping concentration) of the thiadiazole based compound (dopant) in the carrier trapping layer was set to 3.0 wt %.

<7> Next, an electron transporting layer having an average thickness of 35 nm was formed on the carrier trapping layer by forming a film with the compound represented by the formula ETL-A3 using the vacuum deposition method.

<8> Next, an electron injection layer having an average thickness of 1 nm was formed on the electron transporting layer by forming a film with lithium fluoride (LiF) using the vacuum deposition method.

<9> Next, an Al film was formed on the electron injection layer using the vacuum deposition method. In this manner, a cathode, which had an average thickness of 150 nm and was configured of Al, was formed.

<10> Next, a protective cover (sealing member) made of glass was used as a cover so as to cover each of the formed layers and fixed and sealed using epoxy resin.

Through the above steps, a light emitting element was manufactured.

Example 16

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 50 nm.

<3> Next, on the hole transporting layer, the constituent material of the red light emitting layer was vapor deposited with a vacuum deposition method to form a red light emitting layer having an average thickness of 20 nm. As the constituent materials of the red light emitting layer, a compound (diindenoperylene derivative) represented by the chemical formula (17) was used as the light emitting material (guest material), and a compound (tetracene based material) represented by the formula H1-5 was used as the host material. In addition, the content (doping concentration) of the light emitting material (dopant) in the red light emitting layer was set to 2.0 wt %.

<4> Next, an electron transporting layer having an average thickness of 10 nm was formed on the red light emitting layer by forming a film with the compound represented by the formula ETL-A3 using the vacuum deposition method.

<5> Next, an electron injection layer having an average thickness of 1 nm was formed on the electron transporting layer by forming a film with lithium fluoride (LiF) using the vacuum deposition method.

<6> Next, on the electron injection layer, a carrier generating layer having an average thickness of 10 nm configured by the compound represented by the formula (50) was formed using the vacuum deposition method.

<7> Next, on the carrier generating layer, the amine based hole transporting material (tetrakis-p-biphenylyl benzidine) was vapor deposited with a vacuum deposition method to form a hole transporting layer having an average thickness of 10 nm.

<8> Next, on the hole transporting layer, the constituent material of the carrier trapping layer was vapor deposited with a vacuum deposition method to form a carrier trapping layer having an average thickness of 5 nm. As the constituent material of the carrier trapping layer, a compound represented by the formula D-11 was used as the thiadiazole based compound (guest material), and a compound (tetracene based material) represented by the formula H1-5 was used as the host material. In addition, the content (doping concentration) of the thiadiazole based compound (dopant) in the carrier trapping layer was set to 3.0 wt %.

<9> Next, on the carrier trapping layer, an intermediate layer having an average thickness of 15 nm configured by the constituent materials of the intermediate layer shown below was formed using the vacuum deposition method.

Here, as the constituent material of the first intermediate layer, a compound represented by the formula H2-30 was used as the host material, and tetrakis-p-biphenylyl benzidine was used as the amine based material. In addition, the content of the host material in the intermediate layer was set to 30 wt %.

<10> Next, on the intermediate layer, the constituent material of the blue light emitting layer was vapor deposited with a vacuum deposition method to form a blue light emitting layer having an average thickness of 15 nm. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 5.0 wt %.

<11> Next, on the blue light emitting layer, a green light emitting layer having an average thickness of 15 nm was formed by using the vacuum deposition method to vapor deposit the constituent materials of the green light emitting layer. As the constituent materials of the green light emitting layer, a compound (quinacridone derivative) represented by the chemical formula (25) was used as the light emitting material (guest material), and a compound (anthracene based material) represented by the formula H2-30 was used as the host material. In addition, the content (doping concentration) of the light emitting material (dopant) in the green light emitting layer was set to 6.0 wt %.

<12> Next, an electron transporting layer having an average thickness of 25 nm was formed on the green light emitting layer by forming a film with the compound represented by the formula ETL-A3 using the vacuum deposition method.

<13> Next, an electron injection layer having an average thickness of 1 nm was formed on the electron transporting layer by forming a film with lithium fluoride (LiF) using the vacuum deposition method.

<14> Next, an Al film was formed on the electron injection layer using the vacuum deposition method. In this manner, a cathode, which had an average thickness of 150 nm and was configured of Al, was formed.

<15> Next, a protective cover (sealing member) made of glass was used as a cover so as to cover each of the formed layers and fixed and sealed using epoxy resin.

Through the above steps, a light emitting element was manufactured.

Comparative Example 5

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the ITO electrode, the amine based hole transporting material (tetrakis-p-biphenylyl benzidine) was vapor deposited with a vacuum deposition method to form a hole transporting layer having an average thickness of 50 nm.

<3> Next, on the hole transporting layer, the constituent material of the red light emitting layer was vapor deposited with a vacuum deposition method to form a red light emitting layer having an average thickness of 20 nm. As the constituent materials of the red light emitting layer, a compound (diindenoperylene derivative) represented by the chemical formula (17) was used as the light emitting material (guest material), and a compound (tetracene based material) represented by the formula H1-5 was used as the host material. In addition, the content (doping concentration) of the light emitting material (dopant) in the red light emitting layer was set to 2.0 wt %.

<4> Next, an electron transporting layer having an average thickness of 10 nm was formed on the red light emitting layer by forming a film with the compound represented by the formula ETL-A3 using the vacuum deposition method.

<5> Next, an electron injection layer having an average thickness of 1 nm was formed on the electron transporting layer by forming a film with lithium fluoride (LiF) using the vacuum deposition method.

<6> Next, on the electron injection layer, a carrier generating layer having an average thickness of 10 nm configured by the compound represented by the formula (50) was formed using the vacuum deposition method.

<7> Next, on the carrier generating layer, the amine based hole transporting material (tetrakis-p-biphenylyl benzidine) was vapor deposited with a vacuum deposition method to form a hole transporting layer having an average thickness of 30 nm.

<8> Next, on the carrier generating layer, the constituent material of the blue light emitting layer was vapor deposited with a vacuum deposition method to form a blue light emitting layer having an average thickness of 15 nm. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 5.0 wt %.

<9> Next, on the blue light emitting layer, a green light emitting layer having an average thickness of 15 nm was formed by using the vacuum deposition method to vapor deposit the constituent materials of the green light emitting layer. As the constituent materials of the green light emitting layer, a compound (quinacridone derivative) represented by the chemical formula (25) was used as the light emitting material (guest material), and a compound (anthracene based material) represented by the formula H2-30 was used as the host material. In addition, the content (doping concentration) of the light emitting material (dopant) in the green light emitting layer was set to 6.0 wt %.

<10> Next, an electron transporting layer having an average thickness of 25 nm was formed on the green light emitting layer by forming a film with the compound represented by the formula ETL-A3 using the vacuum deposition method.

<11> Next, an electron injection layer having an average thickness of 1 nm was formed on the electron transporting layer by forming a film with lithium fluoride (LiF) using the vacuum deposition method.

<12> Next, an Al film was formed on the electron injection layer using the vacuum deposition method. In this manner, a cathode, which had an average thickness of 150 nm and was configured of Al, was formed.

<13> Next, a protective cover (sealing member) made of glass was used as a cover so as to cover each of the formed layers and fixed and sealed using epoxy resin.

Through the above steps, a light emitting element was manufactured.

Example 17

<1> First, a transparent glass substrate having an average thickness of 0.5 mm was manufactured. Next, an ITO electrode (anode) having an average thickness of 100 nm was formed on this substrate using a sputtering method.

Then, after the substrate was immersed in acetone and 2-propanol in order and subjected to ultrasonic cleaning, oxygen plasma treatment and argon plasma treatment were performed. The above plasma treatments were respectively performed with a plasma power of 100 W, a gas flow rate of 20 sccm, and a treatment time of 5 seconds in a state where the substrate was heated to 70 to 90° C.

<2> Next, on the anode, the constituent material of the carrier trapping layer was vapor deposited with a vacuum deposition method to form a carrier trapping layer having an average thickness of 60 nm. As the constituent material of the carrier trapping layer, a compound represented by the formula D-11 was used as the thiadiazole based compound (guest material), and tetrakis-p-biphenylyl benzidine was used as the host material. In addition, the content (doping concentration) of the thiadiazole based compound (dopant) in the carrier trapping layer was set to 3.0 wt %.

<3> Next, on the carrier trapping layer, a blue light emitting layer having an average thickness of 30 nm was formed by using the vacuum deposition method to vapor deposit the constituent materials of the blue light emitting layer. As the constituent materials of the blue light emitting layer, a compound (styrylamine based compound) represented by the chemical formula (24B) was used as the light emitting material (guest material), and a compound (anthracene based material) represented by the formula H2-30 was used as the host material. In addition, the content (doping concentration) of the light emitting material (dopant) in the blue light emitting layer was set to 6.0 wt %.

<4> Next, an electron transporting layer having an average thickness of 40 nm was formed on the blue light emitting layer by forming a film with the compound represented by the formula ETL-A3 using the vacuum deposition method.

<5> Next, an electron injection layer having an average thickness of 1 nm was formed on the electron transporting layer by forming a film with lithium fluoride (LiF) using the vacuum deposition method.

<6> Next, an Al film was formed on the electron injection layer using the vacuum deposition method. In this manner, a cathode, which had an average thickness of 150 nm and was configured of Al, was formed.

<7> Next, a protective cover (sealing member) made of glass was used as a cover so as to cover each of the formed layers and fixed and sealed using epoxy resin.

Through the above steps, a light emitting element was manufactured.

3. Evaluation

For the light emitting elements of each Example and each Comparative Example, a constant current of 100 mA/cm$^2$ was made to flow to the light emitting elements using a constant current power source (Keithley 2400 manufactured by TOYO Corporation) and the light emitting waveform at that time was measured using a waveform measurement device ("S-2440" manufactured by Soma Optics, Ltd.).

The chromaticity (x, y) of the luminescent light at that time was measured using a color meter ("CS-2000" manufactured by Konica Minolta Sensing Inc.) and the light emitting brightness (cd/m$^2$) was measured using an optical power measuring device ("Optical Power Meter 8230", manufactured by ADC Corporation).

In addition, for the light emitting elements of each Example and each Comparative Example respectively, a constant current of 100 mA/cm$^2$ was made to flow to the light emitting elements and the time (LT80) until the brightness became 80% of the initial brightness was measured.

The above measurement results are shown in Tables 1 to 5 and FIGS. 11 to 16.

TABLE 1

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 1 | D-1 | 0.14 | 0.10 | 400 | 450 |
| Example 2 | D-4 | 0.14 | 0.10 | 390 | 430 |
| Example 3 | D-7 | 0.14 | 0.10 | 390 | 440 |
| Example 4 | D-10 | 0.14 | 0.10 | 395 | 460 |
| Example 5 | D-2 | 0.14 | 0.10 | 388 | 550 |
| Example 6 | D-5 | 0.14 | 0.10 | 380 | 550 |
| Example 7 | D-8 | 0.14 | 0.10 | 360 | 480 |
| Example 8 | D-11 | 0.14 | 0.10 | 370 | 560 |
| Example 9 | D-11 | 0.14 | 0.10 | 400 | 300 |
| Example 13 | D-11 | 0.14 | 0.10 | 446 | 150 |

TABLE 1-continued

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 14 | D-11 | 0.14 | 0.10 | 332 | 100 |
| Example 15 | D-11 | 0.14 | 0.10 | 346 | 580 |
| Example 17 | D-11 | 0.14 | 0.10 | 305 | 250 |
| Comparative Example 1 | — | 0.14 | 0.10 | 498 | 50 |

As is clear from Table 1 and FIGS. 11 to 14, in the light emitting elements of each Example emitting blue light as visible light, even in a case where the carrier trapping layer was arranged at any one of the anode side of the light emitting layer or the cathode side, it was possible to emit blue light without changing the chromaticity in comparison with the light emitting element of Comparative Example 1 in which the forming of the carrier trapping layer was omitted.

In addition, as is clear from Table 1, it was determined that the light emitting elements of each Example had a high light emitting brightness, and the life spans thereof were lengthened in comparison with the light emitting element of Comparative Example 1.

TABLE 2

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 10 | D-11 | 0.48 | 0.51 | 689 | 570 |
| Comparative Example 2 | — | 0.48 | 0.51 | 792 | 150 |

Figure 14:
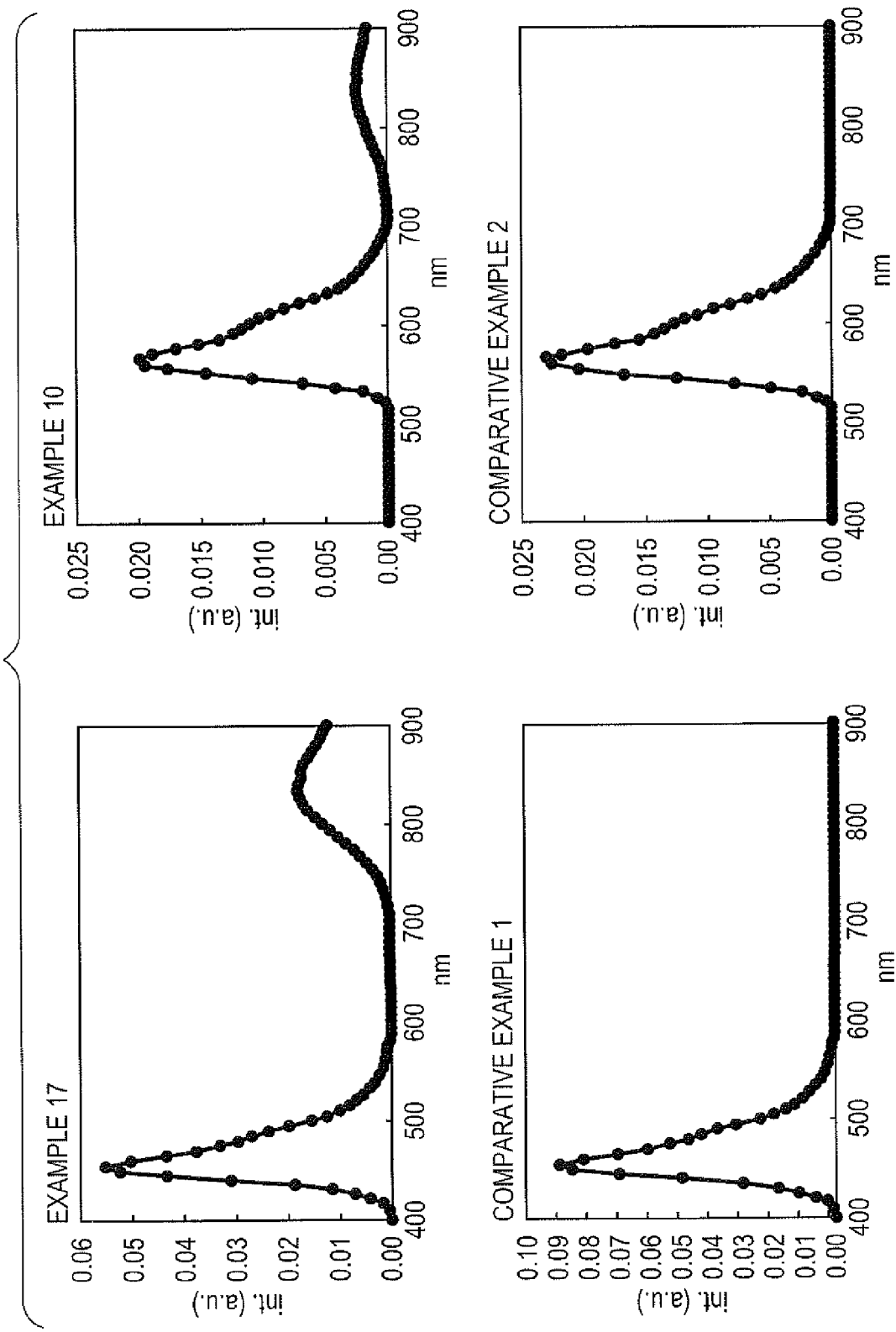
FIG. 14 is a view showing the light emitting spectra in the light emitting elements of Examples 17 and 10, and Comparative Examples 1 and 2.

As is clear from Table 2 and FIG. 14, in the light emitting element of Example 10 emitting yellow light as visible light, it was possible to emit yellow light without changing the chromaticity in comparison with the light emitting element of Comparative Example 2 in which the forming of the carrier trapping layer was omitted.

Further, as is clear from Table 2, it was determined that the light emitting element of Example 10 had a high light emitting brightness, and the life span thereof was lengthened in comparison with the light emitting element of Comparative Example 2.

TABLE 3

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 11 | D-11 | 0.27 | 0.33 | 702 | 580 |
| Comparative Example 3 | — | 0.27 | 0.33 | 815 | 300 |

Figure 15:
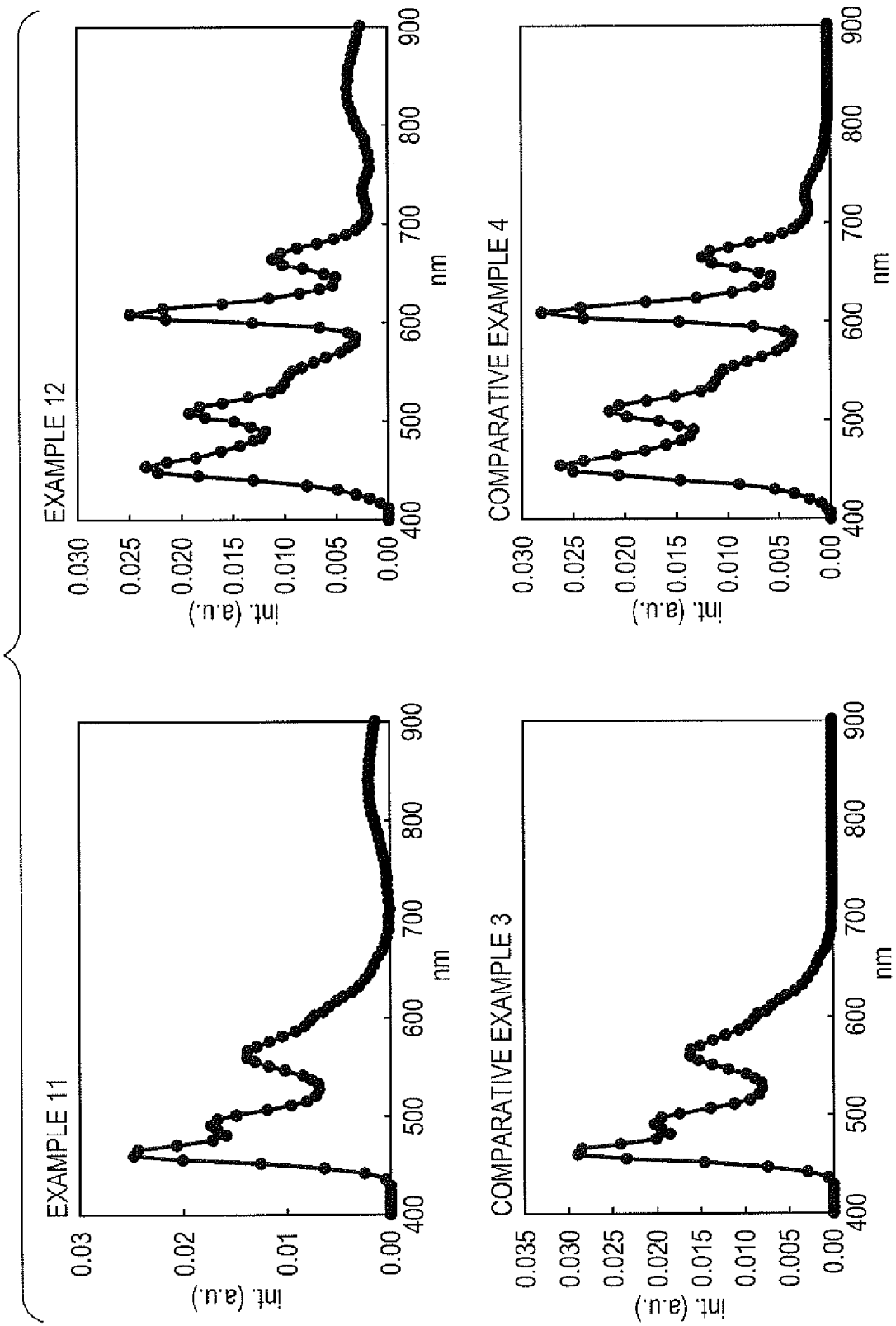
FIG. 15 is a view showing the light emitting spectra in the light emitting elements of Examples 11 and 12, and Comparative Examples 3 and 4.

As is clear from Table 3 and FIG. 15, in the light emitting element of Example 11 emitting white light (cyan light+yellow light) as visible light, it was possible to emit white light without changing the chromaticity in comparison with the light emitting element of Comparative Example 3 in which the forming of the carrier trapping layer was omitted.

Further, as is clear from Table 3, it was determined that the light emitting element of Example 11 had a high light emitting brightness, and the life span thereof was lengthened in comparison with the light emitting element of Comparative Example 3.

TABLE 4

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 12 | D-11 | 0.3 | 0.30 | 769 | 600 |
| Comparative Example 4 | — | 0.3 | 0.30 | 858 | 400 |

As is clear from Table 4 and FIG. 15, in the light emitting element of Example 12 emitting white light (red light+green light+blue light) as visible light, it was possible to cause white light to be emitted without changing the chromaticity in comparison with the light emitting element of Comparative Example 4 in which the forming of the carrier trapping layer was omitted.

Further, as is clear from Table 4, it was determined that the light emitting element of Example 12 had a high light emitting brightness, and the life span thereof was lengthened in comparison with the light emitting element of Comparative Example 4.

TABLE 5

| | Thiadiazole-Based Compound | Chromaticity (CIE 1931) | | Brightness [cd/m$^2$] | Light emitting life span (LT80) [hr] |
|---|---|---|---|---|---|
| | | x | y | | |
| Example 16 | D-11 | 0.28 | 0.32 | 1630 | 800 |
| Comparative Example 5 | — | 0.28 | 0.32 | 1839 | 170 |

Figure 16:
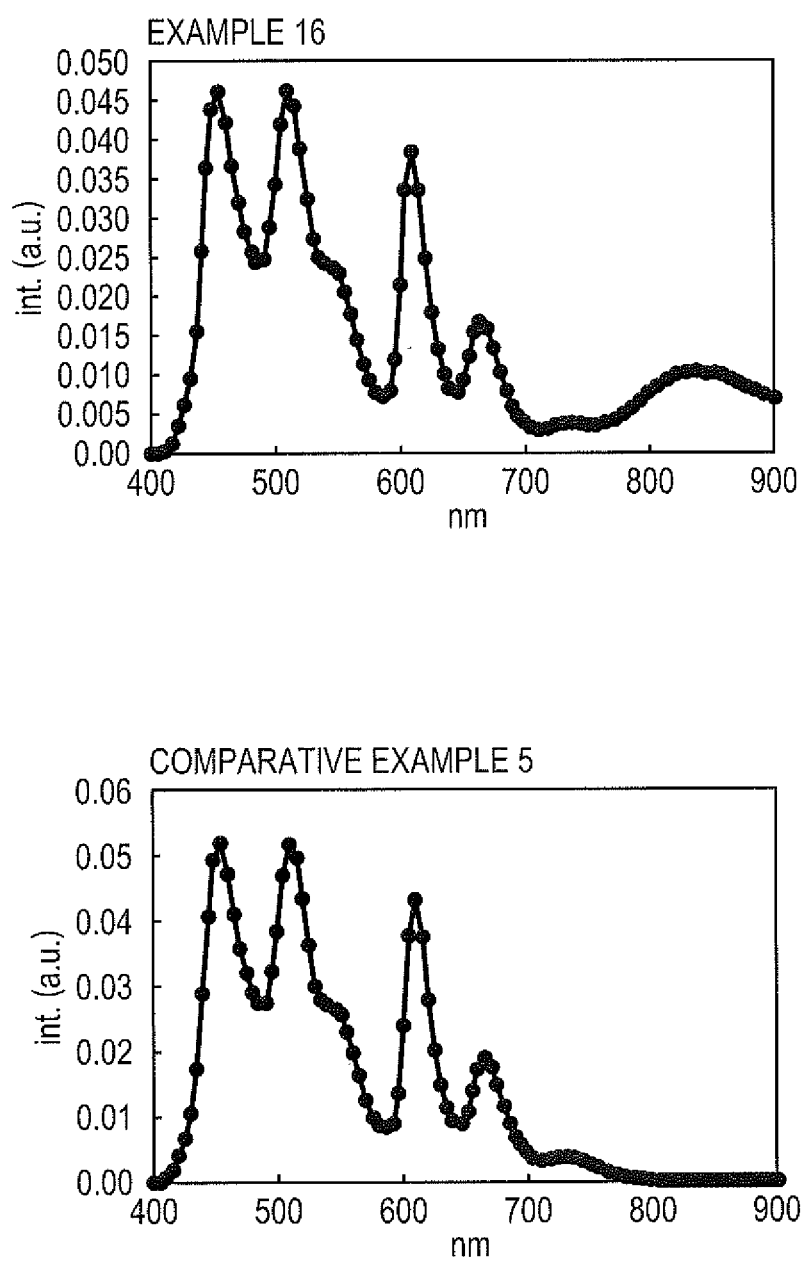
FIG. 16 is a view showing the light emitting spectra in the light emitting elements of Example 16, and Comparative Example 5.

As is clear from Table 5 and FIG. 16, in the light emitting element of Example 16 emitting white light (red light+green light+blue light) as visible light, it was possible to cause white light to be emitted without changing the chromaticity in comparison with the light emitting element of Comparative Example 5 in which the forming of the carrier trapping layer was omitted.

Further, as is clear from Table 5, it was determined that the light emitting element of Example 16 had a high light emitting brightness, and the life span thereof was lengthened in comparison with the light emitting element of Comparative Example 5.

The present invention contains subject matter related to Japanese Patent Application No. 2011-289851 filed in the Japanese Patent Office on Dec. 28, 2011, and the entire contents of which are incorporated herein by reference.

What is claimed is:

1. A light emitting element comprising:
an anode;
a cathode;
a red light emitting layer;
a carrier trapping layer which emits near infrared light;
the red light emitting layer and the carrier trapping layer are between the anode and the cathode; and
the red light emitting layer is on the carrier trapping layer.

2. The light emitting element according to claim 1, further comprising:
the carrier trapping layer is positioned at the anode side relative to the red light emitting layer.

3. The light emitting element according to claim 1, further comprising:
   naphthacene based material is used as the host material of the red light emitting layer.

4. The light emitting element according to claim 1, further comprising:
   naphthacene based material is used as the host material of the red light emitting layer.

5. The light emitting element according to claim 1, further comprising:
   at least one type from among naphthacene based material, anthracene based material, and amine based material is used as the host material of the carrier trapping layer.

6. The light emitting element according to claim 1, further comprising:
   anthracene based material is used as the host material of the red light emitting layer.

7. The light emitting element according to claim 1, further comprising:
   at least one type from among anthracene based material, and amine based material be used as the host material of the carrier trapping layer.

* * * * *